United States Patent
Inagaki et al.

(10) Patent No.: US 11,152,233 B2
(45) Date of Patent: Oct. 19, 2021

(54) SUBSTRATE TREATING APPARATUS AND SUBSTRATE TREATING METHOD

(71) Applicant: SCREEN Holdings Co., Ltd., Kyoto (JP)

(72) Inventors: Yukihiko Inagaki, Kyoto (JP); Joji Kuwahara, Kyoto (JP); Seiji Murai, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/554,799

(22) Filed: Aug. 29, 2019

(65) Prior Publication Data
US 2020/0098602 A1    Mar. 26, 2020

(30) Foreign Application Priority Data

Sep. 21, 2018   (JP) .............................. JP2018-178012
Jun. 28, 2019   (JP) .............................. JP2019-121919

(51) Int. Cl.
*H01L 21/67*    (2006.01)
*H01L 21/677*   (2006.01)

(52) U.S. Cl.
CPC .. *H01L 21/67173* (2013.01); *H01L 21/67178* (2013.01); *H01L 21/67225* (2013.01); *H01L 21/67276* (2013.01); *H01L 21/67742* (2013.01); *H01L 21/67778* (2013.01)

(58) Field of Classification Search
USPC ............................ 118/66, 500, 326, 663, 712
See application file for complete search history.

(56) References Cited

U.S. PATENT DOCUMENTS

| | | | |
|---|---|---|---|
| 5,963,753 A * | 10/1999 | Ohtani | G03F 7/7075 396/611 |
| 2004/0005149 A1* | 1/2004 | Sugimoto | G03F 7/70691 396/564 |
| 2009/0165712 A1 | 7/2009 | Ogura et al. | 118/695 |
| 2012/0008936 A1 | 1/2012 | Matsuoka et al. | 396/611 |
| 2012/0249990 A1 | 10/2012 | Nishimura et al. | 355/72 |
| 2013/0078059 A1 | 3/2013 | Enokida et al. | 414/222.13 |

(Continued)

FOREIGN PATENT DOCUMENTS

| JP | 2012-033863 A | 2/2012 |
|---|---|---|
| KR | 10-2012-0112012 A | 10/2012 |
| KR | 10-2013-0032272 A | 4/2013 |

(Continued)

OTHER PUBLICATIONS

Office Action dated Sep. 23, 2020 for corresponding Taiwan Patent Application No. 108130369.

(Continued)

*Primary Examiner* — Yewebdar T Tadesse
(74) *Attorney, Agent, or Firm* — Ostrolenk Faber LLP

(57) ABSTRACT

A substrate treating apparatus includes an indexer division, stories, and a controller. Each of the stories includes a first rack, a treating section, and a main transport mechanism. The indexer division includes a carrier rack and a transport device. The transport device performs a feeding operation for transporting substrates from a carrier placed on the carrier rack to the first rack. The transport device further performs an inter-story transporting operation for transporting the substrates between two first racks provided for different stories.

18 Claims, 28 Drawing Sheets

(56) References Cited

U.S. PATENT DOCUMENTS

2016/0128203 A1* 5/2016 Lim ................ G05B 19/41875
29/593
2016/0351430 A1* 12/2016 Kim ................ H01L 21/67173

FOREIGN PATENT DOCUMENTS

| KR | 10-2013-0118236 A | 10/2013 |
|----|-------------------|---------|
| TW | 200943464 A | 10/2009 |

OTHER PUBLICATIONS

Office Action dated Jan. 28, 2021 for corresponding Korean Patent Application No. 10-2019-0105862.

\* cited by examiner

SUBSTRATE TREATING APPARATUS AND SUBSTRATE TREATING METHOD

CROSS-REFERENCE TO RELATED APPLICATIONS

This application claims priority to Japanese Patent Application No. 2018-178012 filed Sep. 21, 2018, and Japanese Patent Application No. 2019-121919 filed Jun. 28, 2019, the disclosure of which is hereby incorporated herein by reference in its entirety for all purposes.

BACKGROUND OF THE INVENTION

Field of the Invention

This invention relates to a substrate treating apparatus for treating substrates. The substrates are, for example, semiconductor wafers, substrates for liquid crystal displays, substrates for organic EL (Electroluminescence), substrates for FPDs (Flat Panel Displays), substrates for optical displays, substrates for magnetic disks, substrates for magneto-optical disks, substrates for photomasks, and substrates for solar cells.

Description of the Related Art

Japanese Unexamined Patent Publication No. 2012-33863 discloses a coating and developing apparatus. Description will be made hereunder showing, in parentheses, the same reference signs as used in the above patent publication. The coating and developing apparatus (1) includes a carrier block (S1) and a treating block (S2). The carrier block (S1) has receiving tables (11) and a transfer arm (13). The receiving tables (11) hold carriers (C) placed thereon. The transfer arm (13) transports wafers (W).

The treating block (S2) has six unit blocks (B1-B6). Each of the unit blocks (B1-B6) has a main arm (A1-A6), solution treating modules and heating modules. The main arms (A1-A6) transport the wafers (W) to the solution treating modules and heating modules, respectively.

The treating block (S2) has a shelf unit (U7). The shelf unit (U7) has a plurality of modules. The modules (BU1, CPL0) are located in height positions accessible to the transfer arm (13). The modules (CPL1-CPL3) are located in height positions accessible to the main arm (A1). The modules (CPL7-CPL8) are located in height positions accessible to the main arm (A3). The modules (CPL14-CPL15) are located in height positions accessible to the main arm (A6).

The treating block (S2) has a transfer arm (30). The transfer arm (30) transports the wafers (W) between the modules of the shelf unit (U7).

The coating and developing apparatus (1) operates as follows, for example. The transfer arm (13) transports the wafers (W) from a carrier (C) to the module (BU1). The transfer arm (30) transports the wafers (W) from the module (BU1) to the module (CPL1). The main arm (A1) transports the wafers (W) from the module (CPL1) to the solution treating modules and heating modules of the unit block (B1). Subsequently, the main arm (A1) transports the wafers (W) to the module (CPL3). The transfer arm (30) transports the wafers (W) from the module (CPL3) to the module (CPL7). The main arm (A3) transports the wafers (W) from the module (CPL7) to the solution treating modules and heating modules of the unit block (B3). The wafers (W) are further transported to the unit block (B6). The main arm (A6) transports the wafers (W) to the module (CPL15). The transfer arm (30) transports the wafers (W) from the module (CPL15) to the module (CPL0). The transfer arm (13) transports the wafers (W) from the module (CPL0) to the carrier (C).

SUMMARY OF THE INVENTION

However, the coating and developing apparatus (1) disclosed in Japanese Unexamined Patent Publication No. 2012-33863 has the following problems. The transfer arm (13) accesses the modules (BU1, CPL0). But the main arms (A1-A6) cannot access the modules (BU1, CPL0), respectively. The main arm (A1-A6) cannot therefore directly take the wafers (W) placed in the module (BU1) by the transfer arm (13). Conversely, the transfer arm (13) cannot directly take the wafers (W) placed in the modules of the shelf unit (U7) by the main arms (A1-A6). Thus, in order to transfer the wafers (W) between the transfer arm (13) and the main arms (A1-A6), it is necessary to transport the wafers (W) between the modules of the shelf unit (U7). Thus, the wafers (W) cannot be transported efficiently between the transfer arm (13) and the main arms (A1-A6). Consequently, it is difficult to further improve the throughput of the coating and developing apparatus (1).

The main arm (A1) accesses the modules (CPL1-CPL3). But the other main arms (A2-A6) cannot access the modules (CPL1-CPL3). Therefore, in order to transport the wafers (W) between the main arm (A1) and other main arms (A2-A6), it is necessary to transport the wafers (W) between the modules of the shelf unit (U7). The coating and developing apparatus (1) therefore includes the transfer arm (30) in addition to the transfer arm (13). The transfer arm (30) is dedicated to transporting the wafers (W) between the modules of the shelf unit (U7). Consequently, the coating and developing apparatus (1) has a large footprint (installation area).

This invention has been made having regard to the state of the art noted above, and its object is to provide a substrate treating apparatus which can reduce the footprint thereof and can improve its throughput.

To fulfill the above object, this invention provides the following construction.

A substrate treating apparatus, according to this invention, comprises an indexer division; a plurality of stories arranged to align in an up-down direction; and a controller for controlling the indexer division and the stories; each of the stories including a first rack for receiving substrates; a treating section for treating the substrates; and a main transport mechanism for transporting the substrates to the first rack and the treating section; the indexer division including a carrier rack for receiving a carrier; and a transport device for transporting the substrates between the carrier placed on the carrier rack and the first rack; the transport device of the indexer division having a first transport mechanism for performing at least one of a feeding operation for transporting the substrates from the carrier placed on the carrier rack to the first rack, and a retrieving operation for transporting the substrates from the first rack to the carrier placed on the carrier rack; the first transport mechanism further performing an inter-story transporting operation for transporting the substrates between two of the first racks provided for different ones of the stories.

The first transport mechanism of the indexer division performs at least one of the feeding operation and retrieving operation. When the first transport mechanism performs the feeding operation, the main transport mechanism can directly take the substrates placed on the first rack by the first transport mechanism. The substrates can therefore be transported efficiently between the first transport mechanism and main transport mechanism. Consequently, the throughput of the substrate treating apparatus can be improved conveniently. When the first transport mechanism performs the retrieving operation, the first transport mechanism can directly take the substrates placed on the first rack by the main transport mechanism. The substrates can therefore be transported efficiently between the first transport mechanism and main transport mechanism. Consequently, the throughput of the substrate treating apparatus can be improved conveniently.

The first transport mechanism further performs the inter-story transporting operation. It is therefore unnecessary to provide separately a transport mechanism (e.g. transfer arm (30) of Japanese Unexamined Patent Publication No. 2012-33863) for exclusively transporting the substrates between two different stories. More particularly, it is unnecessary to provide, in addition to the first transport mechanism, a transport mechanism for performing only the inter-story transporting operation. Consequently, the footprint (installation area) of the substrate treating apparatus can be reduced conveniently.

According to the above substrate treating apparatus, the footprint of the substrate treating apparatus can be reduced and the throughput of the substrate treating apparatus can be improved.

In the above substrate treating apparatus, it is preferred that the treating section of at least one of the stories is configured to perform a first treatment on the substrates; the treating section of at least another of the stories is configured to perform a second treatment different from the first treatment on the substrates; and the first transport mechanism transports the substrates between the first rack of the story performing the first treatment and the first rack of the story performing the second treatment. The first treatment and second treatment can be performed on the substrates efficiently.

In the above substrate treating apparatus, it is preferred that the first treatment includes a first pre-exposure treatment performed before exposing treatment; and the second treatment includes a second pre-exposure treatment different from the first pre-exposure treatment and performed before the exposing treatment. The first pre-exposure treatment and second pre-exposure treatment can be performed on the substrates efficiently.

In the above substrate treating apparatus, it is preferred that the first treatment includes a first solution treatment; and the second treatment includes a second solution treatment different from the first solution treatment. The first solution treatment and second solution treatment can be performed on the substrates efficiently.

In the above substrate treating apparatus, it is preferred that the first treatment includes part of antireflection film forming treatment for forming antireflection film on the substrates, resist film forming treatment for forming resist film on the substrates, protective film forming treatment for forming protective film to protect the resist film on the substrates, developing treatment for developing the substrates, and cleaning treatment for cleaning the substrates; and the second treatment includes other part of the antireflection film forming treatment, the resist film forming treatment, the protective film forming treatment, the developing treatment, and the cleaning treatment. In other words, in the above substrate treating apparatus, it is preferred that the first treatment includes one or more, and not exceeding four of, antireflection film forming treatment, resist film forming treatment, protective film forming treatment, developing treatment, and cleaning treatment; that the second treatment includes one or more, and not exceeding four of, the antireflection film forming treatment, resist film forming treatment, protective film forming treatment, developing treatment, and cleaning treatment; that when the first treatment includes the antireflection film forming treatment, the second treatment does not include the antireflection film forming treatment; that when the first treatment includes the resist film forming treatment, the second treatment does not include the resist film forming treatment; that when the first treatment includes the protective film forming treatment, the second treatment does not include the protective film forming treatment; that when the first treatment includes the developing treatment, the second treatment does not include the developing treatment; and that when the first treatment includes the cleaning treatment, the second treatment does not include the cleaning treatment. For example, the first treatment may include the antireflection film forming treatment, and the second treatment the resist film forming treatment. In this case, the antireflection film forming treatment and resist film forming treatment can be performed efficiently on the substrates. For example, the first treatment may include the antireflection film forming treatment, resist film forming treatment, and protective film forming treatment, and the second treatment the developing treatment. In this case, the antireflection film forming treatment, resist film forming treatment, protective film forming treatment, and developing treatment can be performed efficiently on the substrates. Thus, at least two of the antireflection film forming treatment, resist film forming treatment, protective film forming treatment, developing treatment, and cleaning treatment can be performed efficiently on the substrates.

In the above substrate treating apparatus, it is preferred that the first treatment includes treatment for forming antireflection film on the substrates; the second treatment includes treatment for forming resist film on the substrates; and the first transport mechanism transports the substrates from the first rack of the story performing the first treatment to the first rack of the story performing the second treatment. The antireflection film forming treatment can be performed on the substrates, and thereafter the resist film forming treatment can be performed on the substrates. Further, the antireflection film forming treatment and resist film forming treatment can be performed efficiently on the substrates.

In the above substrate treating apparatus, it is preferred that the first treatment includes treatment for forming antireflection film on the substrates, and treatment for forming resist film on the substrates; the second treatment includes treatment for forming protective film on the substrates to protect the resist film; and the first transport mechanism transports the substrates from the first rack of the story performing the first treatment to the first rack of the story performing the second treatment. The antireflection film forming treatment and resist film forming treatment can be performed on the substrates, and thereafter the protective film forming treatment can be performed on the substrates. Further, the antireflection film forming treatment, resist film forming treatment, and protective film forming treatment can be performed efficiently on the substrates.

In the above substrate treating apparatus, it is preferred that the treating section of the story performing the second treatment is configured further to perform treatment for developing the substrates; and the transport device of the indexer division transports the substrates from the first rack of the story performing the second treatment to the carrier placed on the carrier rack. The phrase "the treating section of the story performing the second treatment" may be reworded as "the treating section performing the second treatment". The treating section performing the second treatment further performs the developing treatment. The developing treatment can therefore be performed efficiently. Further, the substrates having received the developing treatment can be transported efficiently to the carrier. Preferably, the second treatment does not include the treatment for developing the substrates. Preferably, the second treatment does not include post-exposure treatment performed after the exposing treatment.

In the above substrate treating apparatus, it is preferred that the transport device of the indexer division is configured to transport the substrates from the carrier placed on the carrier rack to the first rack of the story performing the first treatment. The substrates can be transported efficiently from the carrier to the story performing the first treatment.

In the above substrate treating apparatus, it is preferred that the number of the stories performing the first treatment is at least two; and the number of the stories performing the second treatment is at least two. The first treatment can be performed on the substrates on at least two stories. The second treatment can be performed on the substrates on at least two stories. Consequently, the throughput of the substrate treating apparatus can be improved conveniently.

In the above substrate treating apparatus, it is preferred that the treating section of at least one other story different from the story performing the first treatment and the story performing the second treatment is configured to perform a third treatment on the substrates; the third treatment includes treatment for developing the substrates; and the transport device of the indexer division transports the substrates from the first rack of the story performing the third treatment to the carrier placed in the carrier rack. The phrase "at least one other story different from the story performing the first treatment and the story performing the second treatment" may be reworded as "at least one story other than the story performing the first treatment and the story performing the second treatment". The treating section of at least one story other than the story performing the first treatment and the story performing the second treatment performs the third treatment including the developing treatment. The developing treatment can therefore be performed on the substrates efficiently. Further, the substrates having received the developing treatment can be transported efficiently to the carrier.

In the above substrate treating apparatus, it is preferred that the number of the stories performing the third treatment is at least two. On at least two stories the substrates can receive the third treatment. Consequently, the throughput of the substrate treating apparatus can be improved conveniently.

In the above substrate treating apparatus, it is preferred that each of the stories includes a second rack for receiving the substrates; the substrate treating apparatus further comprises an interface division; the interface division includes a transport device for transporting the substrates between the second rack and an exposing machine; and the transport device of the interface division does not transport the substrates between two of the second racks provided for different ones of the stories. The transport device of the interface division does not perform the inter-story transporting operation. Here, what the inter-story transporting operation is to the transport device of the interface division is to transport the substrates between the two second racks provided for different stories without letting the substrates pass through the exposing machine. Thus, the transport device of the interface division can efficiently transport the substrates between the stories and exposing machine.

In the above substrate treating apparatus, it is preferred that the first rack includes a first feed rack for receiving the substrates only from the transport device of the indexer division, and a first return rack for receiving the substrates only from the main transport mechanism. Since the transport device of the indexer division does not place the substrates on the first return rack, the transporting operation of the transport device of the indexer division can be simplified. The transport device of the indexer division can therefore transport the substrates between the carrier and the stories with increased efficiency. Similarly, since the main transport mechanism does not place the substrates on the first feed rack, the transporting operation of the main transport mechanism can be simplified. The main transport mechanism can therefore transport the substrates with increased efficiency.

In the above substrate treating apparatus, it is preferred that the transport device of the indexer division is configured to place two substrates on the first feed rack at the same time, and the first feed rack is configured capable of receiving at least four substrates. At least four substrates can be placed on the first feed rack. Thus, the transport device of the indexer division can place a first and a second substrates on the first feed rack at the same time, for example, and can thereafter place a third and a fourth substrates on the first feed rack at the same time. While the transport device of the indexer division is placing the third and fourth substrates on the first feed rack, the main transport mechanism can take the first and second substrates from the first feed rack. Consequently, the transport device of the indexer division can place a fifth and a sixth substrates on the first feed rack (for example, in the same positions where the first and second substrates were placed). Thus, the transport device of the indexer division can smoothly repeat the operation to place the substrates on the first feed rack.

For example, the position of the first feed rack in which the first and second substrates are placed is different from the position of the first feed rack in which the third and fourth substrates are placed. Therefore, even if the transport device of the indexer division and the main transport mechanism access the first feed rack at the same time, there will be no possibility of interference between the transport device of the indexer division which places the substrates on the first feed rack and the main transport mechanism which takes the substrates from the first feed rack.

In the above substrate treating apparatus, it is preferred that the transport device of the indexer division is configured to take two substrates from the first return rack at the same time, and the first return rack is configured capable of receiving at least four substrates. At least four substrates can be placed on the first return rack. Thus, the transport device of the indexer division can take a first and a second substrates from the first return rack at the same time, for example, and can thereafter take a third and a fourth substrates from the first return rack at the same time. While the transport device of the indexer division is taking the third and fourth substrates from the first return rack, the main transport mechanism can place a fifth and a sixth substrates on the first return rack (for example, in the same positions where the first and second substrates were placed). Consequently, the transport device of the indexer division can thereafter take the fifth and sixth substrates from the first return rack. Thus, the transport device of the indexer division can smoothly repeat the operation to take the substrates from the first return rack.

For example, the position of the first return rack in which the third and fourth substrates are placed is different from the position of the first return rack in which the fifth and sixth substrates are placed. Therefore, even if the transport device of the indexer division and the main transport mechanism access the first return rack at the same time, there will be no possibility of interference between the transport device of the indexer division which takes the substrates from the first return rack and the main transport mechanism which places the substrates on the first return rack.

In the above substrate treating apparatus, it is preferred that the first transport mechanism performs one of the feeding operation and the retrieving operation, and does not perform the other of the feeding operation and the retrieving operation; and the transport device of the indexer division has a second transport mechanism which does not perform the one of the feeding operation and the retrieving operation, but performs the other of the feeding operation and the retrieving operation. The transport device of the indexer division, with the second transport mechanism, can transport the substrates with increased efficiency. The first transport mechanism of the indexer division performs one of the feeding operation and retrieving operation, and the second transport mechanism of the indexer division performs the other of the feeding operation and the retrieving operation. Consequently, the transport device of the indexer division can perform both the feeding operation and retrieving operation conveniently. Since the first transport mechanism does not perform the other of the feeding operation and retrieving operation, the operation of the first transport mechanism can be simplified. Since the second transport mechanism does not perform the one of the feeding operation and retrieving operation, the operation of the second transport mechanism can be simplified.

In the above substrate treating apparatus, it is preferred that the second transport mechanism of the indexer division further performs the inter-story transporting operation. Since both the first transport mechanism and second transport mechanism perform the inter-story transporting operation, the substrates can be transported between two different stories with increased efficiency.

In the above substrate treating apparatus, it is preferred that a story passed by the substrates last among the stories is regarded as a final story; the transport device of the indexer division transports the substrates from the first rack of the final story to the carrier placed on the carrier rack; the substrate treating apparatus further comprises a carrier shunt portion for holding a carrier placed in a position shunted from the carrier rack; and a carrier transport device for transporting the carrier between the carrier rack and the carrier shunt portion; and the controller is configured to detect a delivery operation in which the main transport mechanism of the final story places the substrates on the first rack of the final story, and to determine timing of operation of the carrier transport device based on a result of detection of the delivery operation of the main transport mechanism of the final story. The first rack of the final story is a place in which the substrates are placed last, before being loaded into the carrier. The controller detects the delivery operation of the main transport mechanism provided for the final story. From the result of detection of the delivery operation of the main transport mechanism of the final story, the time when the main transport mechanism of the final story actually placed the substrates on the first rack can be determined. The controller determines a timing of operation of the carrier transport device based on the detection result of the delivery operation of the main transport mechanism of the final story.

The carrier transport device can therefore transport the carrier always with appropriate timing. As a result, the transport device of the indexer division can perform the retrieving operation without delay. For example, transportation of the carrier by the carrier transport device will never result in a delay in the retrieving operation by the transport device of the indexer division. Thus, the retrieving operation by the transport device of the indexer division and the carrier transporting operation by the carrier transport device can be coordinated in time conveniently.

In the above substrate treating apparatus, it is preferred that the controller is configured to determine whether the substrates scheduled to be loaded into the carrier placed on the carrier shunt portion have been placed on the first rack of the final story, based on the result of detection of the delivery operation of the main transport mechanism of the final story, and to start operation of the carrier transport device for transporting the carrier from the carrier shunt portion to the carrier rack when the controller determines that the substrates scheduled to be loaded into the carrier placed on the carrier shunt portion have been placed on the first rack of the final story. Before the transport device of the indexer division begins the retrieving operation, the carrier transport device can reliably place on the carrier rack the carrier scheduled to receive loading of the substrates. As a result, the transport device of the indexer division can perform the retrieving operation without delay.

A substrate treating method according to this invention comprises a feeding step for transporting substrates from a carrier to at least one of stories; a treating step for treating the substrates on the stories while transporting the substrates; an inter-story transporting step for transporting the substrates between two different ones of the stories; and a retrieving step for transporting the substrates from at least one of the stories to the carrier; wherein at least either one of the feeding step and the retrieving step is executed, along with the inter-story transporting step, by one and the same transport mechanism.

At least one of the feeding step and the retrieving step is performed by one transport mechanism. When the feeding step is performed by the one transport mechanism, the substrates can be efficiently transported from the carrier to the stories. Consequently, the treating step can be performed efficiently. Thus, the throughput of the substrate treatment can be improved conveniently. When the retrieving step is performed by the one transport mechanism, the substrates can be efficiently transported from the stories to the carrier. Consequently, the treating step can be performed efficiently. Thus, the throughput of the substrate treatment can be improved conveniently.

The inter-story transporting step is performed by the one transport mechanism which performs at least one of the feeding step and retrieving step. That is, the same transport mechanism performs the inter-story transporting step in addition to at least one of the feeding step and retrieving step. It is therefore unnecessary to provide separately a transport mechanism (e.g. the transfer arm (30) of Japanese Unexamined Patent Publication No. 2012-33863) which transports the substrates only between two different stories. Consequently, a space for executing the substrate treating method can be reduced conveniently.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Substrate treating apparatus of this invention will be described hereinafter with reference to the drawings.

First Embodiment

<Outline of Substrate Treating Apparatus>

Figure 1:
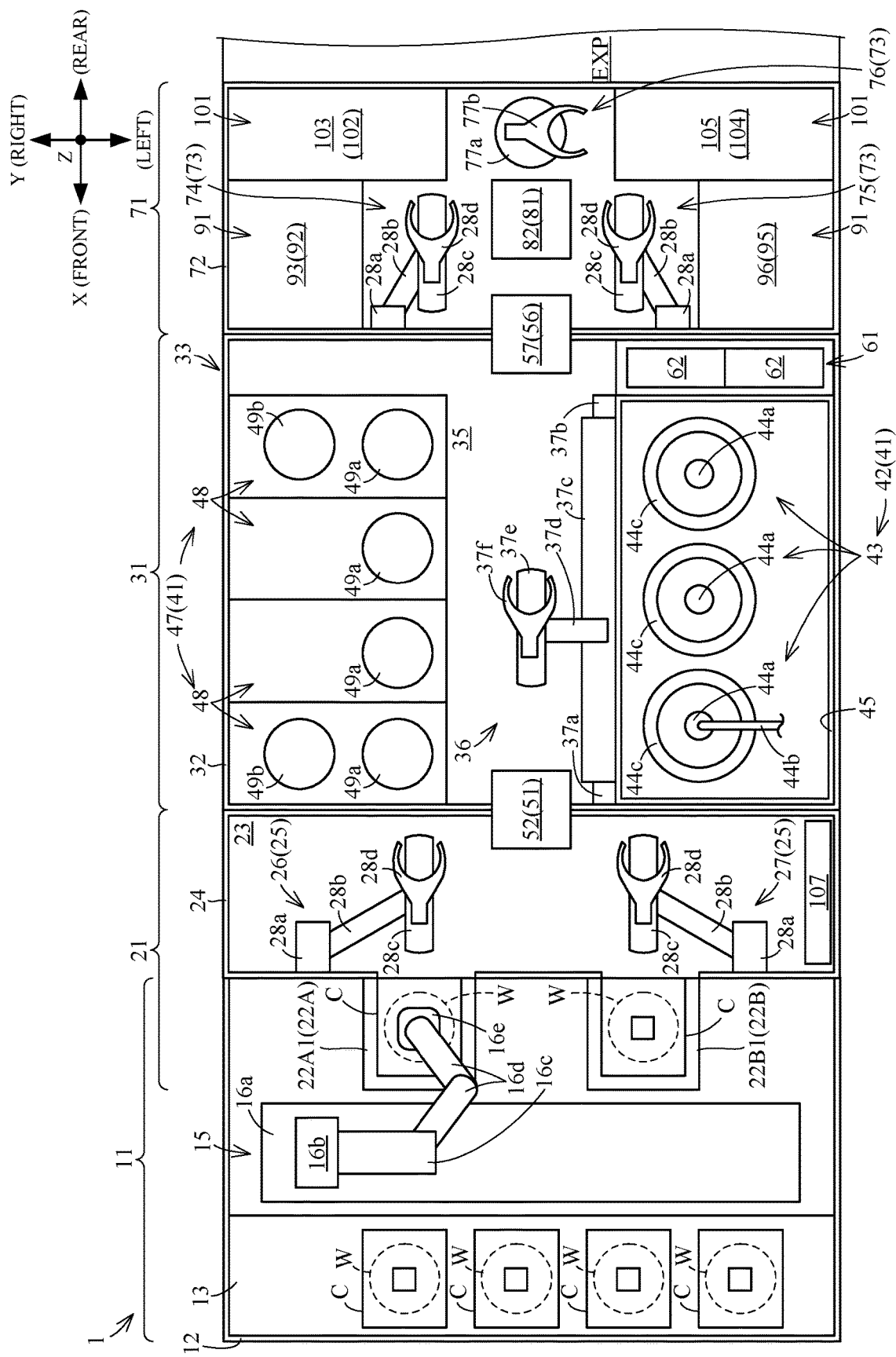
FIG. 1 is a plan view of a substrate treating apparatus in a first embodiment.

FIG. 1 is a plan view of a substrate treating apparatus in a first embodiment. A substrate treating apparatus 1 in the first embodiment performs a series of treatments on substrates (e.g. semiconductor wafers) W.

The substrates W are, for example, semiconductor wafers, substrates for liquid crystal displays, substrates for organic EL (Electroluminescence), substrates for FPDs (Flat Panel Displays), substrates for optical displays, substrates for magnetic disks, substrates for magneto-optical disks, substrates for photomasks, or the substrates for solar cells. The wafers W have a thin flat shape. The wafers W have a substantially circular shape in plan view.

The substrate treating apparatus 1 includes a stocker division 11, an indexer division 21, a treating block 31, and an interface division 71. The stocker division 11 stores a plurality of carriers C. The stocker division 11 transports the carriers C to the indexer division 21. Each carrier C holds a plurality of wafers W. The carriers C are FOUPs (front opening unified pods), for example.

The indexer division 21 transports the wafers W from the carriers C to the treating block 31. The indexer division 21 loads the wafers W from the treating block 31 into the carriers C.

The treating block 31 performs treatment on the wafers W while transporting the wafers W.

The interface division 71 transports the wafers W between the treating block 31 and an exposing machine EXP. The exposing machine EXP is an entity separate from the substrate treating apparatus 1. The exposing machine EXP is not an element of the substrate treating apparatus 1. The exposing machine EXP is an external device for the substrate treating apparatus 1. The exposing machine EXP performs exposing treatment on the wafers W.

The stocker division 11, indexer division 21, treating block 31, and interface division 71 are arranged in this order in a row. The stocker division 11 is connected to the indexer division 21. The indexer division 21 is connected to the treating block 31. The treating block 31 is connected to the interface division 71. The interface division 71 is connected to the exposing machine EXP.

The direction in which the stocker division 11, indexer division 21, treating block 31, and interface division 71 are arranged in a row will be called the "longitudinal direction X". The longitudinal direction X is horizontal. Of the longitudinal direction X, the direction pointing to the stocker division 11 from the interface division 71 will be called "forward". The direction opposite to forward will be called "rearward". A horizontal direction perpendicular to the longitudinal direction X will be called the "transverse direction Y" or "sideways". One direction of the "transverse direction Y" will be called "rightward" as appropriate. The direction opposite to rightward will be called "leftward". The vertical direction will be called the "up-down direction Z". The up-down direction Z is perpendicular to the longitudinal direction X and also perpendicular to the transverse direction Y. For reference, the drawings show front, rear, right, left, up, and down, as appropriate.

The stocker division 11, indexer division 21, treating block 31, and interface division 71 will be described hereinafter.

<Stocker Division 11>

Figure 2:
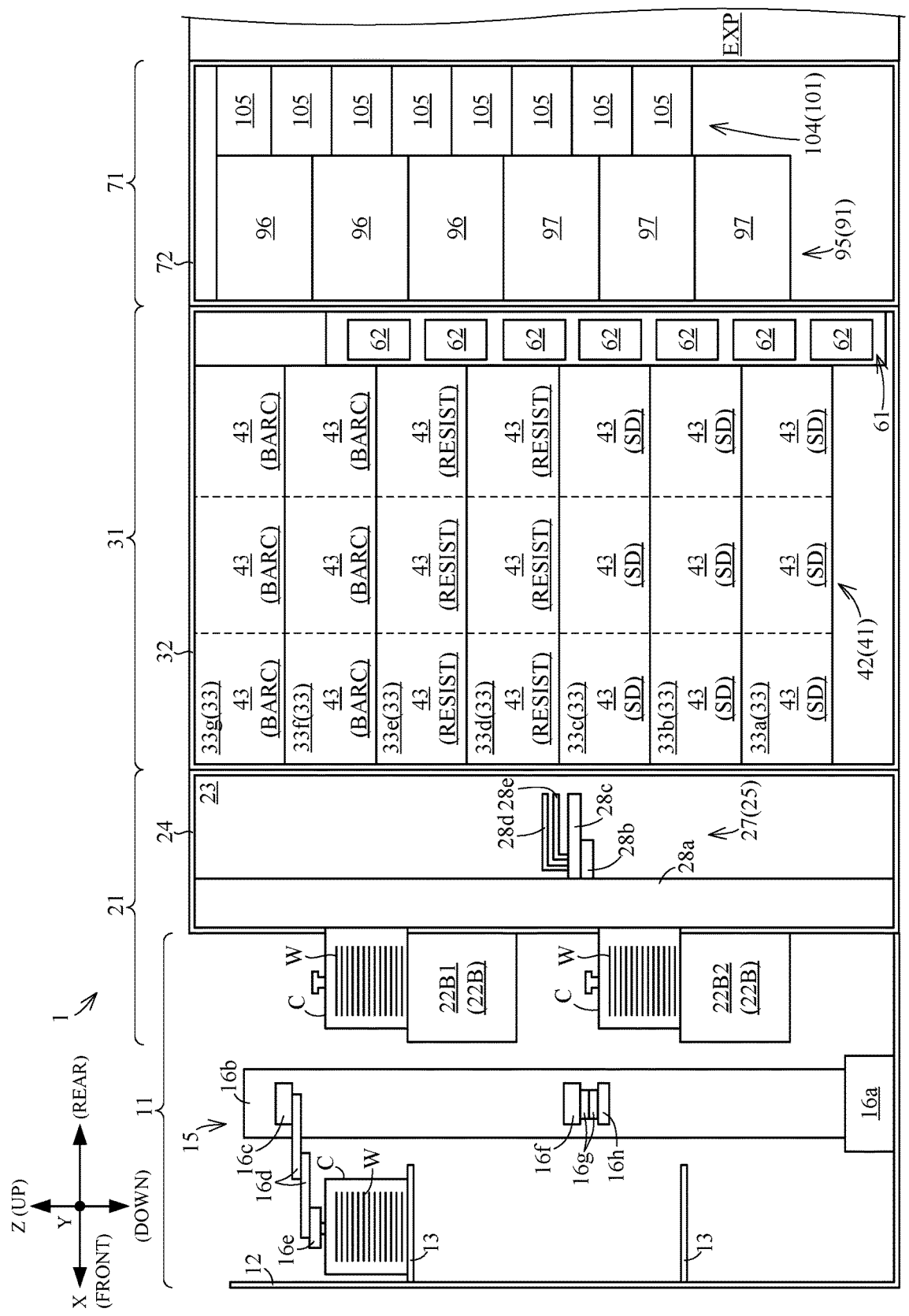
FIG. 2 is a left side view showing a construction of a left part of the substrate treating apparatus.
Figure 3:
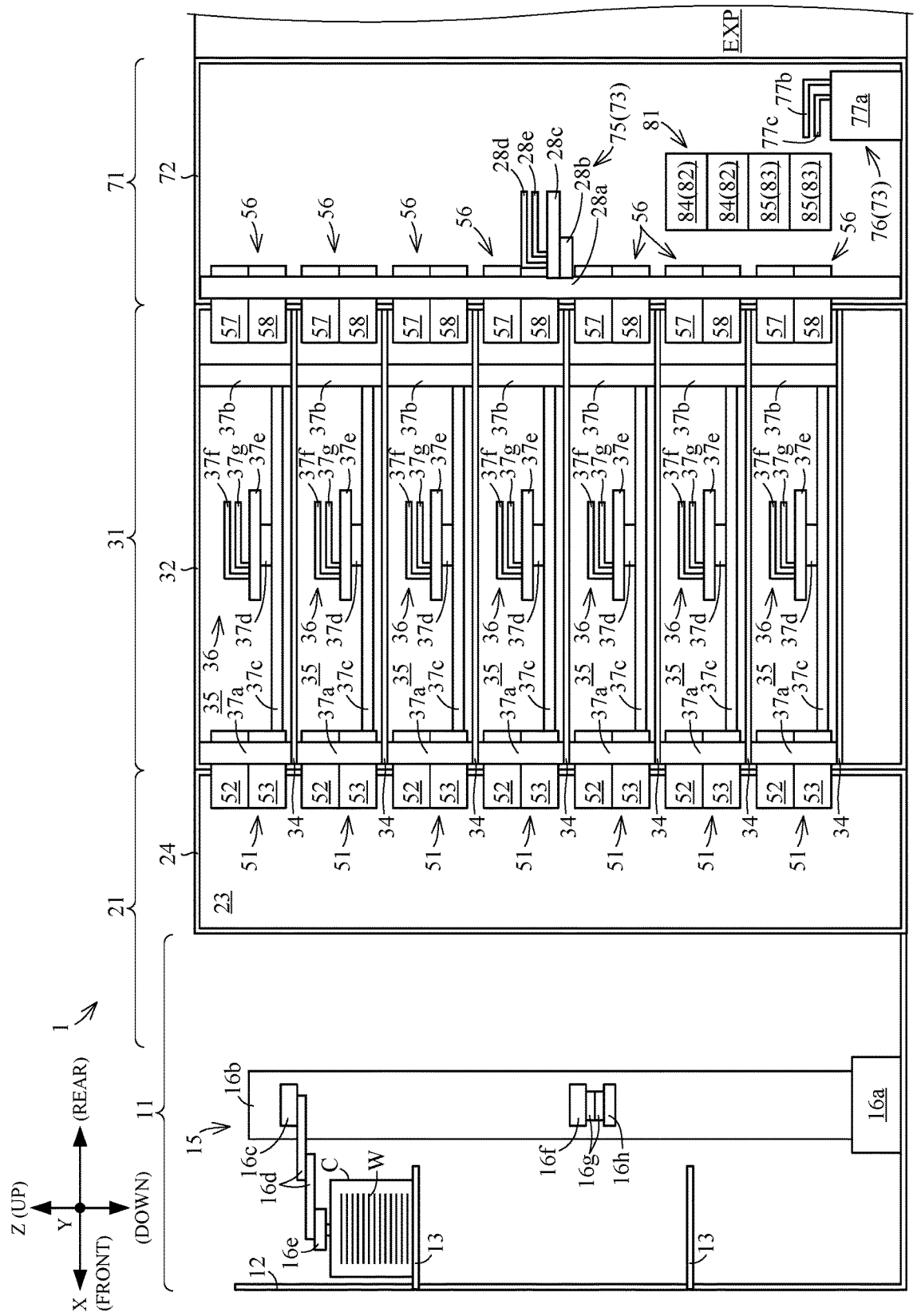
FIG. 3 is a left side view showing a construction of a middle part in a transverse direction of the substrate treating apparatus.
Figure 4:
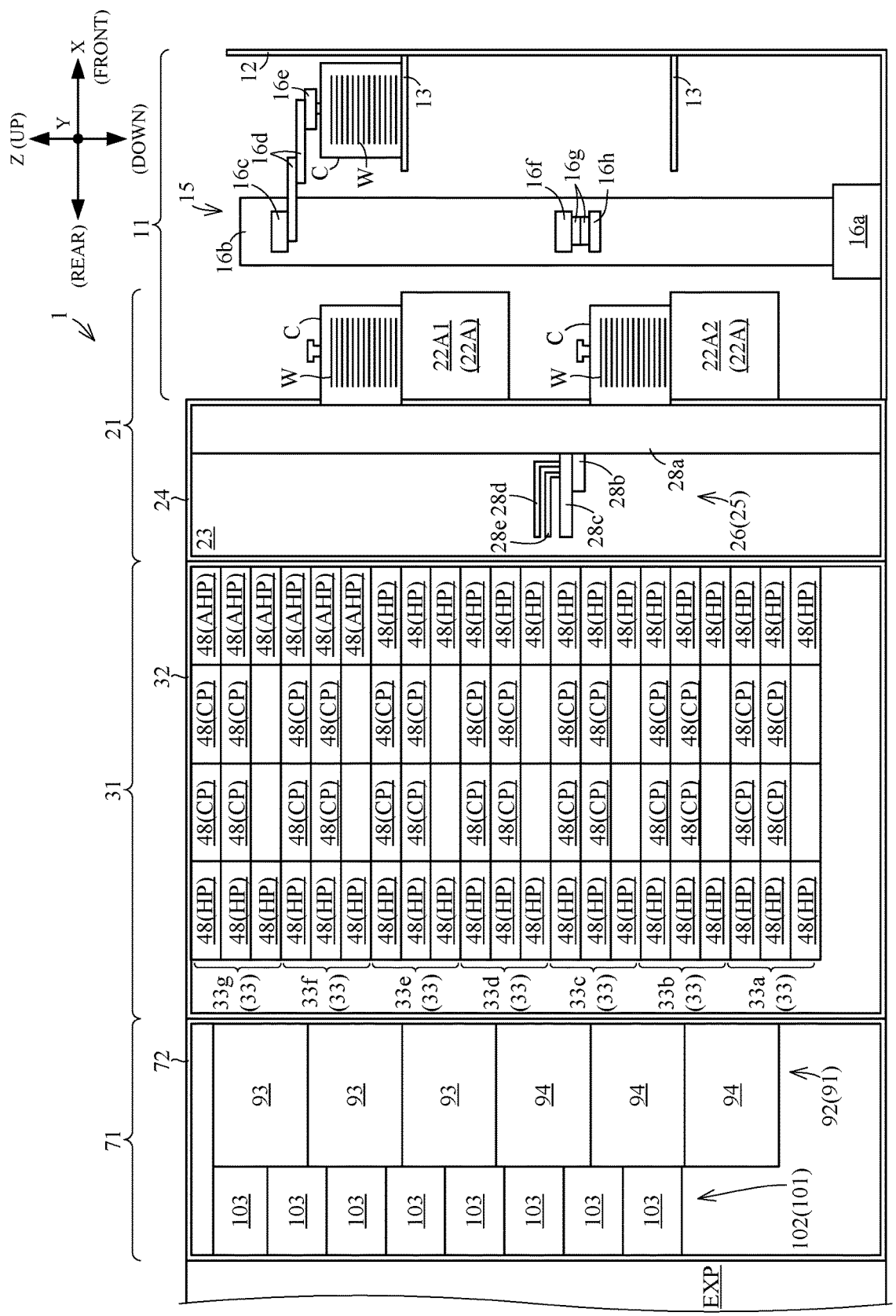
FIG. 4 is a right side view showing a construction of a right part of the substrate treating apparatus.

Reference is made to FIGS. 1-4. FIG. 2 is a left side view showing a construction of a left part of the substrate treating apparatus 1. FIG. 3 is a left side view showing a construction of a middle part in the transverse direction Y of the substrate treating apparatus 1. FIG. 4 is a right side view showing a construction of a right part of the substrate treating apparatus 1.

The stocker division 11 has an outer wall 12 and a plurality of (e.g. two) shelves 13. The outer wall 12 is located at a front face of the stocker division 11. The shelves 13 are supported by the outer wall 12. The shelves 13 are located between the outer wall 12 and indexer division 21. The shelves 13 are located behind the outer wall 12. The shelves 13 are arranged to align in the up-down direction Z.

The shelves 13 have a substantially horizontal plate shape. A plurality of carriers C are placed on each shelf 13. The shelves 13 extend in the transverse direction Y. A length in the transverse direction Y of the shelves 13 is larger than a length in the longitudinal direction X of the shelves 13. The carriers C are placed on each shelf 13 as aligned in the transverse direction Y.

The carriers C can be classified into some groups according to situations of the carriers C. For example, the carriers C can be classified into carriers C (which will be called "the former carriers C") transferred between the stocker division 11 and an external transport mechanism not shown, and other carriers C (which will be called "the latter carriers C"). Here, the external transport mechanism is an external device of the substrate treating apparatus 1. The external transport mechanism is an OHT (Overhead Hoist Transfer), for example. The former carriers C can be further classified into carriers C which the stocker division 11 receives from the external transport mechanism, and carriers C which the stocker division 11 passes on to the external transport mechanism. The latter carriers C can be further classified into carriers C which hold wafers W to be treated, carriers C which are empty of wafers W, and carriers which hold treated wafers W.

The carrier C may be placed in different positions on the shelves 13 according to the above situations or groups of the carriers C. For example, the shelves 13 may have a load port for exclusively receiving the former carriers C. The load port is located in a position accessible to the external transport mechanism. The load port may have an input load port and an output load port. The input load port will have carriers C placed therein, which the stocker division 11 receives from the external transport mechanism. The output load port will have carriers C placed therein, which the stocker division 11 passes on to the external transport mechanism. For example, the shelves 13 may have a storage part for exclusively storing the latter carriers C. Preferably, the storage part is located in a position inaccessible to the external transport mechanism. The storage part may further include a first storage part for exclusively storing the carriers C which hold wafers W to be treated. The storage part may include a second storage part for exclusively storing the carriers C empty of wafers W. The storage part may include a third storage part for exclusively storing the carriers C which hold treated wafers W.

The stocker division 11 includes a carrier transport mechanism 15. The carrier transport mechanism 15 transports the carriers C between the shelves 13 and indexer division 21. The carrier transport mechanism 15 further transports the carriers C between different positions on the shelves 13. For example, the carrier transport mechanism 15 transports the carriers C between the load port and storage part. The carrier transport mechanism 15 is located between the shelves 13 and indexer division 21. The carrier transport mechanism 15 can access the shelves 13. The carrier transport mechanism 15 places the carriers C on the shelves 13. The carrier transport mechanism 15 takes the carriers C from the shelves 13.

The carrier transport mechanism 15 has a rail 16a, a strut 16b, a first lift 16c, a first arm 16d, and a first holder 16e. The rail 16a extends in the transverse direction Y. The strut 16b is supported by the rail 16a. The strut 16b extends in the up-down direction Z. The strut 16b is movable in the transverse direction Y relative to the rail 16a. The first lift 16c is supported by the strut 16b. The first lift 16c is movable in the up-down direction Z relative to the strut 16b. The first arm 16d is supported by the first lift 16c. The first arm 16d has a proximal end connected to the first lift 16c. The first arm 16d has a distal end. The distal end of the first arm 16d is horizontally revolvable relative to the first lift 16c, and horizontally movable forward and backward relative to the first lift 16c. The first arm 16d is an articulated arm, for example. The first holder 16e is supported by the distal end of the first arm 16d. The first holder 16e holds one carrier C. Specifically, the first holder 16e grips an upper part of the carrier C.

The carrier transport mechanism 15 further includes a second lift 16f, a second arm 16g, and a second holder 16h. The second lift 16f, second arm 16g, and second holder 16h have substantially the same construction as the first lift 16c, first arm 16d, and first holder 16e, respectively. The second lift 16f, second arm 16g, and second holder 16h are located below the first lift 16c, first arm 16d, and first holder 16e. The second lift 16f, second arm 16g, and second holder 16h are movable in the up-down direction Z relative to the strut 16b. The second lift 16f is operable independently of the first lift 16c. The second arm 16g is operable independently of the first arm 16d. The second holder 16h is operable independently of the first holder 16e.

The carrier transport mechanism 15 is an example of the carrier transport device in this invention.

<Indexer Division 21>

Figure 5:
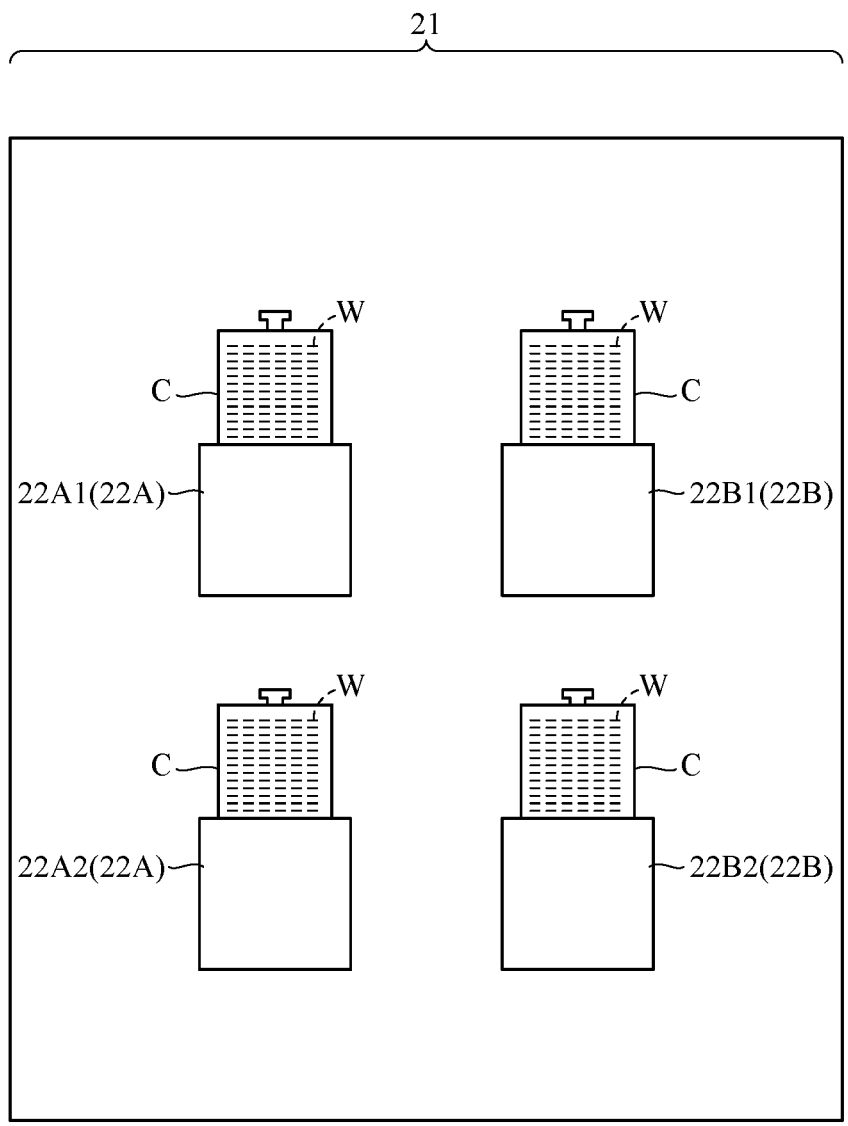
FIG. 5 is a front view of an indexer division.

Reference is made to FIGS. 1-5. FIG. 5 is a front view of the indexer division 21. The indexer division 21 includes carrier racks 22A1, 22A2, 22B1 and 22B2. Each of the carrier racks 22A1, 22A2, 22B1 and 22B2 receives one carrier C placed thereon.

The carrier racks 22A1, 22A2, 22B1 and 22B2 are arranged rearward of the carrier transport mechanism 15. The carrier transport mechanism 15 can access the carrier racks 22A1, 22A2, 22B1 and 22B2. The carrier transport mechanism 15 places carriers C on the carrier racks 22A1, 22A2, 22B1 and 22B2. The carrier transport mechanism 15 takes carriers C from the carrier racks 22A1, 22A2, 22B1 and 22B2.

The carrier racks 22A1 and 22A2 are arranged to align in the up-down direction Z. The carrier rack 22A1 is located above the carrier rack 22A2. The carrier racks 22B1 and 22B2 are arranged to align in the up-down direction Z. The carrier rack 22B1 is located above the carrier rack 22B2. The carrier racks 22A1 and 22B1 are arranged to align in the transverse direction Y. The carrier rack 22A1 is located rightward of the carrier rack 22B1. The carrier rack 22A1 is located in substantially the same height position as the carrier rack 22B1. The carrier racks 22A2 and 22B2 are arranged to align in the transverse direction Y. The carrier rack 22A2 is located rightward of the carrier rack 22B2. The carrier rack 22A2 is located in substantially the same height position as the carrier rack 22B2.

The carrier racks 22A1 and 22A2, when not distinguished, will hereinafter be written "carrier racks 22A". The carrier racks 22B1 and 22B2, when not distinguished, will be written "carrier racks 22B".

The shelves 13 noted above hold the carriers C in positions shunted from the carrier racks 22A and 22B. The shelves 13 correspond to the carrier shunt portion in this invention.

Figure 6:
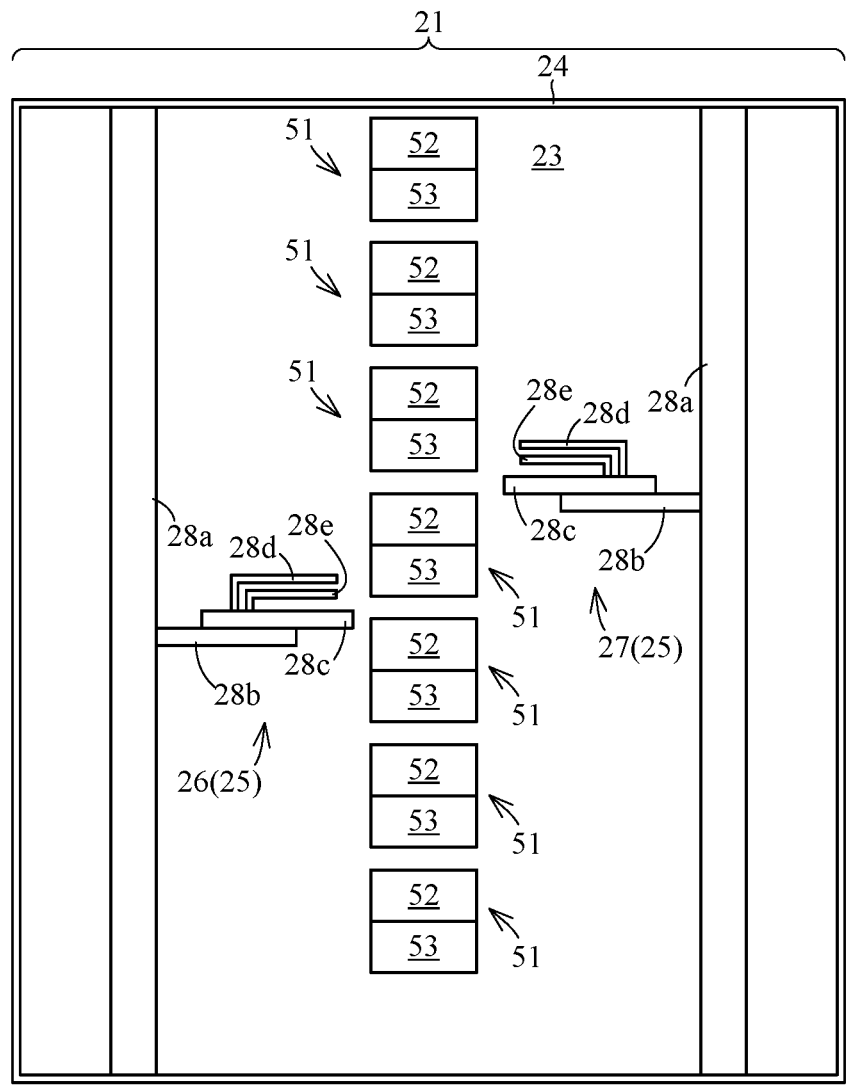
FIG. 6 is a front view showing a construction inside the indexer division.
Figure 6:
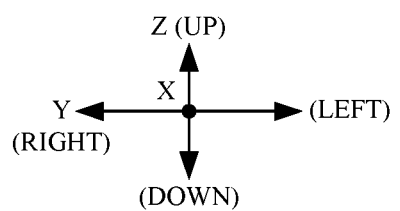

Reference is made to FIGS. 1-4 and 6. FIG. 6 is a front view showing a construction inside the indexer division 21. The indexer division 21 has a transporting space 23. The transporting space 23 is located rearward of the carrier racks 22A and 22B.

The transporting space 23 is substantially box-shaped. The transporting space 23 is substantially rectangular in plan view, side view, and front view.

The indexer division 21 has a frame 24. The frame 24 is provided as a framework (skeletal structure) for the transporting space 23. The frame 24 demarcates the shape of the transporting space 23. The frame 24 is formed of metal, for example.

The indexer division 21 has a transport device 25. The transport device 25 is installed in the transporting space 23. The transport device 25 transports wafers W between the carriers C on the carrier racks 22A and 22B and the treating block 31. The transport device 25 cannot access the carriers C on the shelves 13.

The transport device 25 includes a first transport mechanism 26 and a second transport mechanism 27. The first transport mechanism 26 and second transport mechanism 27 transport wafers W, respectively.

The first transport mechanism 26 and second transport mechanism 27 are arranged to align in the transverse direction Y. The first transport mechanism 26 is located rightward of the second transport mechanism 27. The first transport mechanism 26 is located in substantially the same height position as the second transport mechanism 27. The first transport mechanism 26 is located rearward of the carrier racks 22A. The second transport mechanism 27 is located rearward of the carrier racks 22B.

The carrier racks 22A are located in an area accessible to the first transport mechanism 26. The carrier racks 22A are located outside an area accessible to the second transport mechanism 27. The carrier racks 22B are located in the area accessible to the second transport mechanism 27. The carrier racks 22B are located outside the area accessible to the first transport mechanism 26.

The first transport mechanism 26 has a strut 28a, a lift 28b, a rotating element 28c, and holders 28d and 28e. The strut 28a is supported by the frame 24. The strut 28a is fixed to the frame 24. The strut 28a is immovable relative to the frame 24. The strut 28a extends in the up-down direction Z. The lift 28b is supported by the strut 28a. The lift 28b is movable in the up-down direction Z relative to the strut 28a. The lift 28b is horizontally immovable relative to the strut 28a. The rotating element 28c is supported by the lift 28b. The rotating element 28c is rotatable relative to the lift 28b about an axis parallel to the up-down direction Z. The rotating element 28c is horizontally immovable relative to the lift 28b. The holders 28d and 28e are supported by the rotating element 28c. The holders 28d and 28e are horizontally movable forward and backward relative to the rotating element 28c. The holders 28d and 28e are movable forward and backward independently of each other. The holders 28d and 28e contact wafers W, respectively. Each of the holders 28d and 28e holds one wafer W in a horizontal position.

The second transport mechanism 27 has substantially the same construction and shape as the first transport mechanism 26 of the indexer division 21 except for being bilaterally symmetric. That is, the second transport mechanism 27 has a strut 28a, a lift 28b, a rotating element 28c, and holders 28d and 28e.

Thus, in this specification, where different elements have the same construction, such elements are affixed with common signs and are not described particularly.

<Treating Block 31>

Figure 7:
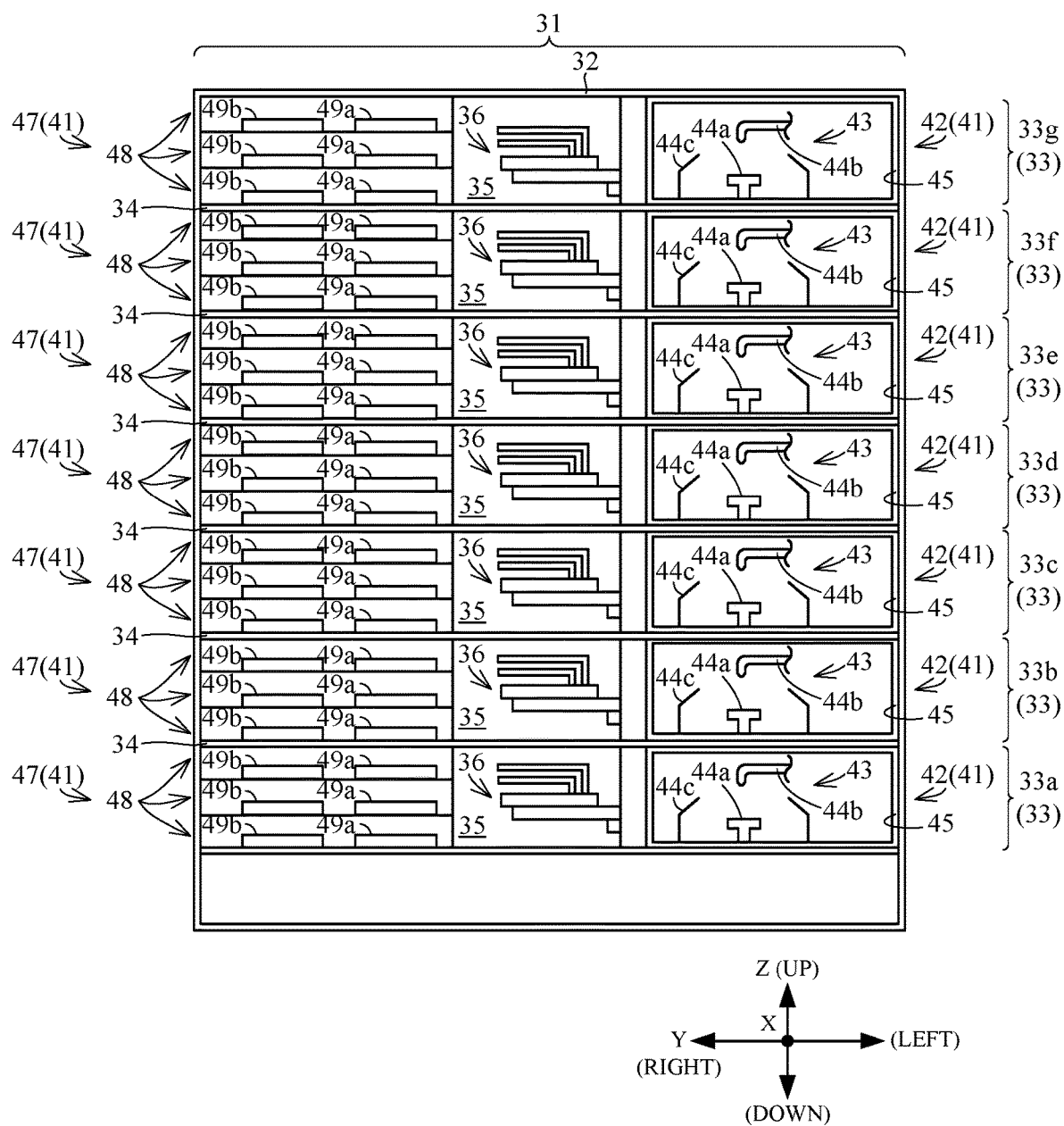
FIG. 7 is a front view of a treating block.

Reference is made to FIGS. 1-4 and 7. FIG. 7 is a front view of the treating block 31. The treating block 31 is substantially box-shaped. The treating block 31 is substantially rectangular in plan view, side view, and front view.

Treating block 31 has a frame 32. The frame 32 is provided as a framework (skeletal structure) for the treating block 31. The frame 32 demarcates the shape of the treating block 31. The frame 32 is formed of metal, for example.

Reference is made to FIG. 7. The treating block 31 has a plurality of (e.g. seven) stories 33 arranged to align in the up-down direction Z. The plurality of stories 33 overlap one another in plan view. Each story 33 treats wafers W while transporting the wafers W. The respective stories 33 can operate in parallel. The stories 33 can operate independently of one another.

The treating block 31 has a plurality of partition walls 34. The partition walls 34 are supported by the frame 32. The partition walls 34 have a horizontal plate-like shape. The plurality of partition walls 34 are arranged to align in the up-down direction Z. The partition walls 34 demarcate the respective stories 33. Each partition wall 34 is located between two stories 33 adjoining each other in the up-down direction Z. Each partition wall 34 separates two stories 33 adjoining each other in the up-down direction Z. Further, a partition wall 34 is located also under the lowest story 33. The partition wall 34 serves as a bottom wall of the stories 33.

The plurality of stories 33 have substantially the same elements. The constructions and shapes of the elements included in the stories 33 are substantially the same among the plurality of stories 33. Arrangements of the elements included in the stories 33 are substantially the same among the plurality of stories 33. The elements of each story 33 will be described hereinafter.

Reference is made to FIGS. 1 and 7. Each story 33 has a transporting space 35. The transporting space 35 is located in the middle in the transverse direction Y of the story 33 in plan view. The transporting space 35 extends in the longitudinal direction X. The transporting space 35 has a front part and a rear part. The front part of each transporting space 35 adjoins the transporting space 23 of the indexer division 21. The front part of each transporting space 35 is located leftward and rearward of the first transport mechanism 26. The front part of each transporting space 35 is located rightward and rearward of the second transport mechanism 27.

Each story 33 has one main transport mechanism 36. The main transport mechanism 36 is installed in the transporting space 35. The main transport mechanism 36 transports wafers W.

Reference is made to FIGS. 1 and 3. The main transport mechanism 36 has struts 37a and 37b, a lift 37c, a horizontal moving element 37d, a rotating element 37e, and holders 37f and 37g. The struts 37a and 37b are supported by the frame 32. The struts 37a and 37b are fixed to the frame 32. The struts 37a and 37b are immovable relative to the frame 32. The struts 37a and 37b extend in the up-down direction Z. The struts 37a and 37b are arranged to align in the longitudinal direction X. The strut 37a is located in the front part of the transporting space 35. The strut 37b is located in the rear part of the transporting space 35. More particularly, the strut 37a is located on a left side in the front part of the transporting space 35. The strut 37b is located on a left side in the rear part of the transporting space 35. The lift 37c is supported by the struts 37a and 37b. The lift 37c is movable in the up-down direction Z relative to the struts 37a and 37b. The lift 37c extends in the longitudinal direction X. The lift 37c has a front end and a rear end. The front end of the lift 37c is connected to the strut 37a. The rear end of the lift 37c is connected to the strut 37b. The horizontal moving element 37d is supported by the lift 37c. The horizontal moving element 37d is horizontally (specifically, in the longitudinal direction X) movable relative to the lift 37c. The rotating element 37e is supported by the horizontal moving element 37d. The rotating element 37e is horizontally (specifically, in the longitudinal direction X) movable with the horizontal moving element 37d. The rotating element 37e is rotatable relative to the horizontal moving element 37d about an axis parallel to the up-down direction Z. The holders 37f and 37g are supported by the rotating element 37e. The holders 37f and 37g are horizontally movable forward and backward relative to the rotating element 37e. The holders 37f and 37g are movable forward and backward independently of each other. The holders 37f and 37g contact wafers W, respectively. Each of the holders 37f and 37g holds one wafer W in a horizontal position.

Reference is made to FIGS. 1 and 7. Each story 33 includes a treating section 41. The treating section 41 treats wafers W.

The treating section 41 is arranged laterally of the transporting space 35. The treating section 41 and transporting space 35 are juxtaposed in the transverse direction Y. The treating section 41 adjoins the transporting space 35.

The treating section 41 is arranged laterally of the main transport mechanism 36. The treating section 41 and main transport mechanism 36 are juxtaposed in the transverse direction Y. The treating section 41 and main transport mechanism 36 provided on the same story 33 are located in substantially the same height position. The treating section 41 is located in positions accessible to the main transport mechanism 36 provided on the same story 33 as the treating section 41.

The treating section 41 includes a solution treating section 42 and a heat-treating section 47. The solution treating section 42, transporting space 35, and heat-treating section 47 are juxtaposed in the transverse direction Y. The transporting space 35 is located between the solution treating section 42 and heat-treating section 47. The solution treating section 42 is located leftward of the transporting space 35. The heat-treating section 47 is located rightward of the transporting space 35. The solution treating section 42 performs solution treatment on wafers W. The solution treatment is treatment carried out by supplying treating solutions to the wafers W. The heat-treating section 47 performs heat treatment on the wafers W.

The solution treating section 42 on each story 33 includes a plurality of (e.g. three) solution treating units 43. All the solution treating units 43 included in one solution treating unit 42 are located in the substantially same height position. The solution treating units 43 are arranged to form a row in the longitudinal direction X. Each solution treating unit 43 is located in a position adjoining the transporting space 35.

Each story 33 includes a chamber 45. The chamber 45 houses the solution treating units 43.

Each solution treating unit 43 has a spin holder 44a, a nozzle 44b, and a cup 44c. The spin holder 44a is located in a position accessible to the main transport mechanism 36. The spin holder 44a holds one wafer W in a horizontal position. The spin holder 44a can spin the wafer W placed thereon about an axis parallel to the up-down direction Z. The nozzle 44b dispenses a treating solution to the wafer W. The nozzle 44b is movable between a dispensing position and a withdrawn position. The dispensing position is a position above the wafer W held by the spin holder 44a. The nozzle 44b, when in the dispensing position, overlaps the wafer W held by the spin holder 44a in plan view. The nozzle 44b, when in the dispensing position, dispenses the treating solution to the wafer W. The nozzle 44b, when in the withdrawn position, does not overlap the wafer W held by the spin holder 44a in plan view. The nozzle 44b, when in the withdrawn position, does not dispense the treating solution to the wafer W. When the nozzle 44b is in the withdrawn position, the main transport mechanism 36 is permitted to access the spin holder 44a. The cup 44c collects the treating solution. The cup 44c has an approximately cylindrical shape centering on an axis parallel to the up-down direction Z. The cup 44c accommodates the spin holder 44a, and the wafer W held by the spin holder 44a. The cup 44c laterally surrounds the wafer W held by the spin holder 44a.

Reference is made to FIG. 4. The heat-treating section 47 on each story 33 has a plurality of (e.g. twelve) heat-treating units 48. The heat-treating units 48 are arranged in a matrix form in the side view. For example, the heat-treating units 48 are arranged in four columns in the longitudinal direction X and three rows in the up-down direction Z. Each heat-treating unit 48 is located in a position adjoining the transporting space 35.

Reference is made to FIGS. 1 and 7. Each heat-treating unit 48 has a first plate 49a. The first plate 49a is located in a position accessible to the main transport mechanism 36. The first plate 49a is substantially disk-shaped. The first plate 49a has a substantially horizontal upper surface. One wafer W is placed on the upper surface of the plate 49a. Each heat-treating unit 48 has a first temperature controller not shown. The first temperature controller is attached to the first plate 49a. The first temperature controller adjusts the first plate 49a to a first temperature. The first plate 49a adjusts the wafer W to the first temperature. The first plate 49a cools the wafer W, for example.

Each heat-treating unit 48 may further include a second plate 49b. The second plate 49b is provided laterally of the first plate 49a. The second plate 49b is located at substantially the same height as the first plate 49a. The second plate 49b is located in a position inaccessible to the main transport mechanism 36. The second plate 49b is located in a position farther away than the first plate 49a from the main transport mechanism 36. The second plate 49b is located rightward of the first plate 49a, for example. The heat-treating unit 48, which has the second plate 49b, includes a local transport mechanism and a second temperature controller not shown. The local transport mechanism transports wafers W between the first plate 49a and second plate 49b. The second temperature controller is attached to the second plate 49b. The second temperature controller adjusts the second plate 49b to a second temperature. The second plate 49b adjusts a wafer W to the second temperature. The second temperature is higher than first temperature, for example. The second plate 49*b* heats the wafer W, for example.

Reference is made to FIGS. 1 and 3. Each story 33 includes a first rack 51. The first rack 51 receives wafers W placed thereon.

The first rack 51 is located between the transport device 25 of the indexer division 21 and the main transport mechanism 36 of each story 33. Specifically, the first rack 51 is located rearward and leftward of the first transport mechanism 26. The first rack 51 is located rearward and rightward of the second transport mechanism 27. The first rack 51 is located in a position accessible to each of the first transport mechanism 26 and second transport mechanism 27. The first rack 51 is located forward of the main transport mechanism 36. The first rack 51 and main transport mechanism 36 provided on the same story 33 are located in substantially the same height position. The first rack 51 is located in a position accessible to the main transport mechanism 36 provided on the same story 33 as the first rack 51.

The first rack 51 is installed to join the transporting space 35 of the story 33 and the transporting space 23 of the indexer division 21. Specifically, part of the first rack 51 is located in the front part of the transporting space 35. The remaining part of the first rack 51 is located in the transporting space 23.

The transport device 25 transports wafers W between the carriers C placed on the carrier racks 22A and 22B and the first rack 51.

The first rack 51 has a first feed rack 52. The transport device 25 places wafers W on the first feed rack 52 only. The main transport mechanism 36 does not place wafers W on the first feed rack 52. The main transport mechanism 36 takes wafers W from the first feed rack 52 only. The transport device 25 does not take wafers W from the first feed rack 52.

The first rack 51 has a first return rack 53. The main transport mechanism 36 places wafers W on the first return rack 53 only. The transport device 25 does not place wafers W on the first return rack 53. The transport device 25 takes wafers W from the first return rack 53 only. The main transport mechanism 36 does not take wafers W from the first return rack 53.

The first feed rack 52 and first return rack 53 are located to align in the up-down direction Z. The first feed rack 52 overlaps the first return rack 53 in plan view.

The first feed rack 52 of each story 33 is constructed capable of receiving four wafers W placed thereon at the same time. The first return rack 53 is constructed capable of receiving four wafers W placed thereon at the same time. Such construction will be described specifically hereinafter.

Figure 8A:
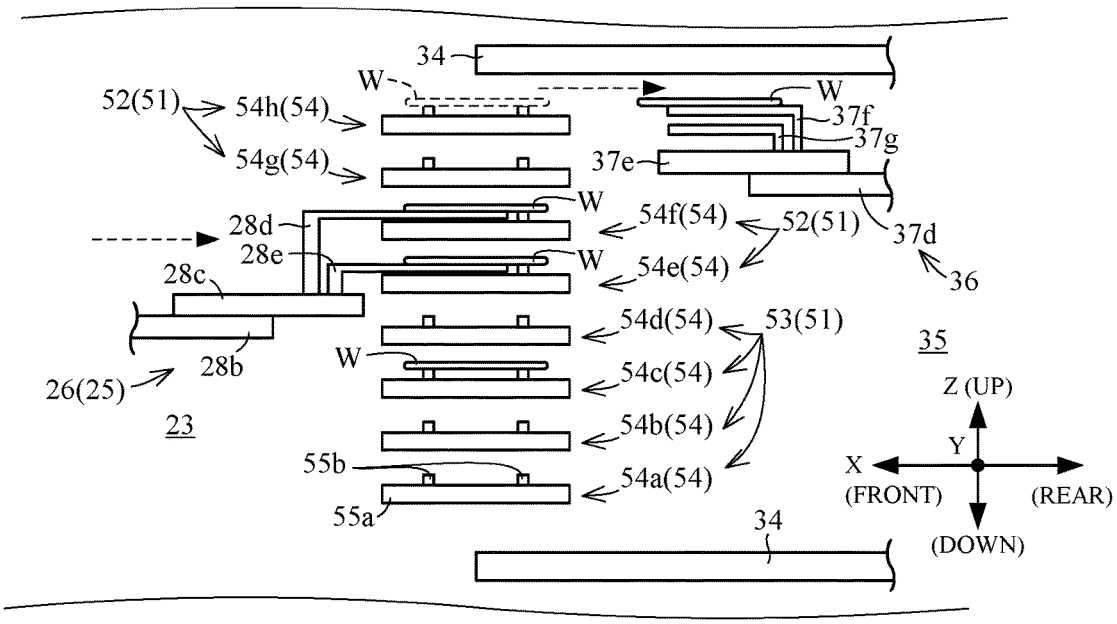
FIGS. 8A and 8B are enlarged side views of a first rack.
Figure 8B:
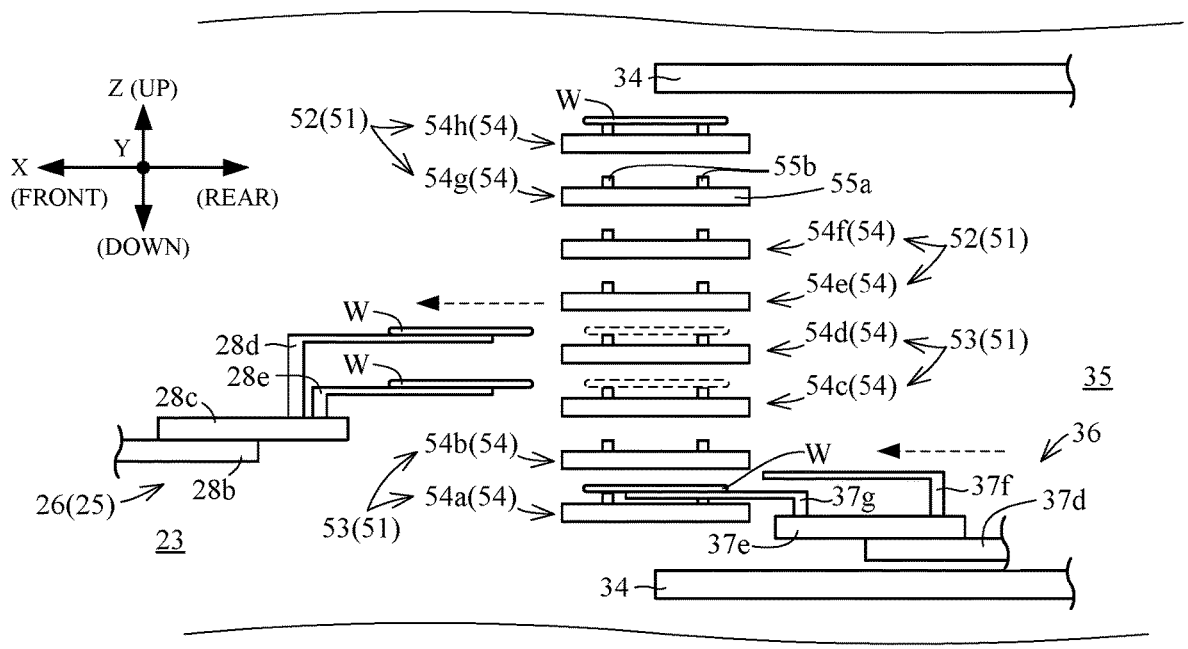

FIGS. 8A and 8B are enlarged side views of the first rack 51. The first rack 51 provided for each story 33 has eight rack units 54. One wafer W is placed on one rack unit 54. The rack units 54 are arranged to align in the up-down direction Z. The rack units 54 overlap one another in plan view. Four rack units 54 among the eight rack units 54 belong to the first feed rack 52. The four remaining rack units 54 belong to the first return rack 53.

Each rack unit 54 has one receiving plate 55*a* and a plurality of (e.g. three) support pins 55*b*. The receiving plates 55*a* are supported by at least one of the frame 24 of the indexer division 21 and the frame 32 of the treating block 31. Each receiving plate 55*a* has a substantially horizontal plate shape. The support pins 55*b* are supported by the receiving plate 54. The support pins 55*b* extend in the up-down direction Z. Each support pin 55*b* has an upper end and a lower end. The lower ends of the support pins 55*b* are connected to the receiving plate 55*a*. The upper ends of the support pins 55*b* are located in the same height position. The upper ends of the support pins 55*b* contact the back surface of a wafer W. The support pins 55*b* support one wafer W. Consequently, one wafer W is placed in a horizontal position on the rack unit 54.

Reference is made to FIGS. 1 and 3. Each story 33 includes a second rack 56. The wafers W are placed on the second rack 56.

The second rack 56 is located between the main transport mechanism 36 and the interface division 71. The second rack 56 is located rearward of the main transport mechanism 36. The second rack 56 and main transport mechanism 36 provided on the same story 33 are located in substantially the same height position. The second rack 56 is located in a position accessible to the main transport mechanism 36 provided on the same story 33 as the second rack 56.

The second rack 56 is installed to join the transporting space 35 on the story 33 and the interface division 71. Specifically, part of the second rack 56 is located in the rear part of the transporting space 35. The remaining part of the second rack 56 is located in the interface division 71.

The second rack 56 has a second feed rack 57 and a second return rack 58. Only the main transport mechanism 36 places wafers W on the second feed rack 57. The interface division 71 does not place wafers W on the second feed rack 57. Only the interface division 71 takes wafers W from the second feed rack 57. The main transport mechanism 36 does not take wafers W from the second feed rack 57. Only the interface division 71 places wafers W on the second return rack 58. The main transport mechanism 36 does not place wafers W on the second return rack 58. Only the main transport mechanism 36 takes wafers W from the second return rack 58. The interface division 71 does not take wafers W from the second return rack 58.

The second feed rack 57 and second return rack 58 are located to align in the up-down direction Z. The second feed rack 57 overlaps the second return rack 58 in plan view.

The second feed rack 57 of each story 33 is constructed capable of receiving four wafers W placed thereon at the same time. The second return rack 58 is constructed capable of receiving four wafers W placed thereon at the same time. Such construction will be described specifically hereinafter.

The second rack 56 has substantially the same construction and shape as the first rack 51. For example, the second rack 56 provided for each story 33 has eight rack units (not shown). One wafer W is placed on one rack unit. The rack units are arranged to align in the up-down direction Z. The rack units overlap one another in plan view. Four rack units among the eight rack units belong to the second feed rack 57. The four remaining rack units belong to the second return rack 58. The rack units of the second rack 56 have substantially the same construction and shape as the rack units 54 of the first rack 51.

The main transport mechanism 36 transports wafers W to the treating section 41, first rack 51, and second rack 56. More particularly, the main transport mechanism 36 transports wafers W to the treating section 41, first rack 51, and second rack 56 provided on the same story 33 as the main transport mechanism 36. The main transport mechanism 36 does not transport wafers W to the treating section 41, first racks 51, or second racks 56 provided on stories 33 different from the story 33 of the main transport mechanism 36.

Reference is made to FIGS. 1 and 2. The treating block 31 includes a pump chamber 61. The pump chamber 61 is located in a position adjacent the solution treating sections 42. More particularly, the pump chamber 61 and solution treating sections 42 are juxtaposed in the longitudinal direction X. The pump chamber 61 is located rearward of the solution treating sections 42. The pump chamber 61 and transporting spaces 35 are juxtaposed in the transverse direction Y. The pump chamber 61 is located rightward of the transporting spaces 35.

The pump chamber 61 is, in plan view, located in a position not overlapping the stories 33. More particularly, the pump chamber 61 does not overlap the transporting spaces 35 or treating sections 41 in plan view. For example, the pump chamber 61 is not located below the stories 33. For example, the pump chamber 61 is not located below the transporting spaces 35. For example, the pump chamber 61 is not located below the treating sections 41. For example, the pump chamber 61 is not located below the solution treating sections 42.

The pump chamber 61 has a relatively small area in plan view. The pump chamber 61 has a smaller length in the longitudinal direction X than in the up-down direction Z. The pump chamber 61 has a smaller length in the transverse direction Y than in the up-down direction Z.

The pump chamber 61 extends in the up-down direction Z. The pump chamber 61 has an upper end and a lower end. The upper end of the pump chamber 61 is lower than the highest story 33. The upper end of the pump chamber 61 is located in substantially the same height position as the second highest story 33. The lower end of the pump chamber 61 is lower than the lowest story 33.

The treating block 31 includes a plurality of pumps 62. The pumps 62 are installed in the pump chamber 61. The pumps 62 are arranged to align in the up-down direction Z. The pumps 62 feed the treating solution to the solution treating units 43 provided for at least certain of the stories 33. The pumps 62 are connected to the nozzles 44$b$ of the solution treating units 43 provided for at least certain of the stories 33.

Reference is made to FIG. 2. The treatment performed on wafers W by each story 33 will be described. For expediency, the stories 33 will be called, in order from bottom to top, the first story 33$a$, second story 33$b$, third story 33$c$, fourth story 33$d$, fifth story 33$e$, sixth story 33$f$, and seventh story 33$g$. The first story 33$a$ is the lowest of the stories 33. The seventh story 33$g$ is the highest of the stories 33.

The treating sections 41 of the sixth and seventh stories 33$f$-33$g$ perform the same treatment on wafers W. Each of the treating sections 41 of the sixth and seventh stories 33$f$-33$g$ performs a first treatment on the wafers W. The first treatment includes antireflection film forming treatment for forming antireflection film on the wafers W.

The treating sections 41 of the fourth and fifth stories 33$d$-33$e$ perform the same treatment on wafers W. Each of the treating sections 41 of the fourth and fifth stories 33$d$-33$e$ performs a second treatment on the wafers W. The second treatment includes resist film forming treatment for forming resist film on the wafers W.

The treating sections 41 of the first to third stories 33$a$-33$c$ perform the same treatment on wafers W. Each of the treating sections 41 of the first to third stories 33$a$-33$c$ performs a third treatment on the wafers W. The third treatment includes developing treatment for developing the wafers W.

The first treatment does not include the resist film forming treatment or developing treatment. The second treatment does not include the antireflection film forming treatment or developing treatment. The third treatment does not include the antireflection film forming treatment or resist film forming treatment. Consequently, the first treatment is different from the second treatment. The first treatment is different from the third treatment. The second treatment is different from the third treatment.

The antireflection film forming treatment, resist film forming treatment, and developing treatment all belong to the solution treatment. The antireflection film forming treatment and resist film forming treatment belong to pre-exposure treatment carried out before the exposing treatment. The developing treatment belongs to post-exposure treatment carried out after the exposing treatment.

The first treatment does not include the post-exposure treatment. The second treatment does not include the post-exposure treatment. The third treatment does not include the pre-exposure treatment.

The antireflection film forming treatment and resist film forming treatment are examples of the first pre-exposure treatment and second pre-exposure treatment in this invention.

Details of the construction of the above treating sections 41 are different between the stories 33 according to the differences in treatment between the stories 33. This aspect will be described specifically hereinafter.

The solution treating sections 42 of the sixth and seventh stories 33$f$-33$g$ use an antireflection film material as treating solution. The solution treating units 43 of the sixth and seventh stories 33$f$-33$g$ correspond to antireflection film coating units BARC.

The solution treating sections 42 of the fourth and fifth stories 33$d$-33$e$ use a resist film material as treating solution. The solution treating units 43 of the fourth and fifth stories 33$d$-33$e$ correspond to resist film coating units RESIST.

The solution treating sections 42 of the first to third stories 33$a$-33$c$ use a developer as treating solution. The solution treating units 43 of the first to third stories 33$a$-33$c$ correspond to developing units SD.

The shape of nozzles 44$b$ may be different between the sixth and seventh stories 33$f$-33$g$ and the fourth and fifth stories 33$d$-33$e$. The shape of nozzles 44$b$ may be different between the sixth and seventh stories 33$f$-33$g$ and the first to third stories 33$a$-33$c$. The shape of nozzles 44$b$ may be different between the fourth and fifth stories 33$d$-33$e$ and the first to third stories 33$a$-33$c$.

Incidentally, the pumps 62 feed the treating solutions to the solution treating sections 42 (solution treating units 43) provided for the fourth to seventh stories 33$d$-33$g$. The pumps 62 do not feed treating solutions to the solution treating sections 42 (solution treating units 43) provided for the first to third stories 33$a$-33$c$.

Reference is made to FIG. 4. The first treatment further includes hydrophobizing treatment, heating treatment, and cooling treatment. The hydrophobizing treatment, heating treatment, and cooling treatment all belong to the heat treatment. The hydrophobizing treatment is treatment for adjusting wafers W to a predetermined temperature while supplying the wafers W with a treating gas including hexamethyldisilazane (HMDS). The hydrophobizing treatment is carried out in order to improve adhesion of the wafers W and film. The heating treatment heats the wafers W. The cooling treatment cools the wafers W.

Thus, part of the heat-treating units 48 of the sixth and seventh stories 33$f$-33$g$ correspond to hydrophobizing units AHP. Other part of the heat-treating units 48 of the sixth and seventh stories 33$f$-33$g$ correspond to heating units HP. The remainder of the heat-treating units 48 of the sixth and seventh stories 33$f$-33$g$ correspond to cooling units CP.

The second treatment further includes heating treatment and cooling treatment.

Thus, part of the heat-treating units 48 of the fourth and fifth stories 33d-33e correspond to the heating units HP. The remainder of the heat-treating units 48 of the fourth and fifth stories 33d-33e correspond to the cooling units CP.

The third treatment further includes heating treatment and cooling treatment.

Thus, part of the heat-treating units 48 of the first to third story 33a-33c correspond to the heating units HP. The remainder of the heat-treating units 48 of the first to third stories 33a-33c correspond to the cooling units CP.

The construction of the heat-treating units 48 may be different from each other between the hydrophobizing units AHP, heating units HP, and cooling units CP. For example, the hydrophobizing units AHP and heating units HP may have second plates 49b. The cooling units CP do not need to have second plates 49b. The hydrophobizing units AHP may further include gas supply elements for supplying the wafers W with the treating gas.

The sixth and seventh stories 33f-33g are an example of the "stories for performing the first treatment" in this invention. The fourth and fifth stories 33d-33e are an example of the "stories for performing the second treatment" in this invention. The first to third stories 33a-33c are an example of the "stories for performing the third treatment" in this invention.

<Interface Division 71>

Figure 9:
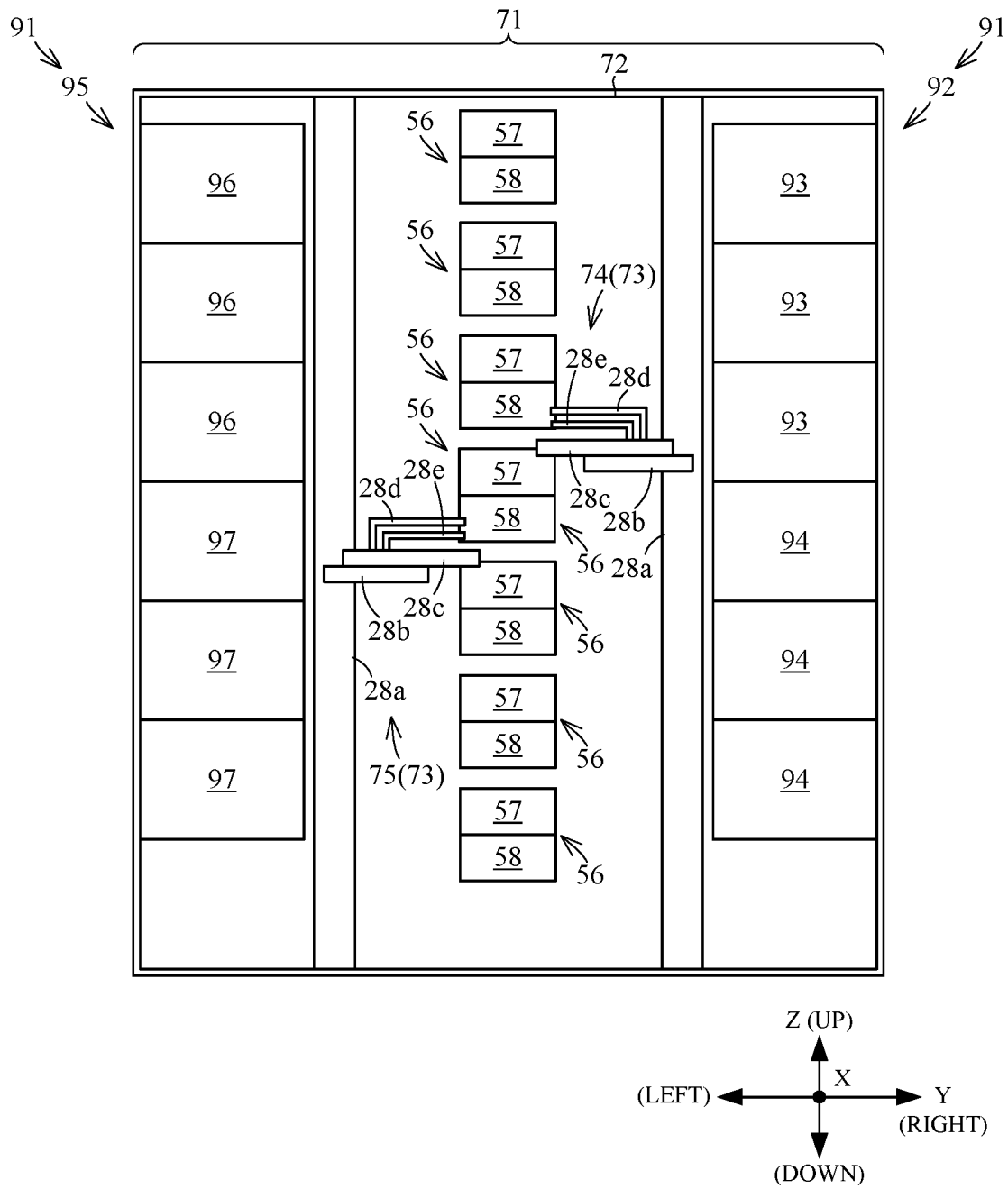
FIG. 9 is a rear view of a front part of an interface division.
Figure 10:
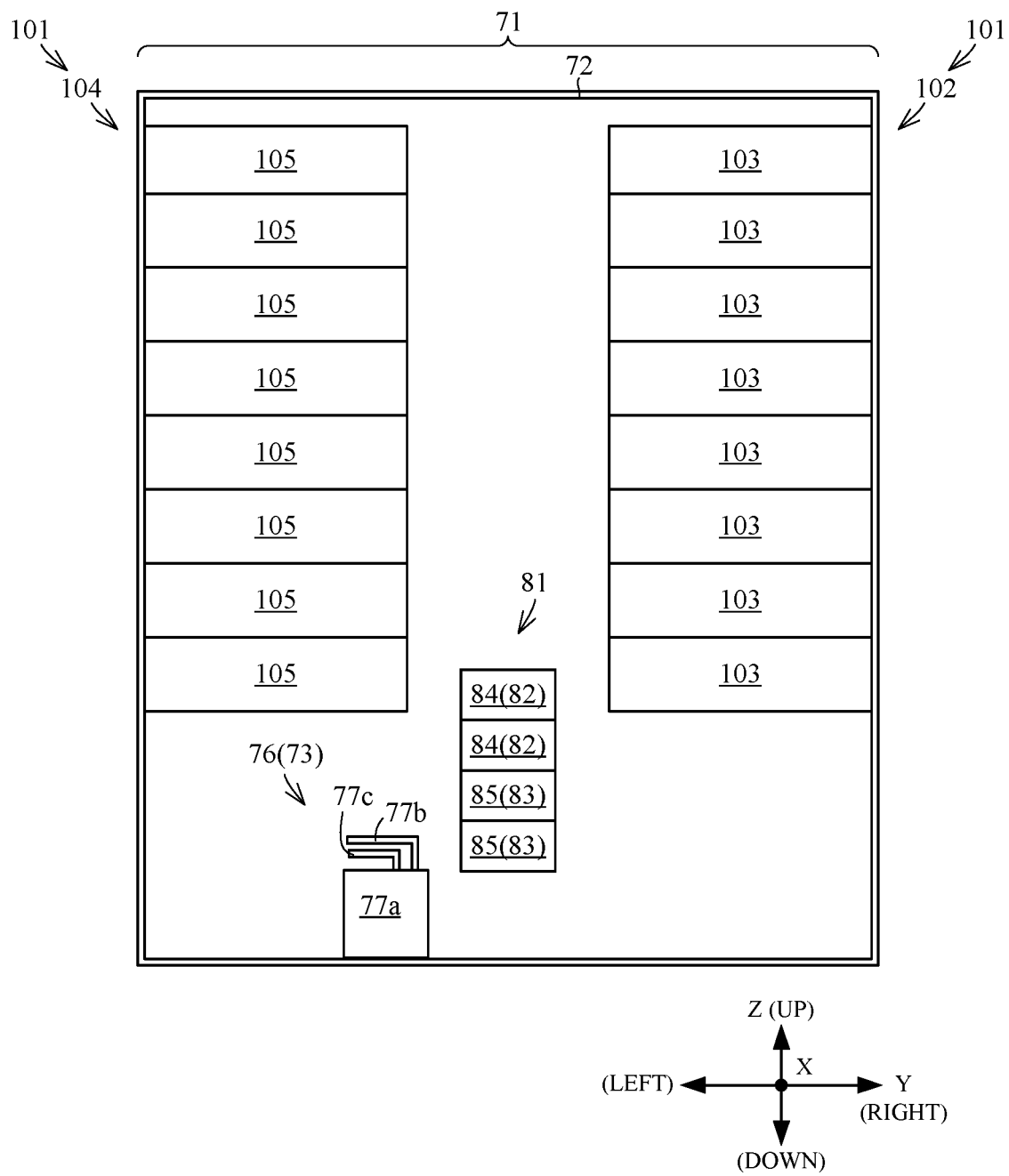
FIG. 10 is a rear view of a rear part of the interface division.

Reference is made to FIGS. 1-4, 9, and 10. FIG. 9 is a rear view of a front part of the interface division 71. FIG. 10 is a rear view of a rear part of the interface division 71. The interface division 71 is substantially box-shaped. The interface division 71 is substantially rectangular in plan view, side view, and front view.

The interface division 71 has a frame 72. The frame 72 is provided as a framework (skeletal structure) for the interface division 71. The frame 72 demarcates the shape of the interface division 71. The frame 72 is formed of metal, for example.

The interface division 71 has a transport device 73. The transport device 73 of the interface division 71 transports wafers W between the second racks 56 and exposing machine EXP.

The transport device 73 includes a first transport mechanism 74 and a second transport mechanism 75. The first transport mechanism 74 and second transport mechanism 75 transport wafers W, respectively. The first transport mechanism 74 and second transport mechanism 75 are arranged to align in the transverse direction Y. The first transport mechanism 74 is located rightward of the second transport mechanism 75. The first transport mechanism 74 is located in substantially the same height position as the second transport mechanism 75.

The first transport mechanism 74 is located rearward and rightward of the second racks 56. The second transport mechanism 75 is located rearward and leftward of the second racks 56. The first transport mechanism 74 and second transport mechanism 75 can access the second racks 56, respectively.

The first transport mechanism 74 has substantially the same construction and shape as the first transport mechanism 26 of the indexer division 21. The second transport mechanism 75 has substantially the same construction and shape as the first transport mechanism 26 of the indexer section 21 except for being bilaterally symmetric.

The transport device 73 has a third transport mechanism 76. The third transport mechanism 76 transports wafers W. The third transport mechanism 76 is located rearward of the first transport mechanism 74 and second transport mechanism 75. More particularly, the third transport mechanism 76 is located rearward and leftward of the first transport mechanism 74. The third transport mechanism 76 is located rearward and rightward of the second transport mechanism 75. The third transport mechanism 76 is located in substantially the same height position as the first transport mechanism 74 and second transport mechanism 75. More particularly, the third transport mechanism 76 is located substantially in a height position corresponding to a lower part of the first transport mechanism 74 and a lower part of the second transport mechanism 75. The third transport mechanism 76 can access the exposing machine EXP. The third transport mechanism 76 passes wafers W on to the exposing machine EXP and receives wafers W from the exposing machine EXP.

The third transport mechanism 76 has a driver 77a and two holders 77b and 77c. The driver 77a is supported by the frame 72. The holders 77b and 77c are supported by the driver 77a. The driver 77a moves the holders 77b and 77c. The driver 77a moves the holders 77b and 77c in the longitudinal direction X, transverse direction Y, and up-down direction Z, for example. The driver 77a rotates the holders 77b and 77c about an axis parallel to the up-down direction Z, for example. The holders 77b and 77c contact wafers W, respectively. Each of the holders 77b and 77c holds one wafer W in a horizontal position.

The interface division 71 has a middle rack 81. The wafers W are placed on the middle rack 81.

The middle rack 81 is surrounded by the first transport mechanism 74, second transport mechanism 75, and third transport mechanism 76. The middle rack 81 is located rearward of the first transport mechanism 74 and second transport mechanism 75. The middle rack 81 is located rearward and leftward of the first transport mechanism 74. The middle rack 81 is located rearward and rightward of the second transport mechanism 75. The middle rack 81 is located forward of the third transport mechanism 76. The middle rack 81 is located in substantially the same height position as the first transport mechanism 74, second transport mechanism 75, and third transport mechanism 76. The middle rack 81 is located substantially in a height position corresponding to the lower part of the first transport mechanism 74 and the lower part of the second transport mechanism 75. The middle rack 81 is located in a position accessible to the first transport mechanism 74, second transport mechanism 75, and third transport mechanism 76.

Reference is made to FIGS. 3 and 10. The middle rack 81 includes feed racks 82 and return racks 83. The first transport mechanism 74 and second transport mechanism 75 place wafers W in the feed racks 82 only. The third transport mechanism 76 does not place wafers W in the feed racks 82. The third transport mechanism 76 takes wafers W from the feed racks 82 only. The first transport mechanism 74 and second transport mechanism 75 do not take wafers W from the feed racks 82. The third transport mechanism 76 places wafers W in the return racks 83 only. The first transport mechanism 74 and second transport mechanism 75 do not place wafers W in the return racks 83. The first transport mechanism 74 and second transport mechanism 75 take wafers W from the return racks 83 only. The third transport mechanism 76 does not take wafers W from the return racks 83.

The feed racks 82 and return racks 83 are arranged to align in the up-down direction Z. The feed racks 82 overlap the return racks 83 in plan view.

The feed racks 82 have a plurality of cooling rack units 84. Each cooling rack unit 84 receives one wafer W. The cooling rack units 84 cool the wafers W placed thereon. The cooling rack units 84 adjust the temperature of the wafers W to a temperature suitable for the exposing treatment, for example.

The cooling rack units 84 are arranged to align in the up-down direction Z. The cooling rack units 84 overlap one another in plan view.

Although not shown, each cooling rack unit 84 has a construction with a temperature controller attached to the rack unit 54. The temperature controller is attached to the receiving plate 55a of the rack unit 54 for adjusting the temperature of the receiving plate 55a.

The return racks 83 have a plurality of rack units 85. Each rack unit 85 receives one wafer W.

The rack units 85 are arranged to align in the up-down direction Z. The rack units 85 overlap one another in plan view. The rack units 85 overlap the cooling rack units 84 in plan view.

The rack units 85 have substantially the same construction and shape as the rack units 54.

Reference is made to FIGS. 1, 2, 4, and 9. The interface division 71 includes cleaning sections 91. The cleaning sections 91 perform cleaning treatment for cleaning wafers W. The cleaning sections 91 further perform drying treatment for drying the wafers W. The transport device 73 transports wafers W to the cleaning sections 91.

The cleaning sections 91 include a first cleaning section 92. The first cleaning section 92 is located in a position accessible to the first transport mechanism 74. The first cleaning section 92 is located in a position adjacent the first transport mechanism 74. The first cleaning section 92 is located laterally of the first transport mechanism 74. The first cleaning section 92 is located rightward of the first transport mechanism 74. The first cleaning section 92 is located in substantially the same height position as the first transport mechanism 74.

The first cleaning section 92 includes a plurality of (e.g. three) pre-exposure cleaning units 93. The pre-exposure cleaning units 93 are arranged to align in the up-down direction Z. The pre-exposure cleaning units 93 overlap one another in plan view. The pre-exposure cleaning units 93 are located in positions accessible to the first transport mechanism 74.

The pre-exposure cleaning units 93 perform the cleaning treatment on wafers W before the exposing treatment. Specifically, the pre-exposure cleaning units 93 clean wafers W by supplying a cleaning liquid to the wafers W. For example, the pre-exposure cleaning units 93 may supply the cleaning liquid to the back surfaces of the wafers W, and clean the back surfaces and edge regions of the wafers W. The pre-exposure cleaning units 93 may clean the wafers W, for example, while rotating the wafers W. The pre-exposure cleaning units 93 may clean the wafers W, for example, while using brushes which contact the wafers W. The pre-exposure cleaning units 93 further perform drying treatment on the wafers W before the exposing treatment.

The first cleaning section 92 includes a plurality of (e.g. three) post-exposure cleaning units 94. The post-exposure cleaning units 94 are arranged to align in the up-down direction Z. The post-exposure cleaning units 94 overlap one another in plan view. The post-exposure cleaning units 94 are arranged below the pre-exposure cleaning units 93. The post-exposure cleaning units 94 overlap the pre-exposure cleaning units 93 in plan view. The post-exposure cleaning units 94 are located in positions accessible to the first transport mechanism 74.

The post-exposure cleaning units 94 perform the cleaning treatment on wafers W after the exposing treatment. Specifically, the post-exposure cleaning units 94 clean wafers W by supplying a cleaning liquid to the wafers W. The post-exposure cleaning units 94 further perform drying treatment on wafers W.

The cleaning section 91 includes a second cleaning section 95. The second cleaning section 95 is located in a position accessible to the second transport mechanism 75. The second cleaning section 95 is located in a position adjacent the second transport mechanism 75. The second cleaning section 95 is located laterally of the second transport mechanism 74. The second cleaning section 95 is located leftward of the second transport mechanism 75. The second cleaning section 95 is located in substantially the same height position as the second transport mechanism 75.

The second cleaning section 95 includes a plurality of (e.g. three) pre-exposure cleaning units 96. The second cleaning section 95 includes a plurality of (e.g. three) post-exposure cleaning units 97. The pre-exposure cleaning units 96 and post-exposure cleaning units 97 are arranged similarly to the pre-exposure cleaning units 93 and post-exposure cleaning units 94 except for being bilaterally symmetric. The pre-exposure cleaning units 96 and post-exposure cleaning units 97 have the same construction as the pre-exposure cleaning units 93 and post-exposure cleaning units 94 except for being bilaterally symmetric.

The above cleaning treatment (e.g. the treatment the cleaning section 91 performs on wafers W) belongs to the solution treatment. The cleaning treatment performed on wafers W before the exposing treatment (e.g. the treatment the pre-exposure cleaning units 93 and 96 perform on wafers W) belongs to the pre-exposure treatment. The cleaning treatment performed on wafers W after the exposing treatment (e.g. the treatment the post-exposure cleaning units 94 and 97 perform on wafers W) belongs to the post-exposure treatment.

Reference is made to FIGS. 1, 2, 4, and 10. The interface division 71 has heat-treating sections 101. The heat-treating sections 101 perform heat treatment on wafers W. The transport device 73 transports wafers W to the heat-treating sections 101.

The heat-treating sections 101 include a first heat-treating section 102. The first heat-treating section 102 is located in a position accessible to the first transport mechanism 74. The first heat-treating section 102 is located in a position adjacent the first transport mechanism 74. The first heat-treating section 102 is located rearward of the first transport mechanism 74. The first heat-treating section 102 is located rearward of the first cleaning section 92. The first heat-treating section 102 is located rightward of the middle rack 81 in plan view. The first heat-treating section 102 is located in substantially the same height position as the first transport mechanism 74. More particularly, the first heat-treating section 102 is located in substantially the same height position as the upper part of the first transport mechanism 74. The first heat-treating section 102 is located in a position higher than the third transport mechanism 76.

The first heat-treating section 102 has a plurality of post-exposure heating units 103. The post-exposure heating units 103 are arranged to align in the up-down direction Z. The post-exposure heating units 103 overlap one another in plan view. The post-exposure heating units 103 are located in a position accessible to the first transport mechanism 74.

The post-exposure heating units 103 perform heat treatment on wafers W after the exposing treatment (that is, post-exposure bake). The post-exposure heating units 103 have substantially the same construction and shape as the heat-treating units 48. More particularly, the post-exposure heating units 103 have substantially the same construction and shape as the heat-treating units 48 which correspond to the heating units HP.

The heat-treating sections 101 include a second heat-treating section 104. The second heat-treating section 104 is located in a position accessible to the second transport mechanism 75. The second heat-treating section 104 is located in a position adjacent the second transport mechanism 75. The second heat-treating section 104 is located rearward of the second transport mechanism 75. The second heat-treating section 104 is located rearward of the second cleaning section 95. The second heat-treating section 104 is located leftward of the middle rack 81 in plan view. The second heat-treating section 104 is located in substantially the same height position as the second transport mechanism 75. More particularly, the second heat-treating section 104 is located in substantially the same height position as the upper part of the second transport mechanism 75. The second heat-treating section 104 is located in a position higher than the third transport mechanism 76.

The second heat-treating section 104 has a plurality of post-exposure heating units 105. The post-exposure heating units 105 are arranged similarly to the post-exposure heating units 103 except for being bilaterally symmetric. The post-exposure heating units 105 have substantially the same construction and shape as the post-exposure heating units 103 except for being bilaterally symmetric.

The above post-exposure heating treatment (e.g. the, treatment the heat-treating sections 101 perform on wafers W) belongs to the heat treatment. The post-exposure heat treatment belongs to the post-exposure treatment.

<Controller 107>

Reference is made to FIG. 1. The substrate treating apparatus 1 includes a controller 107. The controller 107 is installed in the indexer division 21, for example. The controller 107 controls the stocker division 11, indexer division 21, treating block 31 (stories 33), and interface division 71. More particularly, the controller 107 controls the carrier transport mechanism 15, transport device 25, main transport mechanisms 36, and transport device 73. The controller 107 further controls the treating sections 41, cleaning sections 91, and heat-treating sections 101.

The controller 107 is realized by a central processing unit (CPU) which performs various processes, a RAM (Random-Access Memory) used as working space for arithmetic processes, and a storage medium such as a fixed disk. The storage medium stores varieties of information such as treatment recipes (processing programs) for treating wafers W and information for identifying each wafer W.

<Operation of the Transport Device 25 of the Indexer Division 21>

Figure 11:
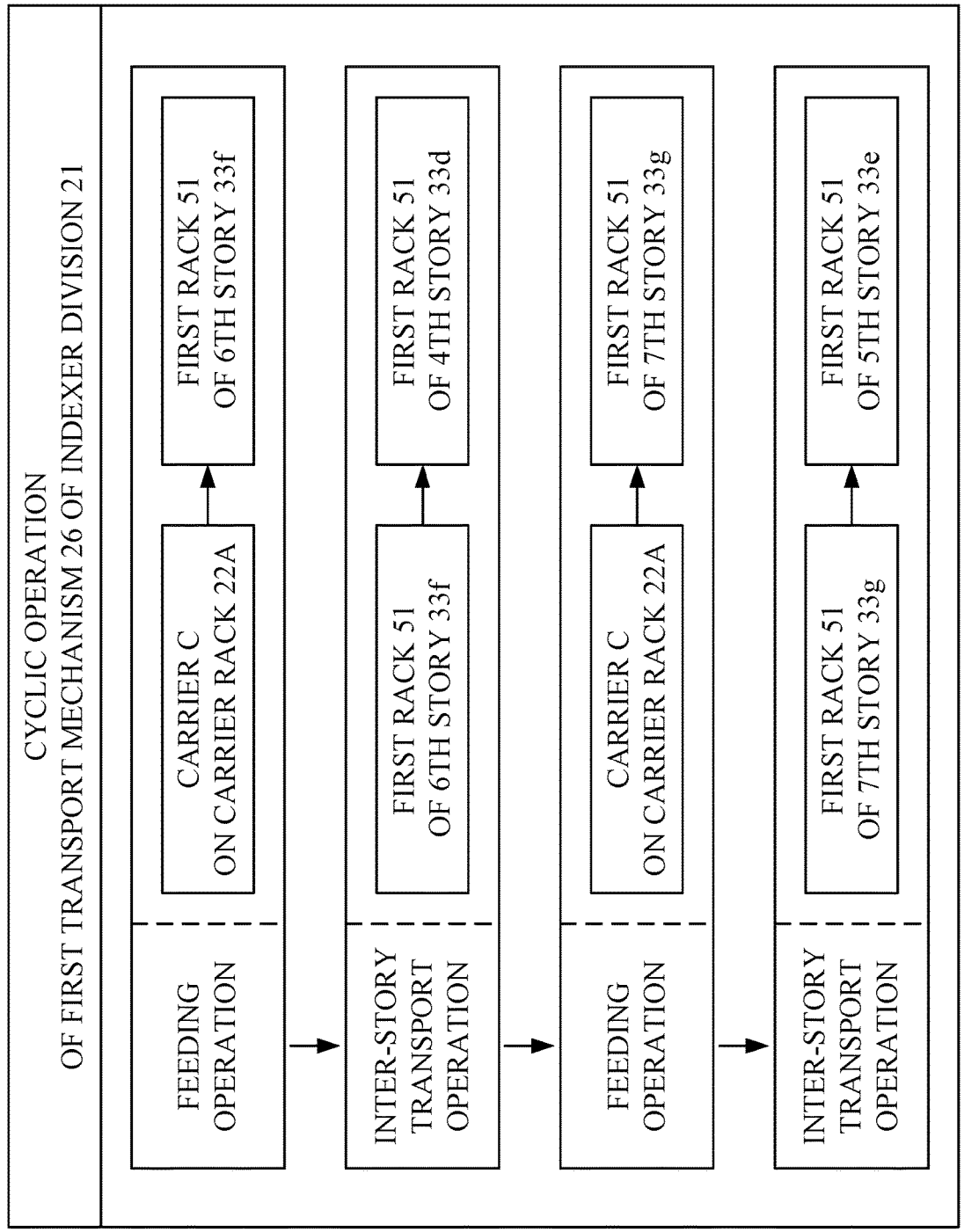
FIG. 11 is a view schematically showing a cyclic operation of a first transport mechanism of the indexer division.
Figure 12:
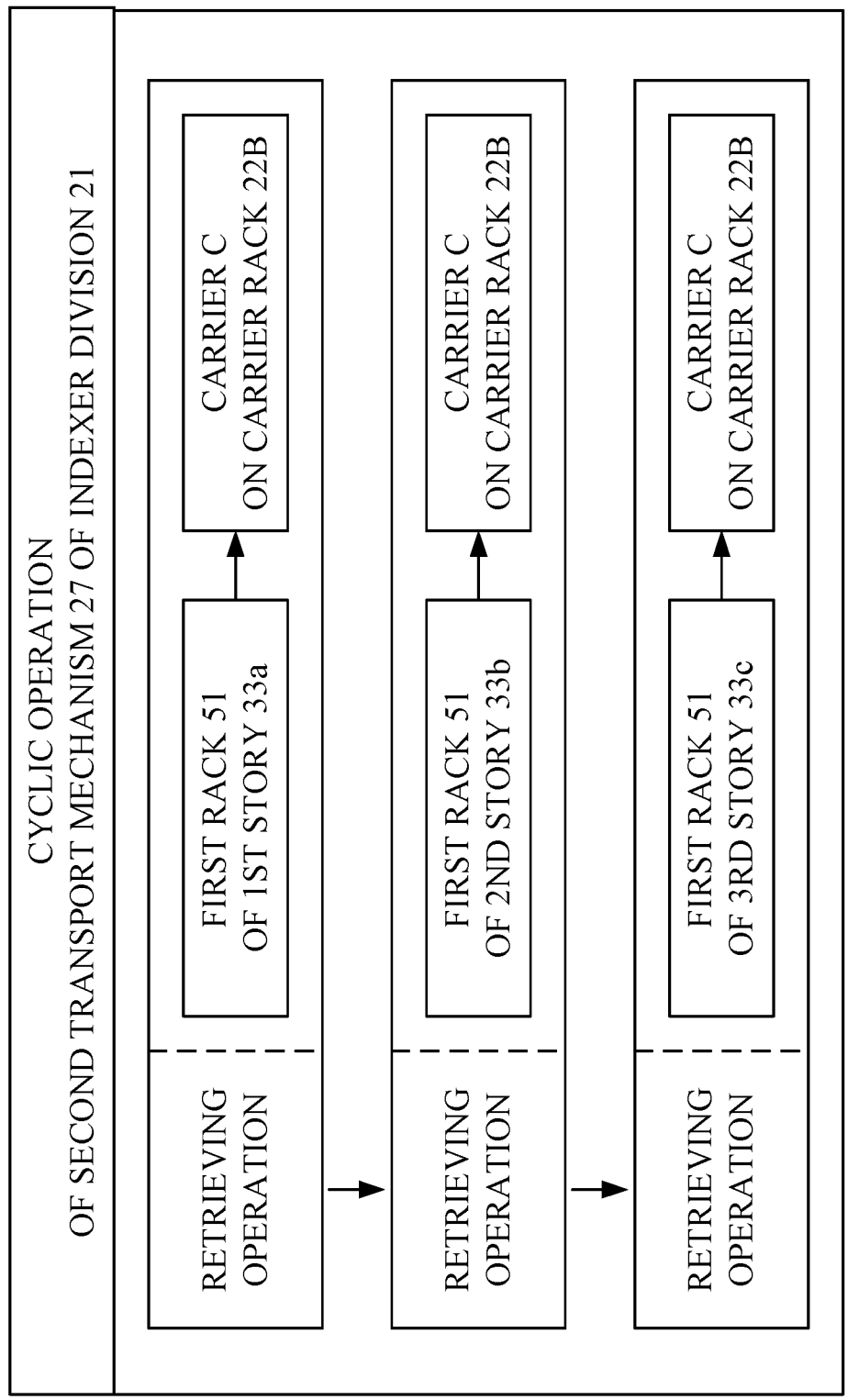
FIG. 12 is a view schematically showing a cyclic operation of a second transport mechanism of the indexer division.

FIG. 11 is a view schematically showing a cyclic operation of the first transport mechanism 26 of the indexer division 21. FIG. 12 is a view schematically showing a cyclic operation of the second transport mechanism 27 of the indexer division 21.

The first transport mechanism 26 and second transport mechanism 27, under control of the controller 107, repeat the cyclic operations shown in FIGS. 11 and 12. The cyclic operation of the first transport mechanism 26 includes a feeding operation and an inter-story transport operation. That is, the first transport mechanism 26 performs a feeding operation and an inter-story transport operation. The feeding operation is an operation for transporting wafers W from a carrier C placed on the carrier rack 22A to the first rack 51.

The inter-story transport operation is an operation for transporting wafers W between two first racks 51 provided for different stories 33.

The cyclic operation of the second transport mechanism 27 includes a retrieving operation. That is, the second transport mechanism 27 performs a retrieving operation. The retrieving operation is an operation for transporting wafers W from the first rack 51 to a carrier C placed on the carrier rack 22B.

The first transport mechanism 26 does not perform the retrieving operation. The second transport mechanism 27 does not perform the feeding operation or the inter-story transport operation. Thus, the transport device 25 transports wafers W between the carriers C placed on the carrier racks 22A and 22B and the first racks 51.

<Operation of the Substrate Treating Apparatus>

Figure 13:
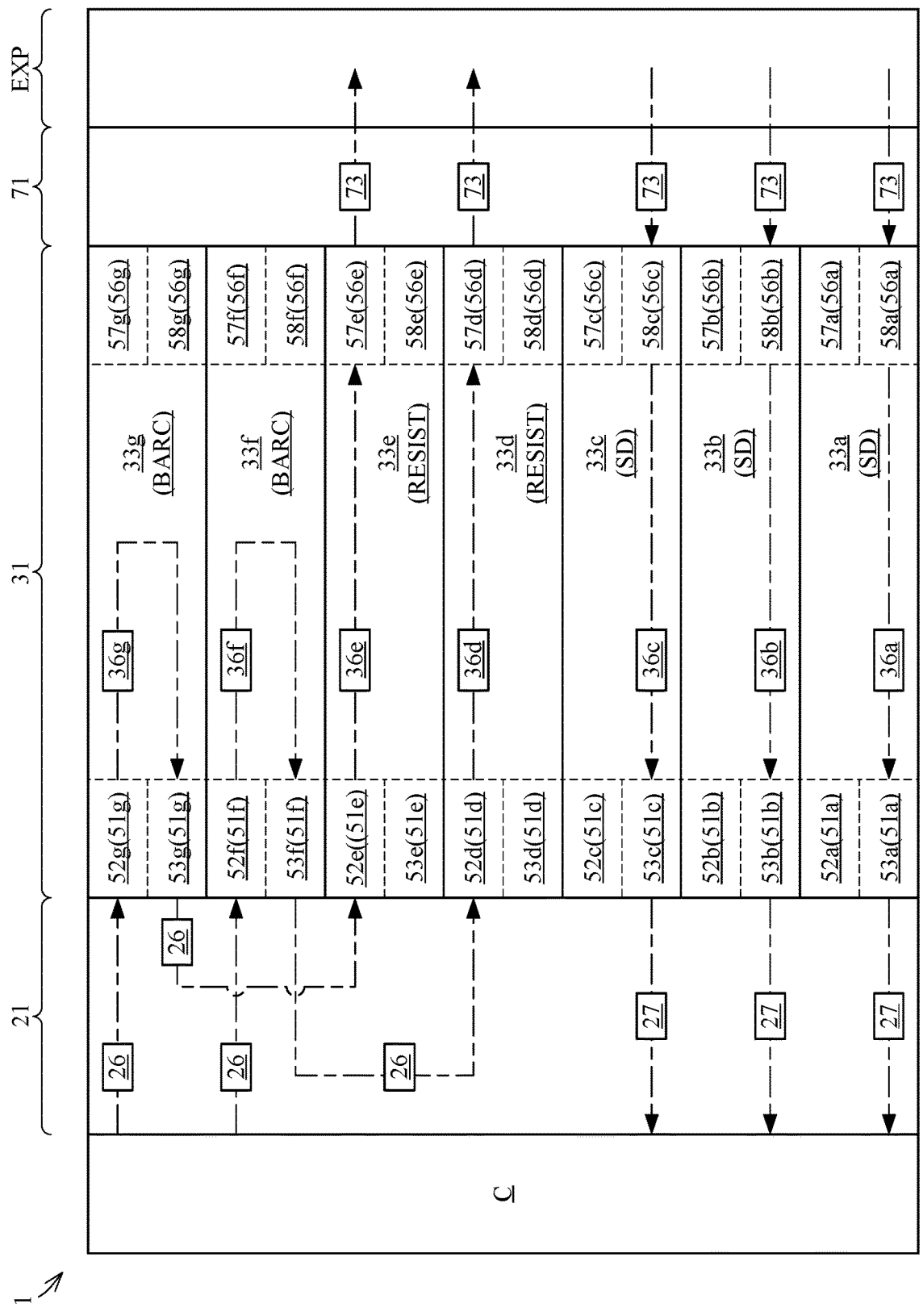
FIG. 13 is a view schematically showing an outline of substrate transport routes.

FIG. 13 is a view schematically showing an outline of transport routes of wafers W. FIG. 13 shows the transport routes of wafers W in chain lines. In FIG. 13, for expediency, "a" is affixed to the signs of the elements of the first story 33a. For example, "52a" indicates the first feed rack 52 of the first story 33a. Similarly, "b" to "g" are affixed to the signs of the elements of the second to seventh stories 33b-33g.

The substrate treating apparatus 1 transports each wafer W to a plurality of stories 33. The substrate treating apparatus 1 treats each wafer W on at least two stories 33.

Specifically, each wafer W is transported to one of the sixth and seventh stories 33f-33g, one of the fourth and fifth stories 33d and 33e, and one of the first to third stories 33a-33c. Each wafer W is treated on one of the sixth and seventh stories 33f-33g, one of the fourth and fifth stories 33d-33e, and one of the first to third stories 33a-33c.

Figure 14:
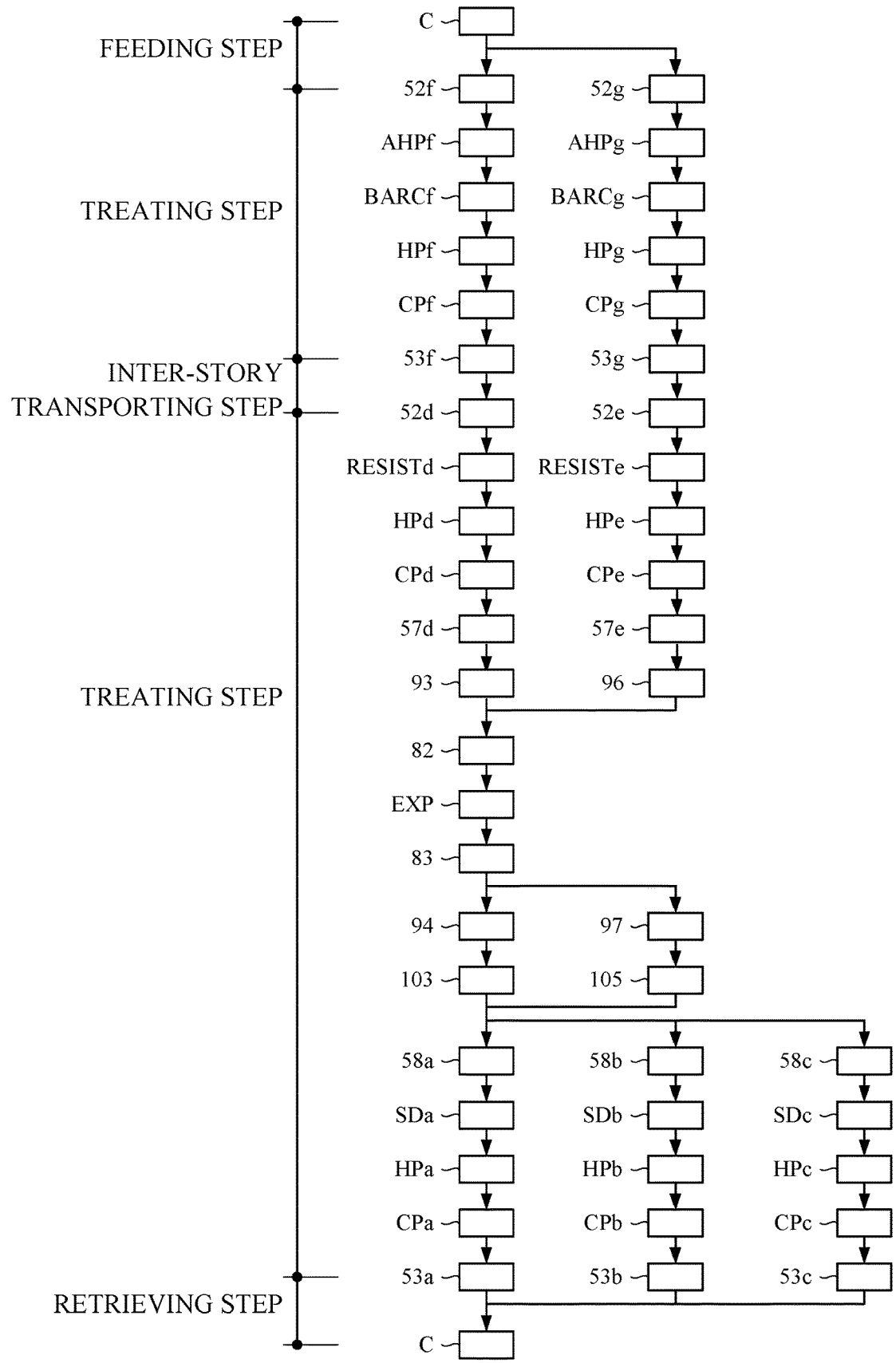
FIG. 14 is a view schematically showing elements of the substrate treating apparatus passed through by substrates.

FIG. 14 is a view schematically showing the elements (e.g. the treating units) of the substrate treating apparatus 1 passed through by wafers W. In FIG. 14, for expediency, "a" to "g" are affixed to the signs of the elements of the first to seventh stories 33a-33g. The example of operation of the substrate treating apparatus 1 includes a feeding step, a treating step, an inter-story transporting step, and a retrieving step.

The feeding step, treating step, inter-story transporting step, and retrieving step will be described with reference to FIGS. 11-14.

<<Feeding Step>>

The first transport mechanism 26 performs the feeding operation to transport wafers W from the carrier C to the sixth and seventh stories 33f-33g.

Specifically, the first transport mechanism 26 takes wafers W out of the carrier C placed on the carrier rack 22A, and places the wafers W on the first feed rack 52f of the sixth story 33f. The first transport mechanism 26 takes wafers W out of the carrier C placed on the carrier rack 22A, and places the wafers W on the first feed rack 52g of the seventh story 33g.

<<Treating Step>>

The first treatment (treatment including antireflection film forming treatment) is performed on the wafers W on the sixth story 33f.

Specifically, the main transport mechanism 36f of the sixth story 33f takes the wafers W from the first feed rack 52f, and transports the wafers W to the treating section 41 of the sixth story 33f. The main transport mechanism 36f transports the wafers W to the hydrophobizing units AHPf, antireflection film coating units BARCf, heating units HPf, and cooling units CPf in this order, for example. The treating section 41 of the sixth story 33f performs the first treatment on the wafers W. The treating section 41 of the sixth story 33*f* gives the wafers W the hydrophobizing treatment, antireflection film forming treatment, heating treatment, and cooling treatment in this order, for example. The main transport mechanism 36*f* places, on the first return rack 53*f* of the sixth story 33*f*, the wafers W having received the first treatment on the sixth story 33*f*.

The main transport mechanism 36*f*, when transporting the wafers W to the hydrophobizing units AHPf, may replace treated wafers W with the wafers W to be treated in the hydrophobizing units AHPf. For example, the main transport mechanism 36*f*, while holding with the holder 37*f* the wafer W to be treated, may take the treated wafer W out of the hydrophobizing units AHPf by using the holder 37*g*. Then, the main transport mechanism 36*f* may, by using the holder 37*g*, load the wafer W to be treated into the hydrophobizing unit AHPf. Similarly, the main transport mechanism 36*f*, when transporting the wafers W to the other units BARCf, HPf and CPf also, may replace treated wafers W with the wafers W to be treated.

The first treatment is performed on the wafers W on the seventh story 33*g* similarly to the sixth story 33*f*. Specifically, the main transport mechanism 36*g* of the seventh story 33*g* takes the wafers W from the first feed rack 52*g*, and transports the wafers W to the treating section 41 (specifically, the hydrophobizing units AHPg, antireflection film coating units BARCg, heating units HPg, and cooling units CPg) of the seventh story 33*g*. The treating section 41 of the seventh story 33*g* performs the first treatment on the wafers W. The main transport mechanism 36*g* places, on the first return rack 53*g* of the seventh story 33*g*, the wafers W having received the first treatment on the seventh story 33*g*.

<<Story-to-Story Transporting Step>>

The first transport mechanism 26 performs the inter-story transporting operation to transport the wafers W from the sixth and seventh stories 33*f*-33*g* to the fourth and fifth stories 33*d*-33*e*.

Specifically, the first transport mechanism 26 takes the wafers W from the first return rack 53*f*, and places the wafers W on the first feed rack 52*d* of the fourth story 33*d*. The first transport mechanism 26 takes the wafers W from the first return rack 53*g*, and places the wafers W on the first feed rack 52*e* of the fifth story 33*e*.

<<Treating Step>>

The second treatment (treatment including resist film forming treatment) is performed on the wafers W on the fourth story 33*d*.

Specifically, the main transport mechanism 36*d* of the fourth story 33*d* takes the wafers W from the first feed rack 52*d*, and transports the wafers W to the treating section 41 of the fourth story 33*d*. The main transport mechanism 36*d* transports the wafers W to the resist film coating units RESISTd, heating units HPd, and cooling units CPd in this order, for example. The treating section 41 of the fourth story 33*d* performs the second treatment on the wafers W. The treating section 41 of the fourth story 33*d* gives the wafers W the resist film forming treatment, heating treatment, and cooling treatment in this order, for example. The main transport mechanism 36*d* places, on the second feed rack 57*d* of the fourth story 33*d*, the wafers W having received the second treatment on the fourth story 33*d*.

The second treatment is performed on the wafers W on the fifth story 33*e* similarly to the fourth story 33*d*. Specifically, the main transport mechanism 36*e* of the fifth story 33*e* takes the wafers W from the first feed rack 52*e*, and transports the wafers W to the treating section 41 (specifically, the resist film coating units RESISTe, heating units HPe, and cooling units CPe) of the fifth story 33*e*. The treating section 41 of the fifth story 33*e* performs the second treatment on the wafer W. The main transport mechanism 36*e* places, on the second feed rack 57*e* of the fifth story 33*e*, the wafers W having received the second treatment on the fifth story 33*e*.

The transport device 73 of the interface division 71 transports the wafers W from the second feed racks 57*d* and 57*e* to the exposing machine EXP via the pre-exposure cleaning units 93 and 96.

Specifically, the first transport mechanism 74 transports the wafers W from the second feed rack 57*d* to the pre-exposure cleaning units 93. The pre-exposure cleaning units 93 perform cleaning treatment on the wafers W. The first transport mechanism 74 transports the wafers W from the pre-exposure cleaning units 93 to the feed racks 82 (i.e. the cooling rack units 84). The second transport mechanism 75 transports the wafers W from the second feed racks 57*e* to the pre-exposure cleaning units 96. The pre-exposure cleaning units 96 perform cleaning treatment on the wafers W. The second transport mechanism 75 transports the wafers W from the pre-exposure cleaning units 96 to the feed rack 82. The third transport mechanism 76 transports the wafers W from the feed racks 82 to the exposing machine EXP. The exposing machine EXP performs exposing treatment on the wafers W.

The transport device 73 transports wafers W from the exposing machine EXP to the second return racks 58*a*-58*c* via the post-exposure cleaning units 94 and 97 and post-exposure heating units 103 and 105.

Specifically, the third transport mechanism 76 transports the wafers W from the exposing machine EXP to the return racks 83 (i.e. the rack units 85). The first transport mechanism 74 transports the wafers W from the return racks 83 to the post-exposure cleaning units 94. The post-exposure cleaning units 94 perform cleaning treatment on the wafers W. The first transport mechanism 74 transports the wafers W from the post-exposure cleaning units 94 to the post-exposure heating units 103. The post-exposure heating units 103 perform post-exposure heating treatment on the wafers W. The first transport mechanism 74 transports the wafers W from the post-exposure heating units 103 to the second return racks 58*a*-58*c* of the first to third stories 33*a*-33*c*. Similarly, the second transport mechanism 75 transports the wafers W from the return racks 83 to the post-exposure cleaning units 97. The post-exposure cleaning units 97 perform cleaning treatment on the wafers W. The second transport mechanism 75 transports the wafers W from the post-exposure cleaning units 97 to the post-exposure heating units 105. The post-exposure heating units 105 perform post-exposure heating treatment on the wafers W. The second transport mechanism 75 transports the wafers W from the post-exposure heating units 105 to the second return racks 58*a*-58*c* of the first to third stories 33*a*-33*c*.

The transport device 73 of the interface division 71 does not perform the inter-story transporting operation. Here, the inter-story transporting operation is for the transport device 73 an operation to transport wafers W between second racks 56 provided for different stories 33, without passing through at least any one of the cleaning section 91, heat-treating section 101 and exposing machine EXP.

The third treatment (treatment including developing treatment) is performed on the wafers W on the first story 33*a*.

Specifically, the main transport mechanism 36*a* of the first story 33*a* takes the wafers W from the second return rack 58*a*, and transports the wafers W to the treating section 41 of the first story 33*a*. The main transport mechanism 36*a* transports the wafers W to the developing units SDa, heating units HPa, and cooling units CPa in this order, for example. The treating section 41 of the first story 33*a* performs the third treatment on the wafer W. The treating section 41 of the first story 33*a* gives the wafers W developing treatment, heating treatment, and cooling treatment in this order, for example. The main transport mechanism 36*a* places, on the first return rack 53*a* of the first story 33*a*, the wafers W having received the third treatment on the first story 33*a*.

The third treatment is performed on the wafers W on the second and third stories 33*b*-33*c* similarly to the first story 33*a*. Specifically, the main transport mechanism 36*b* of the second story 33*b* transports the wafers W from the second return rack 58*b* to the treating section 41 (specifically, the developing units SDb, heating units HPb, and cooling units CPb). The main transport mechanism 36*c* of the third story 33*c* transports the wafers W from the second return rack 58*c* to the treating section 41 (specifically, the developing units SDc, heating units HPc, and cooling units CPc). The treating sections 41 of the second and third stories 33*b*-33*c* perform the third treatment on the wafers W, respectively. The main transport mechanism 36*b* places, on the first return rack 53*b* of the second story 33*b*, the wafers W having received the third treatment on the second story 33*b*. The main transport mechanism 36*c* places, on the first return rack 53*c* of the third story 33*c*, the wafers W having received the third treatment on the third story 33*c*.

<<Retrieving Step>>

The second transport mechanism 27 performs the retrieving operation to transport the wafers W from the first to third stories 33*a*-33*c* to the carrier C.

Specifically, the second transport mechanism 27 takes the wafers W from the first return rack 53*a*, and loads the wafers W into the carrier C placed on the carrier rack 22B. Similarly, the second transport mechanism 27 transports the wafers W from the first return rack 53*b* to the carrier C placed on the carrier rack 22B. The second transport mechanism 27 transports the wafers W from the first return rack 53*c* to the carrier C placed on the carrier rack 22B.

<Operation of the Transport Device 25 of the Indexer Division 21 Relating to the First Rack 51>

A detailed example of operation of the transport device 25 relating to the first rack 51 will be described with reference to FIGS. 8A and 8B.

The first rack 51 provided for one story 33 includes eight rack units 54 as described hereinbefore. For expediency, the eight rack units 54 provided for one story 33 will be called rack units 54*a*, 54*b*, . . . , 54*h*. The rack units 54*a*-54*d* are assumed to belong to the first return rack 53. The rack units 54*e*-54*h* are assumed to belong to the first feed rack 52.

Reference is made to FIG. 8A. The transport device 25 places two wafers W on the first rack 51 at the same time. Specifically, the first transport mechanism 26, with the holders 28*d* and 28*e* holding two wafers W, accesses the first rack 51. Then, the first transport mechanism 26 places the two wafers W on the first feed rack 52 at the same time. Thus, by accessing the first feed rack 52 once, the first transport mechanism 26 can place the two wafers W on the first feed rack 52. Consequently, the first transport mechanism 26 can transport the wafers W efficiently.

As described hereinbefore, the first feed rack 52 is constructed capable of receiving four wafers W at the same time. Therefore, after the first transport mechanism 26 places the two wafers W on the first feed rack 52, the first transport mechanism 26 can place another two wafers W on the first feed rack 52.

For example, the first transport mechanism 26 places a first and a second wafers W on the rack units 54*e* and 54*f* at the same time. Subsequently, the first transport mechanism 26 can place a third and a fourth wafers W on the rack units 54*g* and 54*h* at the same time.

Further, while the first transport mechanism 26 is placing the third and fourth wafers W on the rack units 54*g* and 54*h*, the main transport mechanism 36 can take the first and second wafers W from the rack units 54*e* and 54*f*. More particularly, after the first transport mechanism 26 places the first and second wafers W on the rack units 54*e* and 54*f*, and before the first transport mechanism 26 places a fifth and a sixth wafers W on the rack units 54*e* and 54*f*, the main transport mechanism 36 can take the first and second wafers W from the rack units 54*e* and 54*f*. Consequently, after the first transport mechanism 26 places the third and fourth wafers W on the rack units 54*g* and 54*h*, the first transport mechanism 26 can place the fifth and sixth wafers W on the rack units 54*e* and 54*f* at the same time. Thus, the first transport mechanism 26 can smoothly repeat the operation to place wafers W on the first feed rack 52.

In the above operation, the first transport mechanism 26 and main transport mechanism 36 may access the first feed rack 52 at the same time. For example, when the first transport mechanism 26 accesses the rack units 54*g* and 54*h*, the main transport mechanism 36 may access the rack units 54*e* and 54*f*. The rack units 54*g* and 54*h* are in a position different from a position of the rack units 54*e* and 54*f*. The rack units 54*g* and 54*h* are located above the rack units 54*e* and 54*f*. Thus, there is no possibility of the first transport mechanism 26 and main transport mechanism 36 interfering with each other. Even when the first transport mechanism 26 and main transport mechanism 36 access the first feed rack 52 at the same time, an interference between the first transport mechanism 26 and main transport mechanism 36 can be avoided easily. Thus, the first transport mechanism 26 and main transport mechanism 36 are permitted to access the first feed rack 52 at the same time. Consequently, when one of the first transport mechanism 26 and main transport mechanism 36 accesses the first feed rack 52, the other does not need to stand by. This can further increase the efficiency of the first transport mechanism 26 in transporting the wafers W. Similarly, the efficiency of the main transport mechanism 36 in transporting the wafers W can be further increased.

Thus, even when the first transport mechanism 26 places two wafers W on the first feed rack 52 at the same time in one operation, the first transport mechanism 26 can smoothly repeat the operation to place the wafers W on the first feed rack 52.

The operation of the transport device 25 to place wafers W on the first feed rack 52 is included in the feeding operation noted hereinbefore. The operation of the transport device 25 to place wafers W on the first feed rack 52 is also included in the inter-story transporting operation noted hereinbefore.

Reference is made to FIG. 8B. The transport device 25 takes two wafers W from the first rack 51 at the same time. Specifically, the first transport mechanism 26 accesses the first rack 51. Then, the first transport mechanism 26, using the holders 28*d* and 28*e*, takes the two wafers W from the first return rack 53 at the same time. Thus, by accessing the first return rack 53 once, the first transport mechanism 26 can take the two wafers W from the first return rack 53. Consequently, the first transport mechanism 26 can transport the wafers W efficiently.

As described hereinbefore, the first return rack 53 is constructed capable of receiving four wafers W at the same time. Therefore, after the first transport mechanism 26 takes the two wafers W from the first return rack 53, the first transport mechanism 26 can take another two wafers W from the first return rack 53.

For example, the first transport mechanism 26 takes a first and a second wafers W from the rack units 54a and 54b at the same time. Subsequently, the first transport mechanism 26 can take a third and a fourth wafers W from the rack units 54c and 54d at the same time.

Further, while the first transport mechanism 26 is taking the third and fourth wafers W from the rack units 54c and 54d, the main transport mechanism 36 can place a fifth and a sixth wafers W on the rack units 54a and 54b. More particularly, after the first transport mechanism 26 takes the first and second wafers W from the rack units 54a and 54b, and before the first transport mechanism 26 accesses the rack units 54a and 54b again, the main transport mechanism 36 can place the fifth and sixth wafers W on the rack units 54a and 54b. Consequently, after the first transport mechanism 26 takes the third and fourth wafers W from the rack units 54c and 54d, the first transport mechanism 26 can take the fifth and sixth wafers W from the rack units 54a and 54b at the same time. Thus, the first transport mechanism 26 can smoothly repeat the operation to take the wafers W from the first return rack 53.

In the above operation, the first transport mechanism 26 and main transport mechanism 36 may access the first return rack 53 at the same time. For example, when the first transport mechanism 26 accesses the rack units 54c and 54d, the main transport mechanism 36 may access the rack units 54a and 54b. The rack units 54c and 54d are in a position different from a position of the rack units 54a and 54b. Thus, there is no possibility of the first transport mechanism 26 and main transport mechanism 36 interfering with each other. Even when the first transport mechanism 26 and main transport mechanism 36 access the first return rack 53 at the same time, an interference between the first transport mechanism 26 and main transport mechanism 36 can be avoided easily. Thus, the first transport mechanism 26 and main transport mechanism 36 are permitted to access the first return rack 53 at the same time. Consequently, when one of the first transport mechanism 26 and main transport mechanism 36 accesses the first return rack 53, the other does not need to stand by. This can further increase the efficiency of the first transport mechanism 26 in transporting the wafers W. Similarly, the efficiency of the main transport mechanism 36 in transporting the wafers W can be further increased.

Thus, even when the first transport mechanism 26 takes two wafers W from the first return rack 53 at the same time in one operation, the first transport mechanism 26 can smoothly repeat the operation to take the wafers W from the first return rack 53.

Although not shown, the second transport mechanism 27 also takes two wafers W from the first return rack 53 at the same time. Since four wafers W can be placed on the first return rack 53, the second transport mechanism 27 can smoothly repeat the operation to take the wafers W from the first return rack 53. Further, even when the second transport mechanism 27 and main transport mechanism 36 access the first return rack 53 at the same time, an interference between the second transport mechanism 27 and main transport mechanism 36 can be avoided easily.

The operation of the transport device 25 for taking wafers W from the first return rack 53 is included in the inter-story transporting operation and retrieving operation noted hereinbefore.

In the feeding operation and retrieving operation, the transport device 25 accesses the first rack 51. However, in the feeding operation, the transport device 25 accesses the first feed rack 52, and does not access the first return rack 53. In the retrieving operation, the transport device 25 accesses the first return rack 53, and does not access the first feed rack 52. The first feed rack 52 is located in a position different from the position of the first return rack 53. Therefore, the access made to the first feed rack 52 by the transport device 25 in the feeding operation does not interfere with the access made to the first return rack 53 by the transport device 25 in the retrieving operation.

In the feeding operation and inter-story transporting operation, the transport device 25 accesses the first feed rack 52. However, the first feed rack 52 to which the transport device 25 accesses in the feeding operation is different in story 33 from the first feed rack 52 to which the transport device 25 accesses in the inter-story transporting operation. For example, in the feeding operation, the transport device 25 accesses the first feed racks 52f and 52g, and does not access the first feed racks 52d and 52e. In the inter-story transporting operation, the transport device 25 accesses the first feed racks 52d and 52e, and does not access first feed racks 52f and 52g. Therefore, the access made to the first feed rack 52 by the transport device 25 in the feeding operation does not interfere with the access made to the first feed rack 52 by the transport device 25 in the inter-story transporting operation.

In the inter-story transporting operation and retrieving operation, the transport device 25 accesses the first return rack 53. However, the first return rack 53 which the transport device 25 accesses in the inter-story transporting operation is different in story from the first return rack 53 which the transport device 25 accesses in the retrieving operation. For example, in the inter-story transporting operation, the transport device 25 accesses the first return racks 53f and 53g, and does not access the first return rack 53a-53c. In the retrieving operation, the transport device 25 accesses the first return rack 53a-53c, and does not access first return racks 53f and 53g. Therefore, the access made to the first return rack 53 by the transport device 25 in the inter-story transporting operation does not interfere with the access made to the first return rack 53 by the transport device 25 in the retrieving operation.

<Operation of Stocker Division 11 and Indexer Division 12>

FIGS. 15A-15D are views schematically showing operations of the stocker division 11 and indexer division 21. FIGS. 15A-15D show the carrier racks 22A1 and 22A2 in positions different from the positions in FIG. 1.

The second transport mechanism 27 does not perform the feeding operation. Only the first transport mechanism 26 performs the feeding operation. The first transport mechanism 26 can access carriers C placed on the carrier racks 22A, and cannot access carriers C placed on the carrier racks 22B. The transport device 25 therefore takes wafers W only out of the carriers C placed on the carrier racks 22A, and does not take wafers W out of the carriers C placed on the carrier racks 22B. Thus, the carrier racks 22B are omitted from FIGS. 15A-15D.

Figure 15A:
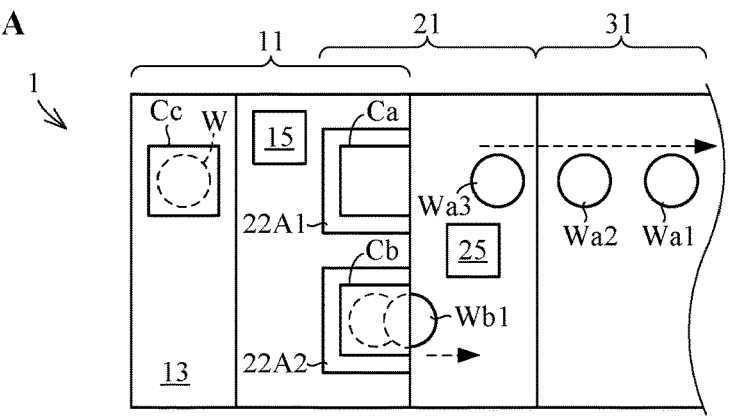
FIGS. 15A-15D are side views of the first rack, the first transport mechanism of the indexer division, and a main transport mechanism.

Reference is made to FIG. 15A. A carrier Ca is placed on the carrier rack 22A1. Since the transport device 25 (specifically the first transport mechanism 26) has already taken all wafers W (e.g. wafers Wa1, Wa2, and Wa3) out of the carrier Ca, the carrier Ca is empty of wafers W. A carrier Cb is placed on the carrier rack 22A2. The carrier Cb holds wafers W to be treated. The transport device 25 is taking a wafer Wb1 out of the carrier Cb. A carrier Cc is placed on the shelf 13. The carrier Cc holds wafers W to be treated.

Figure 15B:
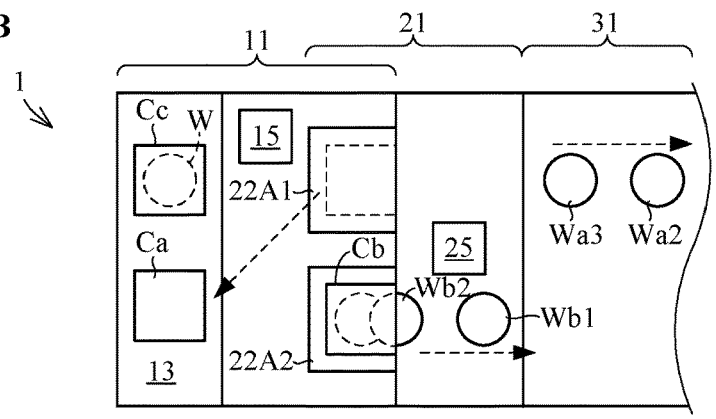

Reference is made to FIG. 15B. The carrier transport mechanism 15 transports the carrier Ca from the carrier rack 22A1 to the shelf 13. The transport device 25 is taking a wafer Wb2 out of the carrier Cb.

Figure 15C:
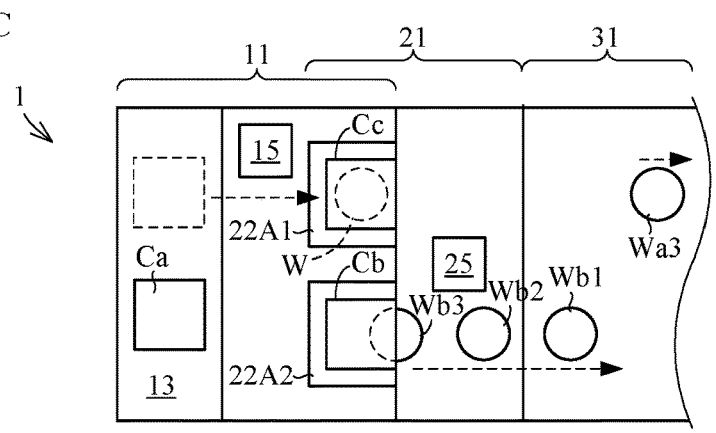

Reference is made to FIG. 15C. The carrier transport mechanism 15 transports the carrier Cc from the shelf 13 to the carrier rack 22A1. The transport device 25 is taking a wafer Wb3 out of the carrier Cb.

Figure 15D:
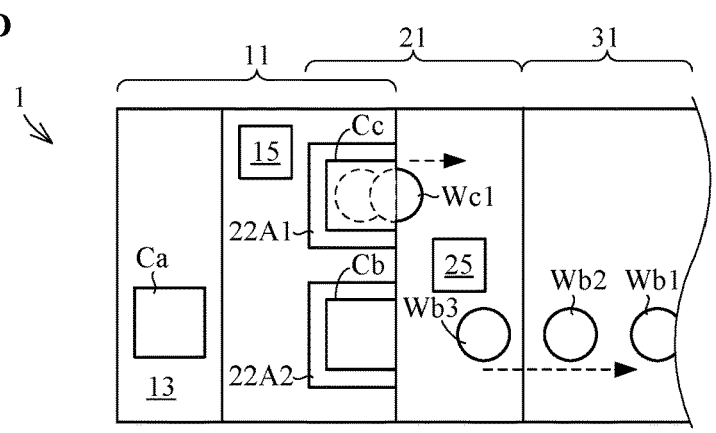

Reference is made to FIG. 15D. Since the transport device 25 has already taken all the wafers W out of the carrier Cb, the carrier Cb is empty of wafers W. The transport device 25 is taking a wafer Wc1 out of the carrier Cc.

Thus, the indexer section 21 includes two carrier racks 22A1 and 22A2. The carrier transport mechanism 15 can therefore place the carrier Cc on the carrier rack 22A1 before the transport device 25 takes all the wafers W out of the carrier Cb on the carrier rack 22A2. In other words, while the transport device 25 is taking the wafers W out of the carrier Cb, the carrier transport mechanism 15 can replace the carrier Ca with the carrier Cc on the carrier rack 22A1. The transport device 25 can therefore begin to take the wafers W out of the carrier Cc promptly after the transport device 25 takes all the wafers W out of the carrier Cb. Consequently, when the carriers C are changed, there is no possibility of lowering the efficiency of the transport device 25 in transporting the wafers W.

Figure 16A:
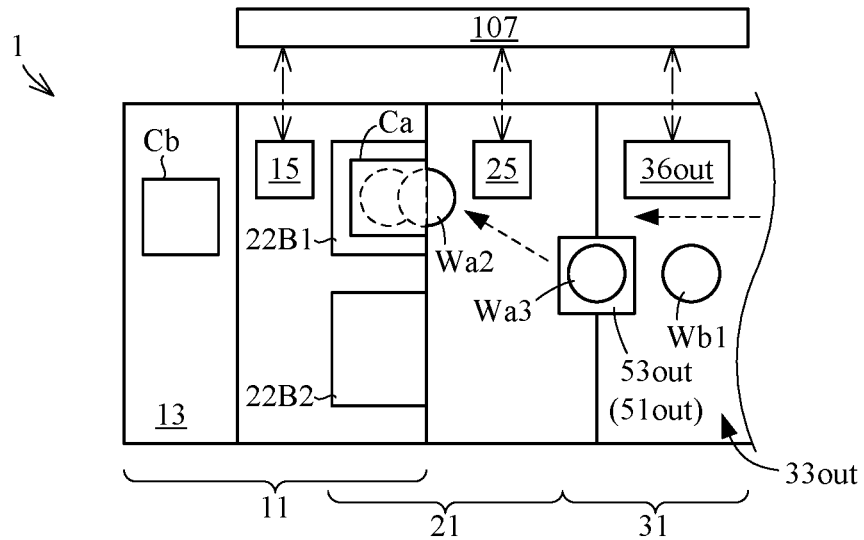
FIGS. 16A-16C are views schematically showing operations of a stocker division and the indexer division.
Figure 16B:
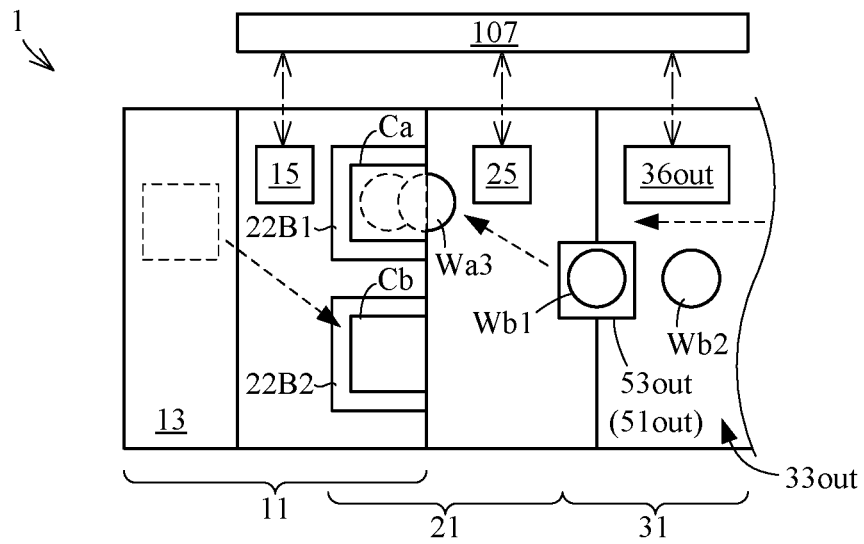
Figure 16C:
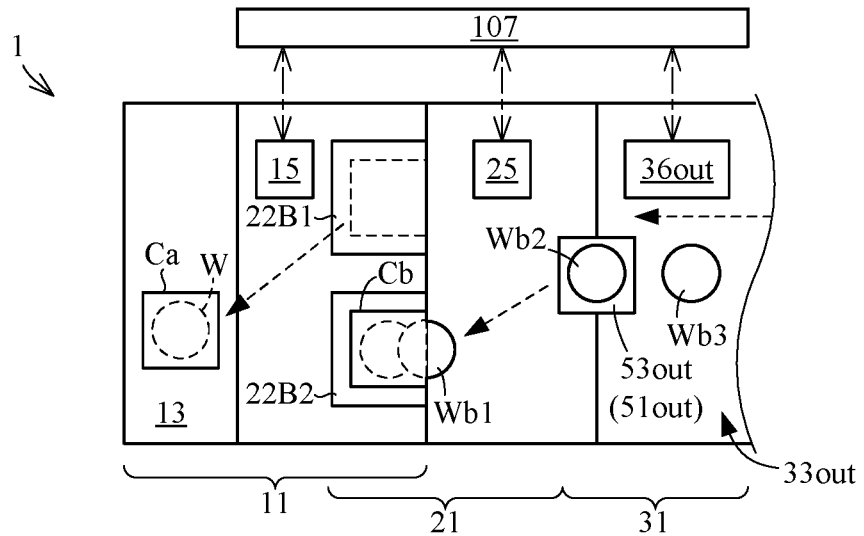

FIGS. 16A-16C are views schematically showing operations of the stocker division 11 and indexer division 21. FIGS. 16A-16C show the carrier racks 22B1 and 22B2 in positions different from the positions in FIG. 1.

The first transport mechanism 26 does not perform the retrieving operation. Only the second transport mechanism 27 performs the retrieving operation. The second transport mechanism 27 can access carriers C placed on the carrier racks 22B, and cannot access carriers C placed on the carrier racks 22A. The transport device 25 therefore loads wafers W only into the carriers C placed on the carrier racks 22B, and does not load wafers W into the carriers C placed on the carrier racks 22A. Thus, the carrier racks 22A are omitted from FIGS. 16A-16C.

The retrieving operation of the second transport mechanism 27 is an operation to transport wafers W from the first to third stories 33a-33c to the carriers C. The first to third stories 33a-33c are, among the first to seventh stories 33a-33g, the last stories 33 passed by the wafers W. The first racks 51 of the first to third stories 33a-33c correspond to the last locations where the wafers W are placed before the wafers W are loaded into the carriers C.

The first to third stories 33a-33c are an example of the final stories in this invention.

In the following description, the first to third stories 33a-33c, when not distinguished, will be written story 33 out. The main transport mechanisms 36a-36c of the first to third stories 33a-33c, when not distinguished, will be written main transport mechanism 36 out. The first racks 51a-51c of the first to third stories 33a-33c, when not distinguished, will be written first rack 51 out. The first return racks 53a-53c of the first to third stories 33a-33c, when not distinguished will be written first return rack 53 out.

Reference is made to FIG. 16A. The carrier Ca is placed on the carrier rack 22B1. No carrier C is placed on the carrier rack 22B2. The carrier Cb is placed on the shelf 13. The transport device 25 is loading a wafer W into the carrier Ca. Specifically, the second transport mechanism 27 transports a wafer Wa2 from the first rack 51 out (specifically, the first return rack 53 out) of the story 33 out to the carrier Ca. The main transport mechanism 36 out of the story 33 out places a wafer Wa3 on the first rack 51 out (specifically, the first return rack 53 out). The main transport mechanism 36 out transports a wafer Wb1 on the story 33 out. The wafer Wb1 is not yet placed on the first rack 51 out (specifically, the first return rack 53 out).

Here, the wafer Wa3 is a wafer W to be loaded into the carrier Ca. The wafer Wa3 is a wafer W taken out of the carrier Ca by the transport device 25, for example. The wafer Wb1 is a wafer W to be loaded into the carrier Cb. Wafers Wb2 and Wb3, described hereinafter, are wafers W also to be loaded into the carrier Cb. The wafers Wb1, Wb2 and Wb3 are wafers W taken out of the carrier Cb by the transport device 25, for example.

Reference is made to FIG. 16B. The transport device 25 is loading the wafer Wa3 into the carrier Ca. The main transport mechanism 36 out places the wafer Wb1 on the first rack 51 out. The main transport mechanism 36 out transports the wafer Wb2 on the story 33 out.

The controller 107 detects a delivery operation of the main transport mechanism 36 out of the story 33 out. The delivery operation of the main transport mechanism 36 out is an operation of the main transport mechanism 36 out to place wafers W on the first rack 51 out. The delivery operation of the main transport mechanism 36 out may be put in another way as a delivery operation on the story 33 out.

The controller 107 determines timing of operation of the carrier transport mechanism 15 based on detection results of the delivery operation. The operation of the carrier transport mechanism 15 is an operation of the carrier transport mechanism 15 to transport the carrier Cb from the shelf 13 to the carrier rack 22B2, for example. The carrier transport mechanism 15 operates under control of the controller 107. The control exercised by the controller 107 on the carrier transport mechanism 15 is set out below by way of example.

The controller 107 counts the number of times of the delivery operation of the main transport mechanism 36 out. The controller 107 determines whether the number of times of the delivery operation of the main transport mechanism 36 out has reached a certain value. The certain value is determined beforehand. The predetermined value is set, for example, before the wafer Wb1 is actually placed on the first rack 51 out. The predetermined value is set by the controller 17 using information available for reference (e.g. schedule information).

Here, the schedule information is information about a treatment schedule and a transport schedule of the wafers W in the substrate treating apparatus 1. The schedule information includes information about a relationship between future times and positions of the wafers W. The schedule information may also include information showing when and where the wafer Wb1 is, for example. The schedule information may also include information about a scheduled time when the wafer Wb1 is placed on the first rack 51 out, for example. Even if the schedule information does not include information directly showing the scheduled time, for example, the controller 107 may be able to estimate the above scheduled time based on the schedule information.

Further, the schedule information includes information about an order of transporting the wafers W. For example, the schedule information may include information showing that the wafers Wa2, Wa3, Wb1, Wb2, and Wb3 are placed in this order on the first rack 51 out. For example, the schedule information may include information showing that the wafer Wb1, among the wafers Wa2, Wa3, Wb1, Wb2, and Wb3, is the third wafer to be placed on the first rack 51 out. Even if the schedule information does not include information directly showing the above place ("third") in the order of the wafer Wb1, for example, the controller 107 may be able to estimate the above place in the order of the wafer Wb1 based on the schedule information.

For example, when the wafer Wb1 is the third wafer W scheduled to be placed on the first rack 51 out, the above predetermined value is set to "3".

Determining whether the number of times of the delivery operation has reached the predetermined value corresponds to determining whether the wafer Wb1 is placed on the first rack 51 out. In other words, whether the number of times of the delivery operation has reached the predetermined value corresponds to determining the time when the wafer Wb1 is actually placed on the first rack 51 out.

Here, the wafer Wb1 is a wafer W scheduled to be loaded into the carrier Cb. The carrier Cb has been placed on the shelf 13. More particularly, the wafer Wb1 is the wafer W, among the wafers Wb1, Wb2, and Wb3, scheduled to be first loaded into the carrier Cb placed on the shelf 13. In other words, the wafer Wb1 is the wafer W first placed on the first rack 51 out, among the wafers Wb1, Wb2, and Wb3 scheduled to be loaded into the carrier Cb placed on the shelf 13.

Consequently, determining whether the number of times of the delivery operation has reached the predetermined value is described as follows, for example:

Determining whether the number of times of the delivery operation has reached the predetermined value corresponds to determining whether the wafer Wb1 scheduled to be first loaded into the carrier Cb placed on the shelf 13 is placed on the first rack 51 out.

Determining whether the number of times of the delivery operation has reached the predetermined value corresponds to determining whether a wafer W scheduled to be loaded into the carrier Cb placed on the shelf 13 is placed on the first rack 51 out for the first time.

Determining whether the number of times of the delivery operation has reached the predetermined value corresponds to determining the time when the wafer W scheduled to be first loaded into the carrier Cb placed on the shelf 13 is actually placed on the first rack 51 out.

Determining whether the number of times of the delivery operation has reached the predetermined value corresponds to determining the time when the wafer W scheduled to be loaded into the carrier Cb placed on the shelf 13 is actually placed on the first rack 51 out for the first time.

At a point of time when the controller 107 determines that the wafer Wb1 has been placed on the first rack 51 out, the controller 107 starts an operation of the carrier transport mechanism 15 (specifically, an operation of the carrier transport mechanism 15 to transport the carrier Cb scheduled to receive the wafer Wb1, from the shelf 13 to the carrier rack 22B2).

Under the control of the controller 107, the carrier transport mechanism 15 transports the carrier Cb from the shelf 13 to the carrier rack 22B2. The carrier Cb is placed on the carrier rack 22B2.

Reference is made to FIG. 16C. The transport device 25 loads the wafer Wb1 into the carrier Cb. The main transport mechanism 36 out places the wafer Wb2 on the first rack 51 out. The main transport mechanism 36 out transports the wafer Wb3 on the story 33 out. The carrier transport mechanism 15 transports the carrier Ca from the carrier rack 22B1 onto the shelf 13. As a result, no carrier C is present on the carrier rack 22B1.

As described above, the carrier transport mechanism 15 places the carrier Cb on the carrier rack 22B2 at an appropriate time (see FIG. 16B). Consequently, after the wafer Wb1 is placed on the first rack 51 out, the transport device 25 can promptly load the wafer Wb1 into the carrier Cb (see FIG. 16C). The transport device 25, after the retrieving operation for loading the wafers W into the carrier Ca, can smoothly carry out a retrieving operation to load the wafers W into the carrier Cb.

As noted above, the controller 107, by referring to the schedule information, can acquire or estimate a scheduled time for the wafer Wb1 to be placed on the first rack 51 out. However, based on a detection result of the delivery operation, the controller 107 determines the time when the wafer Wb1 is actually placed on the first rack 51 out. Then, based on the detection result of the delivery operation, the controller 107 determines timing of operation of the carrier transport mechanism 15. The controller 107 can therefore determine the timing of operation of the carrier transport mechanism 15 with increased accuracy.

<Advantageous Effects of the First Embodiment>

The substrate treating apparatus 1 in the first embodiment includes the indexer division 21 and the plurality of stories 33. Each story 33 has the first rack 51. The indexer division 21 has the carrier racks 22A and 22B and transport device 25. The transport device 25 transports wafers W between the carriers C placed on the carrier racks 22A and 22B and the first rack 51. The transport device 25 has the first transport mechanism 26. The first transport mechanism 26 carries out a feeding operation to transport wafers W from a carrier C placed on the carrier rack 22A to the first rack 51. The main transport mechanism 36 can therefore directly take the wafers W placed on the first rack 51 by the first transport mechanism 26. Consequently, the wafers W can be efficiently transported between the first transport mechanism 26 and main transport mechanism 36. Thus, the throughput of the substrate treating apparatus 1 can be improved conveniently.

The first transport mechanism 26 further carries out an inter-story transport operation to transport wafers W between two first racks 51 provided for different stories 33. It is therefore not necessary to provide separately a transport mechanism that carries out only the inter-story transporting operation in the substrate treating apparatus 1. Consequently, the footprint (installation area) of the substrate treating apparatus 1 can be reduced conveniently.

According to the substrate treating apparatus 1 in the first embodiment, as noted above, the footprint of the substrate treating apparatus 1 can be reduced, and the throughput of the substrate treating apparatus 1 can be improved.

The treating section 41 of each of the sixth and seventh stories 33f-33g performs the first treatment on the wafers W. The treating section 41 of each of the fourth and fifth stories 33d-33e performs on the wafers W the second treatment different from the first treatment. The first transport mechanism 26 transports the wafers W between the first rack 51f of the sixth story 33f and the first rack 51d of the fourth story 33d. The first transport mechanism 26 transports the wafers W between the first rack 51g of the seventh story 33g and the first rack 51e of the fifth story 33e. Thus, the inter-story transporting operation includes transporting the wafers W between the first rack 51f and the first rack 51d. The inter-story transporting operation includes transporting the wafers W between the first rack 51g and the first rack 51e. Thus, the first treatment and second treatment can be carried out on the wafers W efficiently.

The first treatment includes a first pre-exposure treatment (specifically, antireflection film forming treatment). The second treatment includes a second pre-exposure treatment (specifically, resist film forming treatment). The second pre-exposure treatment is different from the first pre-exposure treatment. The first pre-exposure treatment and second pre-exposure treatment can therefore be efficiently carried out on the wafers W.

The first treatment includes a first solution treatment (specifically, antireflection film forming treatment). The second treatment includes a second solution treatment (specifically, resist film forming treatment). The second solution treatment is different from the first solution treatment. The first solution treatment and second solution treatment can therefore be efficiently carried out on the wafers W.

The first treatment includes the antireflection film forming treatment, and does not include the resist film forming treatment. The second treatment includes the resist film forming treatment, and does not include the antireflection film forming treatment. The antireflection film forming treatment and resist film forming treatment can therefore be efficiently carried out on the wafers W.

The first transport mechanism 26 transports wafers W from the first racks 51f-51g to the first racks 51d-51e. Thus, the inter-story transport operation includes transporting the wafers W from the first racks 51f-51g to the first racks 51d-51e. The wafers W can be transported from the sixth and seventh stories 33f-33g to the fourth and fifth stories 33d-33e. Consequently, the antireflection film forming treatment can be performed on the wafers W, and thereafter the resist film forming treatment can be performed on the wafers.

The transport device 25 transports wafers W from a carrier C placed on the carrier rack 22A to the first racks 51f-51g. Thus, the feeding operation includes transporting wafers W from the carrier C placed on the carrier rack 22A to the first racks 51f-51g. The wafers W can be efficiently transported from the carrier C placed on the carrier rack 22A to the stories 33 (specifically, the sixth and seventh stories 33f-33g) for performing the first treatment.

The number of stories 33 for performing the first treatment is two. Thus, the first treatment can be performed on the wafers W on the two stories 33. Consequently, the throughput of the substrate treating apparatus 1 can be improved conveniently.

The number of stories 33 for performing the second treatment is two. Thus, the second treatment can be performed on the wafers W on the two stories 33. Consequently, the throughput of the substrate treating apparatus 1 can be improved conveniently.

Each of the treating sections 41 of the first to third stories 33a-33c performs the third treatment on the wafers W. The third treatment includes developing treatment. Consequently, the developing treatment can efficiently be carried out on the wafers W.

The transport device 25 transports the wafers W from the first racks 51a-51c to a carrier C placed on the carrier rack 22B. Thus, the retrieving operation includes transporting the wafers W from the first racks 51a-51c to the carrier C placed on the carrier rack 22B. Consequently, the wafers W on which the developing treatment has been performed can be efficiently transported to the carrier C.

The number of stories 33 for performing the third treatment is three. The third treatment can therefore be performed on the wafers W on the three stories 33. Consequently, the throughput of the substrate treating apparatus 1 can be improved conveniently.

Each story 33 has the second rack 56. The substrate treating apparatus 1 includes the interface division 71. The interface division 71 has the transport device 73. The transport device 73 transports wafers W between the second racks 56 and exposing machine EXP. However, the transport device 73 does not perform the inter-story transport operation. Specifically, the transport device 73 does not transport wafers W between two second racks 56 provided for different stories 33. The transport device 73 can therefore transport the wafers W efficiently between the stories 33 and exposing machine EXP.

The interface division 71 has the cleaning section 91 and heat-treating section 101. The transport device 73 further transports wafers W to the cleaning section 91 and heat-treating section 101. The transport device 73 does not perform the inter-story transport operation as noted above. Consequently, even if the interface division 71 includes the cleaning section 91 and heat-treating section 101, an excessively heavy transport burden is inhibited from falling on the transport device 73. The transport device 73 can therefore transport the wafers W efficiently to the cleaning section 91 and heat-treating section 101. Thus, where the interface division 71 includes the cleaning section 91 and heat-treating section 101, there is a great advantage in that the transport device 73 is exempted from the inter-story transport operation.

The first rack 51 has the first feed rack 52 on which only the transport device 25 places wafers W, and the first return rack 53 on which only the main transport mechanism 36 places wafers W. Since the transport device 25 does not place wafers W on the first return rack 53, the transport operation of the transport device 25 can be simplified. The transport device 25 can therefore transport the wafers W with increased efficiency between the carrier C and stories 33. Similarly, since the main transport mechanism 36 does not place wafers W on the first feed rack 52, the transport operation of the main transport mechanism 36 can be simplified. The main transport mechanism 36 can therefore transport the wafers W with increased efficiency.

The transport device 25 places two wafers W on the first feed rack 52 at the same time. The first feed rack 52 is constructed capable of receiving at least four wafers W. The transport device 25 can therefore smoothly carry out an operation to place the wafers W on the first feed rack 52.

The transport device 25 takes two wafers W from the first return rack 53 at the same time. The first return rack 53 is constructed capable of receiving at least four wafers W. The transport device 25 can therefore smoothly carry out an operation to take the wafers W from the first return rack 53.

The transport device 25 has the second transport mechanism 27. The transport device 25 can therefore transport the wafers W with increased efficiency.

The first transport mechanism 26 performs the feeding operation. The second transport mechanism 27 performs the retrieving operation. The transport device 25 can therefore perform both the feeding operation and retrieving operation conveniently.

The first transport mechanism 26 does not perform the retrieving operation. Thus, the operation of the first transport mechanism 26 can be simplified.

The second transport mechanism 27 does not perform the feeding operation. Thus, the operation of the second transport mechanism 27 can be simplified.

The stories 33 out (specifically, the first to third stories 33a-33c) correspond to the final stories. The main transport mechanisms 36 out of the stories 33 out perform the delivery operation for placing wafers W on the first racks 51 out of the stories 33 out. The controller 107 detects the delivery operation of the main transport mechanisms 36 out of the stories 33 out. According to the detection result of the delivery operation on the stories 33 out, the controller 107 can determine times when the main transport mechanisms 36 out of the stories 33 out actually place the wafers W on the first racks 51 out.

The transport device 25 transports the wafers W from the first racks 51 out of the stories 33 out to a carrier C placed on the carrier rack 22B. Thus, the retrieving operation includes transporting the wafers W from the first racks 51 out to the carrier C placed on the carrier rack 22B. The substrate treating apparatus 1 includes the shelf 13 and carrier transport mechanism 15. The controller 107 determines timing of the operation of the carrier transport mechanism 15 based on the detection result of the delivery operation of the main transport mechanisms 36 out of the stories 33 out. The carrier transport mechanism 15 can therefore transport the carrier C to the carrier rack 22B always with appropriate timing. As a result, the transport device 25 can carry out the retrieving operation without delay. For example, there will occur no possibility of delay in the retrieving operation due to a delay in transporting the carrier C by the carrier transport mechanism 15. This can conveniently prevent lowering of efficiency of the retrieving operation by the transport device 25. Thus, the retrieving operation by the transport device 25 and the operation of transporting the carrier C by the carrier transport mechanism 15 can be linked in time conveniently.

Based on the detection result of the delivery operation of the main transport mechanisms 36 out of the stories 33 out, the controller 107 determines whether the wafers W scheduled to be loaded into the carrier C placed on the shelf 13 have been placed on the first racks 51 out. And when the controller 107 determines that the wafers W scheduled to be loaded into the carrier C placed on the shelf 13 have been placed on the first racks 51 out, the controller 107 starts operation of the carrier transport mechanism 15 to transport the carrier C from the shelf 13 to the carrier rack 22B. The carrier transport mechanism 15 can therefore place an appropriate carrier C on the carrier rack 22B with appropriate timing. For example, before the transport device 25 begins the retrieving operation for a wafer Wb1, the carrier transport mechanism 15 can reliably place the carrier Cb scheduled to receive the wafer Wb1 on the carrier rack 22B. As a result, the transport device 25 can carry out the retrieving operation without delay.

A substrate treating method in the first embodiment includes a feeding step, a treating step, an inter-story transporting step, and a retrieving step. The feeding step transports wafers W from a carrier C to at least one of the stories 33. The treating step treats the wafers W while transporting the wafers W on the story 33. The inter-story transporting step transports the wafers W between two different stories 33. The retrieving step transports the wafers W from at least one of the stories 33 to the carrier C. Since the substrate treating method includes the inter-story transporting step, each wafer W can be transported to at least two stories 33. Each wafer W can therefor be treated in at least two stories 33.

The feeding step is executed by one transport mechanism (i.e. the first transport mechanism 26). The wafers W can therefore be transported efficiently from the carrier C to a story 33. Thus, the treating step can be performed efficiently. Consequently, the throughput of substrate treatment can be improved conveniently.

The inter-story transporting step is executed by the one transport mechanism (i.e. the first transport mechanism 26) which executes the feeding step. In other words, the same transport mechanism (i.e. the first transport mechanism 26) performs the feeding step and inter-story transporting step.

It is therefore not necessary to provide separately for the substrate treating apparatus 1 a transport mechanism which transports the wafers W only between two different stories 33. Consequently, a space for executing the substrate treating method can be reduced conveniently.

The retrieving step is executed by one transport mechanism (i.e. the second transport mechanism 27). The wafers W can therefore be transported efficiently from a story 33 to the carrier C. Thus, the treating step can be performed efficiently. Consequently, the throughput of substrate treatment can be improved conveniently.

The pump chamber 61 is located in a position not overlapping the stories 33 (specifically, the transporting spaces 35 and treating sections 41) in plan view. This can conveniently prevent the length in the up-down direction Z of the treating sections 41 (that is, the height of the treating sections 41) from becoming excessively large. The length in the up-down direction Z of the treating block 31 can conveniently be prevented from becoming excessively large.

The area of the pump chamber 61 in plan view is relatively small. This can conveniently prevent the footprint of the substrate treating apparatus 1 from becoming excessively large.

Second Embodiment

A substrate treating apparatus 1 in a second embodiment will be described with reference to the drawings. Components identical to those of the first embodiment are shown with the same signs, and will not particularly be described.

Figure 17:
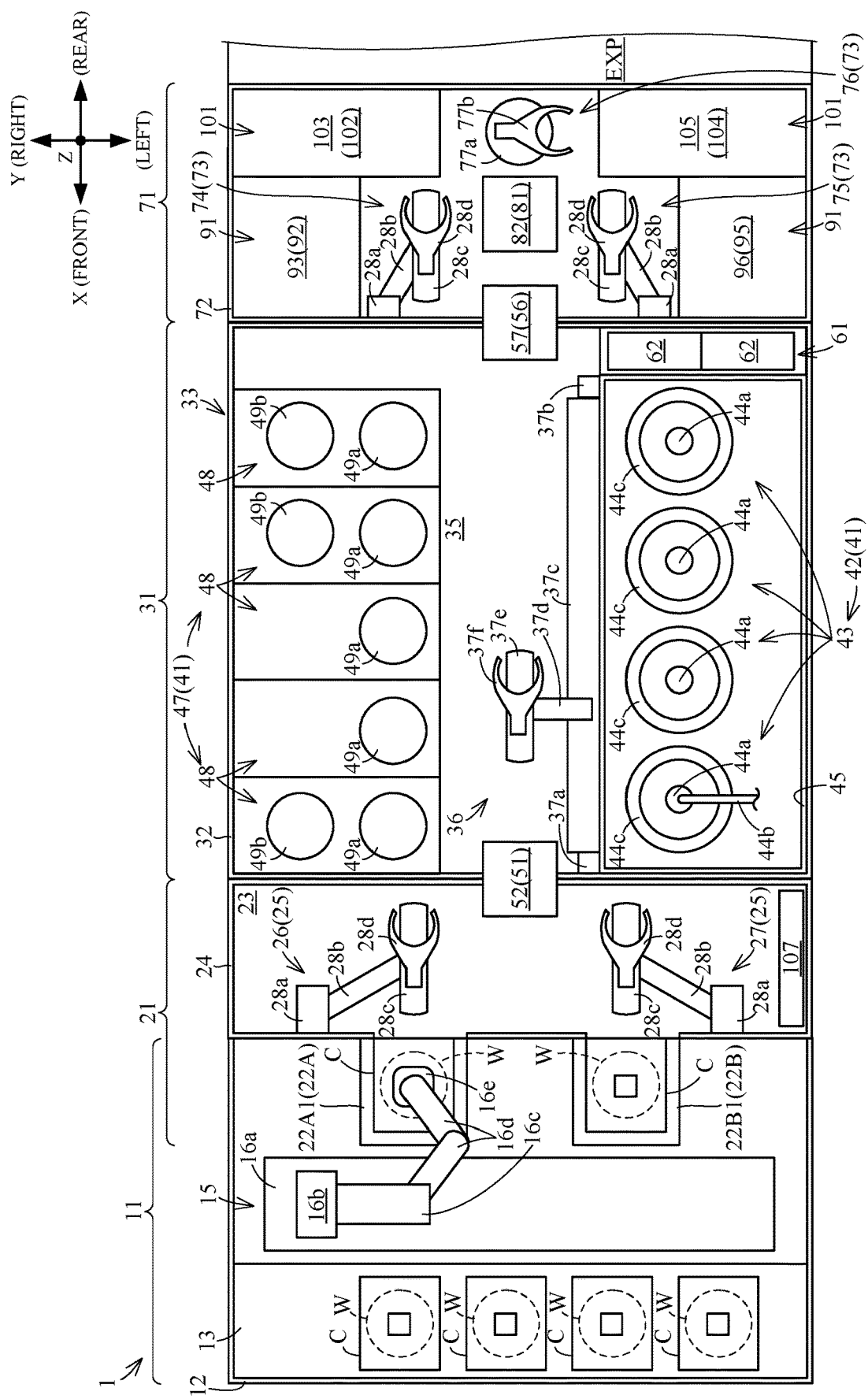
FIG. 17 is a plan view of a substrate treating apparatus in a second embodiment.
Figure 18:
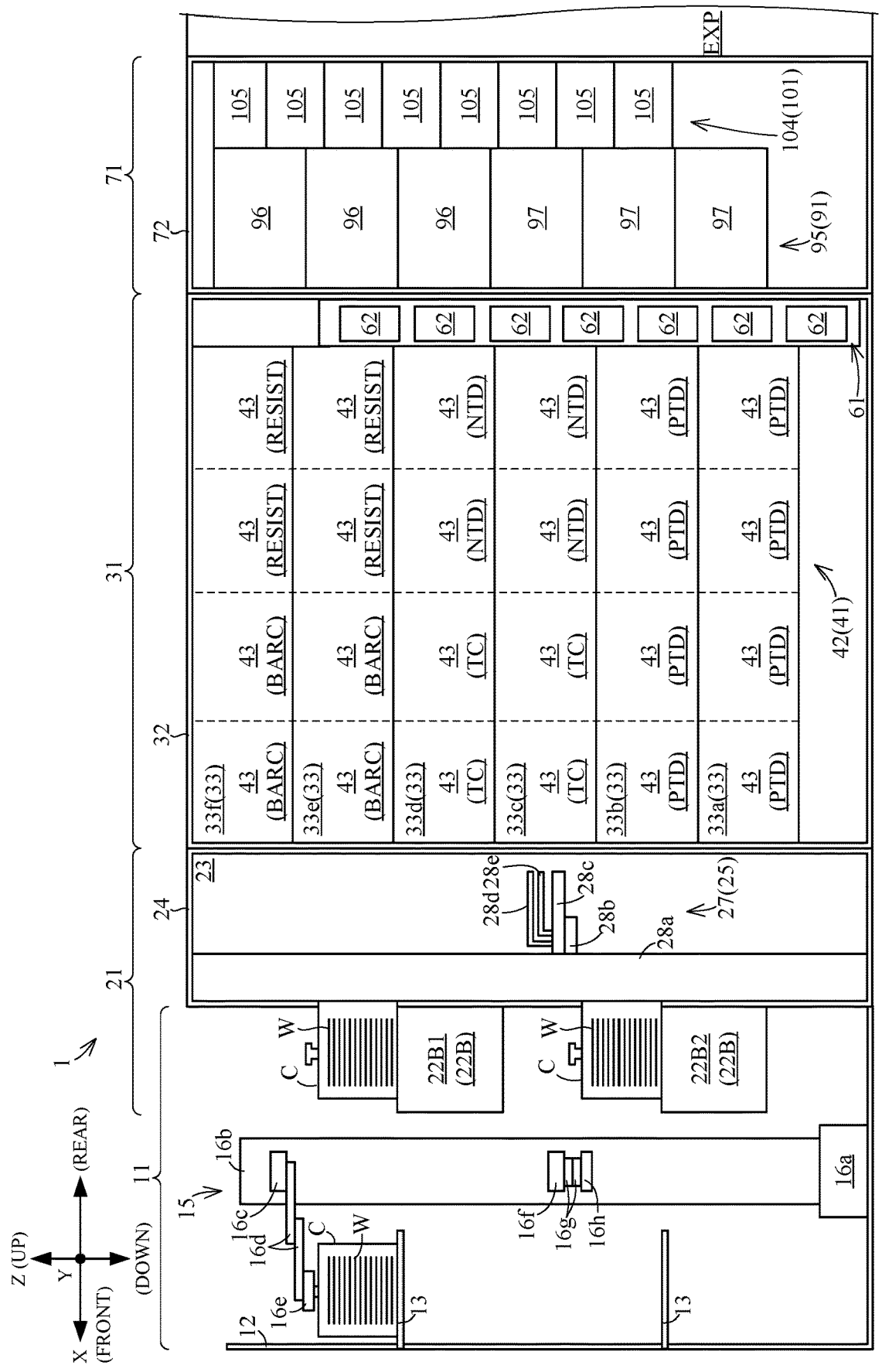
FIG. 18 is a left side view showing a construction of a left part of the substrate treating apparatus.

FIG. 17 is a plan view of the substrate treating apparatus 1 in the second embodiment. FIG. 18 is a left side view showing a construction of a left part of the substrate treating apparatus 1. The substrate treating apparatus 1 in the second embodiment is different in the construction of the treating block 31 from the substrate treating apparatus 1 in the first embodiment.

The treating block 31 has a plurality of (e.g. six) stories 33.

The solution treating section 42 on each story 33 includes a plurality of (e.g. four) solution treating units 43. The solution treating units 43 are arranged to form a row in the longitudinal direction X.

Although not shown, the heat-treating section 47 on each story 33 has a plurality of (e.g. 15) heat-treating units 48. The heat-treating units 48 are arranged in a matrix form in a side view. For example, the heat-treating units 48 are arranged in five columns in the longitudinal direction X and three rows in the up-down direction Z.

Reference is made to FIG. 18. The treatment performed on wafers W by each story 33 will be described. For expediency, the stories 33 will be called, in order from bottom to top, the first story 33*a*, second story 33*b*, third story 33*c*, fourth story 33*d*, fifth story 33*e*, and sixth story 33*f*. The first story 33*a* is the lowest story 33. The sixth story 33*f* is the highest story 33.

The treating sections 41 of the fifth and sixth stories 33*e*-33*f* perform the same treatment on wafers W. Each of the treating sections 41 of the fifth and sixth stories 33*e*-33*f* performs a first treatment on the wafers W. The first treatment includes antireflection film forming treatment and resist film forming treatment.

The treating sections 41 of the third and fourth stories 33*c*-33*d* perform the same treatment on wafers W. Each of the treating sections 41 of the third and fourth stories 33*c*-33*d* performs a second treatment and developing treatment on the wafers W. The second treatment includes protective film forming treatment for forming protective film which protects the resist film on the wafers W. The developing treatment on the third to fourth stories 33c-33d is, specifically, negative tone developing treatment.

The treating sections 41 of the first and second stories 33a-33b perform the same treatment on the wafers W. Each of the treating sections 41 of the first and second stories 33a-33b performs a third treatment on the wafers W. The third treatment includes developing treatment. The developing treatment of the third treatment is, specifically, positive tone developing treatment.

The first treatment does not include protective film forming treatment or developing treatment. The second treatment does not include antireflection film forming treatment, resist film forming treatment, or developing treatment. The developing treatment on the third and fourth stories 33c-33d does not include positive tone developing treatment. The third treatment does not include antireflection film forming treatment, resist film forming treatment, protective film forming treatment, or negative tone developing treatment. Consequently, the first treatment is different from the second treatment. The first treatment is different from the third treatment. The second treatment is different from the third treatment. The third treatment is different from the developing treatment on the third and fourth stories 33c-33d.

Each of the antireflection film forming treatment, resist film forming treatment, protective film forming treatment, negative tone developing treatment, and positive tone developing treatment belongs to solution treatment. Each of the antireflection film forming treatment, resist film formation treatment, and protective film forming treatment belongs to pre-exposure treatment. The negative tone developing treatment and protective film forming treatment belong to post-exposure treatment.

The first treatment does not include the post-exposure treatment. The second treatment does not include the post-exposure treatment. The third treatment does not include the pre-exposure treatment.

The whole of antireflection film forming treatment and resist film forming treatment is an example of the first solution treatment in this invention. The whole of antireflection film forming treatment and resist film forming treatment is an example of the first pre-exposure treatment in this invention. The protective film forming treatment is an example of the second solution treatment in this invention. The protective film forming treatment is an example of the second pre-exposure treatment in this invention.

Details of the construction of the above treating sections 41 are different between the stories 33 according to the differences in treatment between the stories 33. This aspect will be described specifically hereinafter.

The solution treating sections 42 of the fifth and sixth stories 33e-33f use an antireflection film material and a resist film material as treating solutions. Two solution treating units 43 of the fifth story 33e correspond to antireflection film coating units BARC. The remaining two solution treating units 43 of the fifth story 33e correspond to resist film coating units RESIST. Similarly, two solution treating units 43 of the sixth story 33f correspond to antireflection film coating units BARC. The remaining two solution treating units 43 of the sixth story 33f correspond to resist film coating units RESIST.

The solution treating sections 42 of the third and fourth stories 33c-33d use a protective film material and a developer for negative tone development as treating solutions. Two solution treating units 43 of the third story 33c correspond to protective film coating units TC. The remaining two solution treating units 43 of the third story 33c correspond to negative tone developing units NTD. Similarly, two solution treating units 43 of the fourth story 33d correspond to protective film coating units TC. The remaining two solution treating units 43 of the fourth story 33d correspond to negative tone developing units NTD.

The solution treating sections 42 of the first and second stories 33a-33b use a developer for positive tone development as treating solution. The solution treating units 43 of the first and second stories 33a-33b correspond to positive tone developing units PTD.

The first treatment further includes hydrophobizing treatment, heating treatment, and cooling treatment. Although not shown, the heat-treating sections 47 of the fifth and sixth stories 33e-33f include hydrophobizing units AHP, heating units HP, and cooling units CP as heat-treating units 48.

The second treatment further includes heating treatment and cooling treatment. The heat-treating sections 47 of the third and fourth stories 33c-33d include heating units HP and cooling units CP as heat-treating units 48.

The third treatment further includes heating treatment and cooling treatment. The heat-treating sections 47 of the first and second stories 33a-33b include heating units HP and cooling units CP as heat-treating units 48.

The fifth and sixth stories 33e-33f are an example of the "stories for performing the first treatment" in this invention. The third and fourth stories 33c-33d are an example of the "stories for performing the second treatment" in this invention. The first and second stories 33a-33b are an example of the "stories for performing the third treatment" in this invention.

<Operation of the Substrate Treating Apparatus>

Figure 19A:
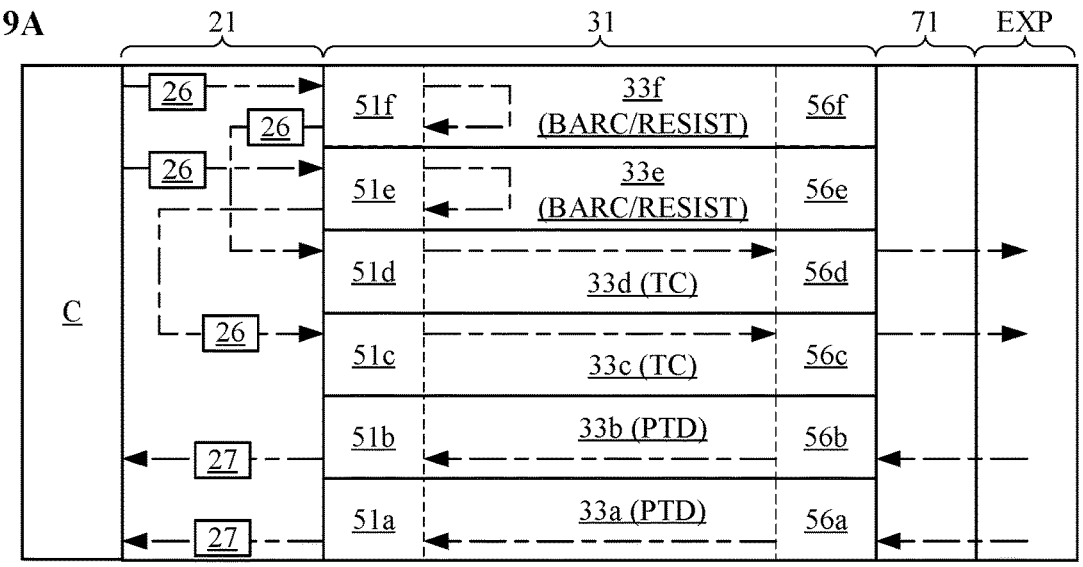
FIGS. 19A, 19B, and 19C are views schematically showing an outline of substrate transport routes.
Figure 19B:
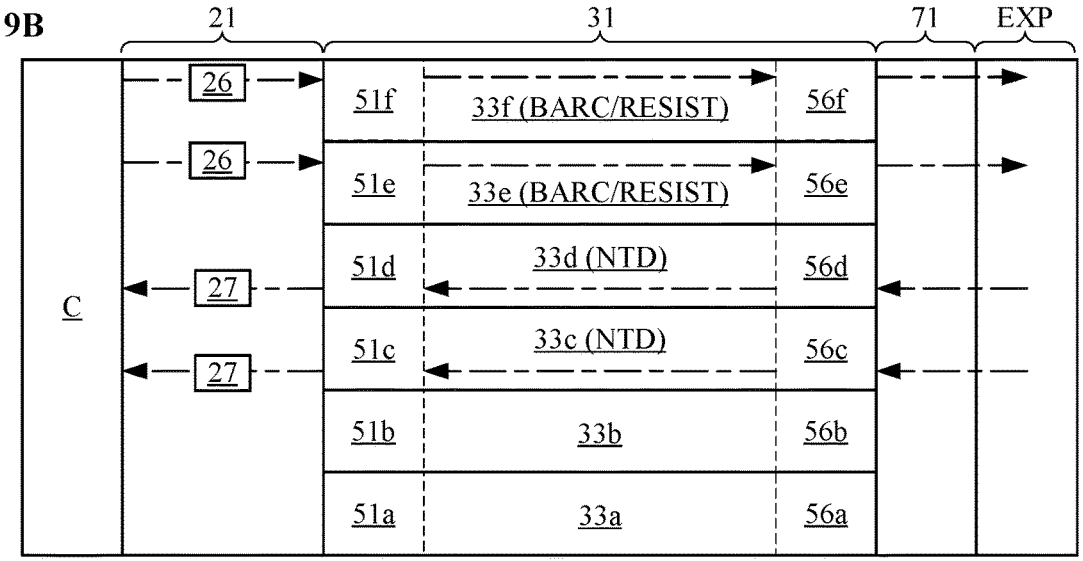
Figure 19C:
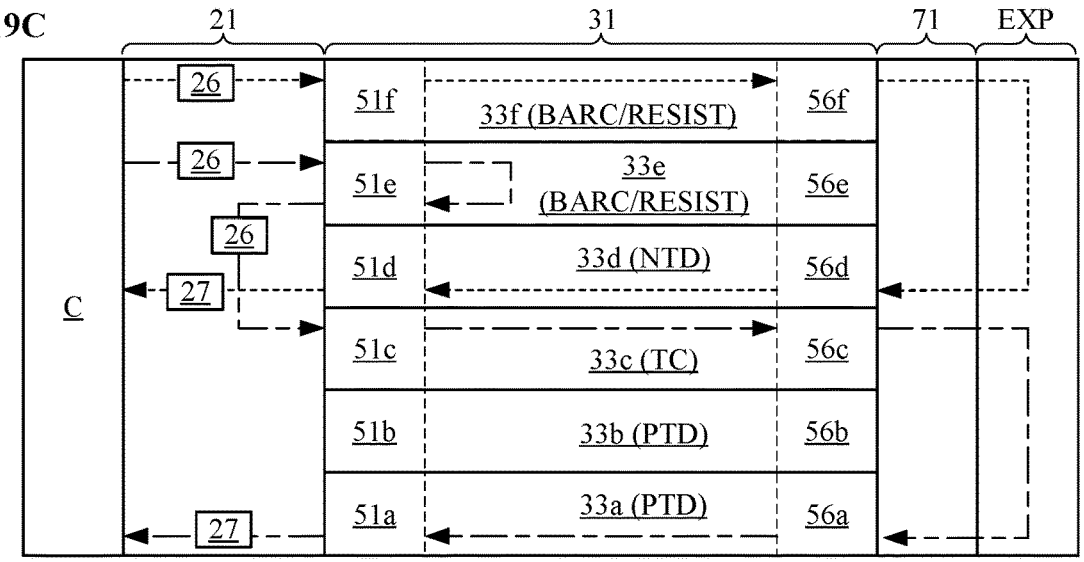

FIGS. 19A, 19B, and 19C are views schematically showing an outline of transport routes of the wafers W. The substrate treating apparatus 1 in the second embodiment has various examples of operation. Three examples of operation will be described hereinafter.

FIG. 19A shows the first example of operation. FIG. 19A schematically shows the transport routes of wafers W in chain lines. The first example of operation performs the antireflection film forming treatment, resist film forming treatment, protective film forming treatment, and positive tone developing treatment on the wafers W. In the first example of operation, each wafer W is treated on three stories 33.

FIG. 19B shows the second example of operation. FIG. 19B schematically shows the transport routes of wafers W in chain lines. The second example of operation performs the antireflection film forming treatment, resist film forming treatment, and negative tone developing treatment on the wafers W. In the second example of operation, each wafer W is treated on two stories 33.

FIG. 19C shows the third example of operation. The third example of operation performs the antireflection film forming treatment, resist film forming treatment, protective film forming treatment, and positive tone developing treatment on part of the wafers W (hereinafter called first wafers W). The first wafers W are treated on three stories 33. FIG. 19C schematically shows the transport routes of the first wafers W in chain lines. Further, the third example of operation performs the antireflection film forming treatment, resist film forming treatment, and negative tone developing treatment on the other wafers W (hereinafter called second wafers W). The second wafers W are treated on two stories 33. FIG. 19C schematically shows the transport routes of the second wafers W in broken lines.

The first to third examples of operation will be described specifically.

<<First Example of Operation>>

Reference is made to FIG. 19A. The first transport mechanism 26 performs a feeding operation. Specifically, the first transport mechanism 26 transports wafers W from the carrier C on the carrier rack 22A to the first racks 51e-51f of the fifth and sixth stories 33e-33f.

The main transport mechanisms 36e-36f of the fifth and sixth stories 33e-33f transport the wafers W from the first racks 51e-51f to the treating sections 41 of the fifth and sixth stories 33e-33f. Each of the treating sections 41 of the fifth and sixth stories 33e-33f performs the first treatment on the wafers W. Specifically, the treating sections 41 of the fifth and sixth stories 33e-33f give the wafers W treatment including the antireflection film forming treatment and resist film forming treatment. The main transport mechanisms 36e-36f place the wafers W having received the first treatment on the fifth and sixth stories 33e-33f, on the first racks 51e-51f of the fifth and sixth stories 33e-33f.

The first transport mechanism 26 performs an inter-story transporting operation. Specifically, the first transport mechanism 26 transports the wafers W from the first rack 51e to the first rack 51c of the third story 33c. The first transport mechanism 26 transports the wafers W from the first rack 51f to the first rack 51d of the fourth story 33d.

The main transport mechanisms 36c-36d of the third and fourth stories 33c-33d transport the wafers W from the first racks 51c-51d to the treating sections 41 of the third and fourth stories 33c-33d. Each of the treating sections 41 of the third and fourth stories 33c-33d performs the second treatment on the wafers W. Specifically, the treating sections 41 of the third and fourth stories 33c-33d give the wafers W treatment including the protective film forming treatment. However, the treating sections 41 of the third and fourth stories 33c-33d do not perform the negative tone developing treatment. The main transport mechanisms 36c-36d place, on the second racks 56c-56d of the third and fourth stories 33c-33d, the wafers W having received the second treatment on the third and fourth stories 33c-33d.

The transport device 73 of the interface division 71 transports the wafers W from the second racks 56c-56d to the exposing machine EXP. Further, the transport device 73 transports wafers W from the exposing machine EXP to the second racks 56a-56b of the first and second stories 33a-33b. At this time, the cleaning section 91 and heat-treating section 101 of the interface division 71 may treat the wafers W.

The main transport mechanisms 36a-36b of the first and second stories 33a-33b transport the wafers W from the second racks 56a-56b to the treating sections 41 of the first and second stories 33a-33b. Each of the treating sections 41 of the first and second stories 33a-33b performs the third treatment on the wafers W. Specifically, each of the treating sections 41 of the first and second stories 33a-33b gives the wafer W treatment including the positive tone developing treatment. The main transport mechanisms 36a-36b place, on the first racks 51a-51b of the first and second stories 33a-33b, the wafers W having received the third treatment on the first and second stories 33a-33b.

The second transport mechanism 27 performs the retrieving operation. Specifically, the second transport mechanism 27 transports the wafers W from the first racks 51a-51b to the carrier C placed on the carrier rack 22B.

In the first example of operation, as described above, the first transport mechanism 26 performs the feeding operation and inter-story transporting operation. The first transport mechanism 26 does not perform the retrieving operation. The second transport mechanism 27 performs the retrieving operation. The second transport mechanism 27 does not perform the feeding operation or inter-story transporting operation. The transport device 73 does not perform the inter-story transporting operation.

In the first example of operation, the wafers W are transported to all the stories 33a-33f. In the first example of operation, the wafers W are treated on all the stories 33a-33f.

In the first example of operation, the first and second stories 33a-33b are an example of the final stories in this invention.

<<Second Example of Operation>>

Reference is made to FIG. 19B. The first transport mechanism 26 performs a feeding operation. Specifically, the first transport mechanism 26 transports wafers W from the carrier C on the carrier rack 22A to the first racks 51e-51f.

The main transport mechanisms 36e-36f transport the wafers W from the first racks 51e-51f to the treating sections 41 of the fifth and sixth stories 33e-33f. Each of the treating sections 41 of the fifth and sixth stories 33e-33f performs the first treatment on the wafers W. Specifically, the treating sections 41 of the fifth and sixth stories 33e-33f give the wafers W treatment including the antireflection film forming treatment and resist film forming treatment. The main transport mechanisms 36e-36f place, on the second racks 56e-56f, the wafers W having received the first treatment on the fifth and sixth stories 33e-33f.

The transport device 73 transports the wafers W from the second racks 56e-56f to the exposing machine EXP. Further, the transport device 73 transports wafers W from the exposing machine EXP to the second racks 56c-56d.

The main transport mechanisms 36c-36d transport the wafers W from the second racks 56c-56d to the treating sections 41 of the third and fourth stories 33c-33d. Each of the treating sections 41 of the third and fourth stories 33c-33d performs the developing treatment on the wafer W. Specifically, the treating sections 41 of the third and fourth stories 33c-33d give the wafers W treatment including the negative tone developing treatment. However, the treating sections 41 of the third and fourth stories 33c-33d do not give the wafers W the second treatment. The main transport mechanisms 36c-36d place, on the first racks 51c-51d, the wafers W having received the developing treatment on the third and fourth stories 33c-33d.

The second transport mechanism 27 performs the retrieving operation. Specifically, the second transport mechanism 27 transports the wafers W from the first racks 51c-51d to the carrier C placed on the carrier rack 22B.

In the second example of operation, as described above, the first transport mechanism 26 performs the feeding operation. The first transport mechanism 26 does not perform the inter-story transporting operation or retrieving operation. The second transport mechanism 27 performs the retrieving operation. The second transport mechanism 27 does not perform the feeding operation or inter-story transporting operation. The transport device 73 does not perform the inter-story transporting operation. Thus, the second example of operation does not need the inter-story transporting operation.

In the second example of operation, the wafers W are transported to only part of the stories 33a-33f. In the second example of operation, the wafers W are transported to the third to sixth stories 33c-33f, and not to the first and second stories 33a-33b. In the second example of operation, the wafers W are treated only on part of the stories 33. In the first example of operation, the wafers W are treated on the third to sixth stories 33c-33f, and not on the first and second stories 33a-33b.

In the second example of operation, the third and fourth stories 33c-33d are an example of the final stories in this invention.

<<Third Example of Operation>>

The first transport mechanism 26 performs a feeding operation. Specifically, the first transport mechanism 26 transports first wafers W from the carrier C on the carrier rack 22A to the first rack 51e. The first transport mechanism 26 transports second wafers W from the carrier C on the carrier rack 22A to the first rack 51f.

The main transport mechanism 36e transports the first wafers W from the first rack 51e to the treating section 41 of the fifth story 33e. The main transport mechanism 36f transports the second wafers W from the first rack 51f to the treating section 41 of the sixth story 33f. Each of the treating sections 41 of the fifth and sixth stories 33e-33f performs the first treatment on the first wafers W and second wafers W. Specifically, the treating sections 41 of the fifth and sixth stories 33e-33f give the first wafers W and second wafers W treatment including the antireflection film forming treatment and resist film forming treatment. The main transport mechanism 36e places, on the first rack 51e, the first wafers W having received the first treatment on the fifth story 33e. The main transport mechanism 36f places, on the second rack 56f, the second wafers W having received the first treatment on the sixth story 33f.

The first transport mechanism 26 performs an inter-story transporting operation. Specifically, the first transport mechanism 26 transports the first wafers W from the first rack 51e to the first rack 51c.

The main transport mechanism 26c transports the first wafers W from the first rack 51c to the treating section 41 of the third story 33c. The treating section 41 of the third story 33c performs the second treatment on the first wafers W. Specifically, the treating section 41 of the third story 33c gives the first wafers W treatment including the protective film forming treatment. However, the treating section 41 of the third story 33c does not give the first wafers W the negative tone developing treatment. The main transport mechanism 36c places, on the second rack 56c, the first wafers W having received the second treatment on the third story 33c.

The transport device 73 transports the first wafers W from the second rack 56c via the exposing machine EXP to the second rack 56a. The transport device 73 transports the second wafers W from the second rack 56f via the exposing machine EXP to the second rack 56d.

The main transport mechanism 36a transports the first wafers W from the second rack 56a to the treating section 41 of the first story 33a. The treating section 41 of the first story 33a performs the third treatment on the first wafers W. Specifically, the treating section 41 of the first story 33a gives the first wafers W treatment including the positive tone developing treatment. The main transport mechanism 36a places, on the first rack 51a of the first story 33a, the first wafers W having received the third treatment on the first story 33a.

The main transport mechanism 36d transports the second wafers W from the second rack 56d to the treating section 41 of the fourth story 33d. The treating section 41 of the fourth story 33d performs the developing treatment on the second wafers W. Specifically, the treating section 41 of the fourth story 33d gives the second wafers W treatment including the negative tone developing treatment. However, the treating section 41 of the fourth story 33d does not perform the second treatment on the second wafers W. The main transport mechanism 36d places, on the first rack 51d of the fourth story 33d, the second wafers W having received the developing treatment on the fourth story 33d.

The second transport mechanism 27 performs the retrieving operation. Specifically, the second transport mechanism 27 transports the first wafers W from the first rack 51a to the carrier C placed on the carrier rack 22B. The second transport mechanism 27 transports the second wafers W from the first rack 51d to the carrier C placed on the carrier rack 22B.

In the third example of operation, as described above, the first transport mechanism 26 performs the feeding operation and inter-story transporting operation. The transport mechanism 26 does not perform the retrieving operation. The second transport mechanism 27 performs the retrieving operation. The second transport mechanism 27 does not perform the feeding operation or inter-story transporting operation.

In the third example of operation, the wafers W are transported to only part of the stories 33. In the third example of operation, the wafers W are transported to the first and third to sixth stories 33a, 33c-33f, and not to the second story 33b. In the third example of operation, the wafers W are treated only on part of the stories 33. In the third example of operation, the wafers W are treated on the first and third to sixth stories 33a, 33c-33f, and not on the second story 33b.

In the third example of operation, the first story 33a and fourth story 33d are an example of the final stories in this invention.

<Advantageous Effects of the Second Embodiment>

The substrate treating apparatus 1 in the second embodiment produces effects similar to those produced by the substrate treating apparatus 1 in the first embodiment. For example, since the first transport mechanism 26 performs the feeding operation and inter-story transporting operation, the footprint of the substrate treating apparatus 1 can be reduced, and the throughput of the substrate treating apparatus 1 can be improved.

The first treatment performed on the fifth and sixth stories 33e-33f includes the antireflection film forming treatment and resist film forming treatment, and the second treatment performed on the third and fourth stories 33c-33d includes the protective film forming treatment. Consequently, the antireflection film forming treatment, resist film forming treatment, and protective film forming treatment can be performed efficiently on the wafers W.

In the first example of operation, the first transport mechanism 26 transports the wafers W from the first racks 51e-51f of the fifth and sixth stories 33e-33f where the first treatment is performed, to the first racks 51c-51d of the third and fourth stories 33c-33d where the second treatment is performed. Thus, the inter-story transporting operation includes transporting the wafers W from the first racks 51e-51f to the first racks 51c-51d. The wafers W can therefore be transported from the stories 33e-33f to the stories 33c-33d. Consequently, the antireflection film forming treatment and resist film forming treatment can be performed on the wafers W, and thereafter the protective film forming treatment can be performed on the wafers W.

Similarly, in the third example of operation, the first transport mechanism 26 transports the first wafers W from the first rack 51e to the first rack 51c. Therefore, the antireflection film forming treatment and resist film forming treatment can be performed on the first wafers W, and thereafter the protective film forming treatment can be performed on the first wafers W.

The treating sections 41 of the third and fourth stories 33c-33d perform the developing treatment in addition to the second treatment. The developing treatment can therefore be performed efficiently on the wafers W.

In the first example of operation, the second transport mechanism 27 transports the wafers W from the first racks 51a-51b of the first and second stories 33a-33b to the carrier C. Thus, the retrieving operation includes transporting the wafers W from the first racks 51a-51b to the carrier C placed on the carrier rack 22B. The wafers W having received the third treatment (developing treatment) can therefore be efficiently transported to the carrier C.

In the second example of operation, the second transport mechanism 27 transports the wafers W from the first racks 51c-51d of the third and fourth stories 33c-33d where the second treatment is performed, to the carrier C placed on the carrier rack 22B. Thus, the retrieving operation includes transporting the wafers W from the first racks 51c-51d to the carrier C placed on the carrier rack 22B. Consequently, the wafers W can be efficiently transported from the stories 33c-33d to the carrier C placed on the carrier rack 22B. The wafers W having received the developing treatment on the stories 33c-33d can therefore be efficiently transported to the carrier C.

In the third example of operation, the second transport mechanism 27 transports the first wafers W and second wafers W from the first racks 51a and 51d of the first and fourth stories 33a and 33d to the carrier C placed on the carrier rack 22B. The first wafers W having received the third treatment (developing treatment) and the second wafers W having received the developing treatment on the stories 33c-33d can therefore be efficiently transported to the carrier C.

The treating sections 41 of the first and second stories 33a-33b perform the third treatment on the wafers W. The third treatment includes the treatment for developing the wafers W. Consequently, the developing treatment can be performed efficiently on the wafers W.

The treating sections 41 of the third and fourth stories 33c-33d perform the negative tone developing treatment. The treating sections 41 of the first and second stories 33a-33b perform the positive tone developing treatment. Consequently, the negative tone developing treatment and positive tone developing treatment can be selectively performed on the wafers W.

This invention is not limited to the above first and second embodiments, but may be modified as follows:

In the above first and second embodiments, the first transport mechanism 26 does not perform the retrieving operation. The invention is not limited to this. The first transport mechanism 26 may perform the retrieving operation. For example, the first transport mechanism 26 may not perform the feeding operation, but may perform the retrieving operation and inter-story transporting operation. For example, the first transport mechanism 26 may perform the feeding operation, retrieving operation, and inter-story transporting operation. In these modifications, the first transport mechanism 26 can directly take the wafers W placed on the first rack 51 by the main transport mechanism 36. The wafers W can therefore be efficiently transported between the first transport mechanism 26 and main transport mechanism 36. Consequently, the throughput of the substrate treating apparatus 1 can be improved conveniently.

In the above first and second embodiments, the second transport mechanism 27 does not perform the inter-story transporting operation. The invention is not limited to this. For example, the second transport mechanism 27 may perform the inter-story transporting operation. With both the first transport mechanism 26 and second transport mechanism 27 performing the inter-story transporting operation, the wafers W can be transported between two different stories 33 with increased efficiency.

For example, the second transport mechanism 27 may perform at least one of the two inter-story transporting operations shown in FIGS. 11 and 13. For example, the first transport mechanism 26 may transport the wafers W from the first rack 51f of the sixth story 33f to the first rack 51d of the fourth story 33d, and the second transport mechanism 27 may transport the wafers W from the first rack 51g of the seventh story 33g to the first rack 51e of the fifth story 33e.

For example, the second transport mechanism 27 may perform at least one of the retrieving operation, feeding operation, and inter-story transporting operation. For example, the second transport mechanism 27 may perform the feeding operation.

In the first and second embodiments described above, the first transport mechanism 26 performs the feeding operation, and not the retrieving operation, while the second transport mechanism 27 performs the retrieving operation, and not the feeding operation. However, the invention is not limited to this. The first transport mechanism 26 may perform the retrieving operation, and not the feeding operation, while the second transport mechanism 27 may perform the feeding operation, and not the retrieving operation. In this modified embodiment also, the transport device 25 can perform both the feeding operation and retrieving operation conveniently. Further, the operation of the first transport mechanism 26 can be simplified. The operation of the second transport mechanism 27 can be simplified.

The first and second embodiments described above show, by way of example, the treatment performed on each story 33. However, the invention is not limited to this. The treatment performed on each story 33 can be changed flexibly. For example, the treatment performed on part of the stories 33 may include the antireflection film forming treatment, and the treatment performed on the other stories 33 may include the resist film forming treatment and protective film forming treatment. For example, the treatment performed on part of the stories 33 may include the antireflection film forming treatment and protective film forming treatment, and the treatment performed on the other stories 33 may include the resist film forming treatment.

The first and second embodiments described above show the antireflection film forming treatment, resist film forming treatment, protective film forming treatment, and developing treatment as examples of solution treatment. However, the invention is not limited to this. The cleaning treatment is also an example of solution treatment. For example, the treatment performed on part of the stories 33 may also include cleaning treatment. For example, the treatment performed on part of the stories 33 may also include pre-exposure cleaning treatment. For example, the treatment performed on part of the stories 33 may also include post-exposure cleaning treatment. For example, the solution treating sections 42 of part of the stories 33 may have cleaning units. For example, the solution treating sections 42 of part of the stories 33 may have pre-exposure cleaning units. For example, the solution treating sections 42 of part of the stories 33 may have post-exposure cleaning units.

The first and second embodiments described above show, by way of example, the first treatment and second treatment. However, the invention is not limited to this. The first treatment and second treatment can be changed flexibly. For example, the first treatment may include part of the antireflection film forming treatment, resist film forming treatment, protective film forming treatment, developing treatment, and cleaning treatment, and the second treatment may include part of the resist film forming treatment, protective film forming treatment, developing treatment, and cleaning treatment. It is preferred here that, when the first treatment includes antireflection film forming treatment, the second treatment does not include antireflection film forming treatment. Similarly, it is preferred that, when the first treatment includes resist film forming treatment, the second treatment does not include resist film forming treatment. It is preferred that, when the first treatment includes protective film forming treatment, the second treatment does not include protective film forming treatment. It is preferred that, when the first treatment includes developing treatment, the second treatment does not include developing treatment. It is preferred that, when the first treatment includes cleaning treatment, the second treatment does not include cleaning treatment. All these allow the wafers W to be given efficiently at least two of the antireflection film treatment, resist film forming treatment, protective film forming treatment, developing treatment, and cleaning treatment.

For example, the first treatment may include antireflection film forming treatment, and the second treatment may include resist film forming treatment and protective film forming treatment. For example, the first treatment may include antireflection film forming treatment and protective film forming treatment, and the second treatment may include resist film forming treatment. For example, the first treatment may include antireflection film forming treatment, resist film forming treatment, and protective film forming treatment, and the second treatment may include developing treatment.

In the first and second embodiments described above, the heat-treating section 101 of the interface division 71 has the post-exposure heating units 103 and 105. The heat-treating sections 47 of the stories 33 have no post-exposure heating units. However, the invention is not limited to this. For example, the stories 33 may have post-exposure heating units. The heat-treating sections 47 of the stories 33 may have post-exposure heating units. In the first embodiment, for example, the heat-treating sections 47 of the first to third stories 33a-33c may have post-exposure heating units. In the second embodiment, for example, the heat-treating sections 47 of the first and second stories 33a-33b may have post-exposure heating units. In the second embodiment, for example, the heat-treating sections 47 of the third and fourth stories 33c-33d may have post-exposure heating units. For example, the post-exposure heating units 103 and 105 of the interface division 71 may be omitted. For example, the heat-treating section 101 of the interface division 71 may be omitted.

In the first embodiment described above, the first treatment is performed on the sixth and seventh stories 33f-33g. That is, the number of stories 33 that perform the first treatment is two. However, the invention is not limited to this. The number of stories 33 that perform the first treatment may be one, three, or more.

In the first embodiment described above, the second treatment is performed on the fourth and fifth stories 33d-33e. That is, the number of stories 33 that perform the second treatment is two. However, the invention is not limited to this. The number of stories 33 that perform the second treatment may be one, three, or more.

In the first embodiment described above, the third treatment is performed on the first to third stories 33a-33c. That is, the number of stories 33 that perform the third treatment is three. However, the invention is not limited to this. The number of stories 33 that perform the third treatment may be one, two, four or more.

For example, the number of stories 33 that perform the third treatment may be zero. For example, the first to third stories 33a-33c of the first embodiment may be omitted. In this case, the fourth and fifth stories 33d-33e become an example of the final stories in this invention. Similarly, the first and second stories 33a-33b of the second embodiment may be omitted.

A first to a fourth modified embodiments will be described with reference to the drawings. Components identical to those of the first or second embodiment are shown with the same signs, and will not particularly be described.

First Modified Embodiment

Figure 20:
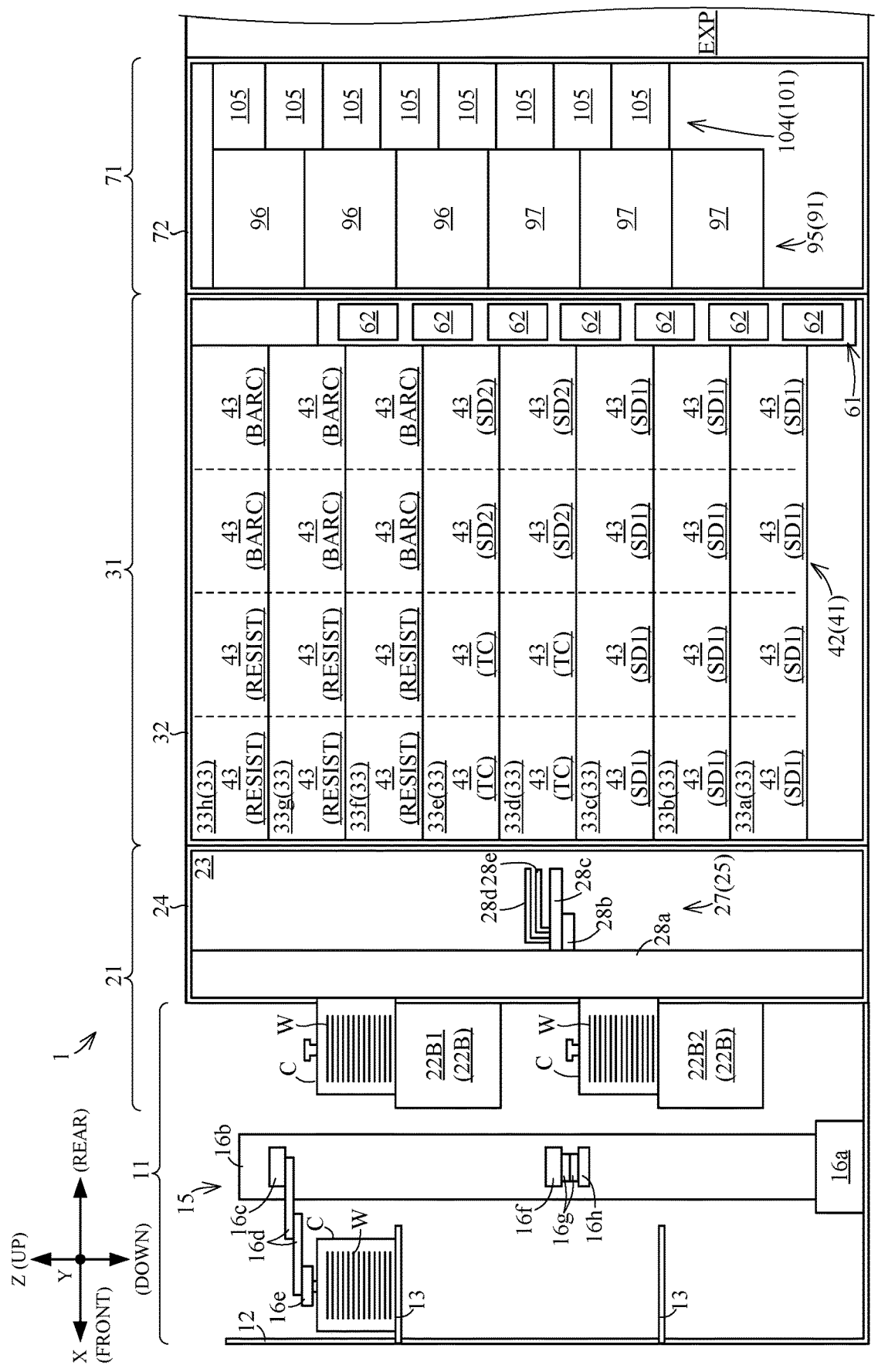
FIG. 20 is a left side view showing a construction of a left part of a substrate treating apparatus according to a first modified embodiment.

FIG. 20 is a left side view showing the construction of a left part of a substrate treating apparatus 1 according to the first modified embodiment. The substrate treating apparatus 1 according to the first modified embodiment has more stories 33 that perform the first treatment than the substrate treating apparatus 1 according to the second embodiment. The substrate treating apparatus 1 according to the first modified embodiment has more stories 33 that perform the third treatment than the substrate treating apparatus 1 according to the second embodiment.

Specifically, the treating block 31 has a plurality of (e.g. eight) stories 33. For expediency, these stories 33 are called first story 33a, second story 33b, third story 33c, fourth story 33d, fifth story 33e, sixth story 33f, seventh story 33g, and eighth story 33h. The same distinction will be used for the stories 33 also in the second to fourth modified embodiments to follow.

The treating sections 41 of the sixth to eighth stories 33f-33h perform the same treatment on wafers W. The treating sections 41 of the sixth to eighth stories 33f-33h perform a first treatment on wafers W, respectively. The first treatment includes resist film forming treatment. The first treatment may further include antireflection film coating treatment, and may not include antireflection film coating treatment. Each of the treating sections 41 of the sixth to eighth stories 33f-33h has two antireflection film coating units BARC, and two resist film coating units RESIST.

The treating sections 41 of the fourth and fifth stories 33d-33e perform the same treatment on wafers W. The treating sections 41 of the fourth and fifth stories 33d-33e perform a second treatment and developing treatment on wafers W, respectively. The second treatment includes protective film forming treatment. The developing treatment on the fourth and fifth stories 33d-33e, specifically, is organic developing treatment. The organic developing treatment supplies the wafers W with a developer including an organic solvent. The organic solvent is butyl acetate, for example. Each of the treating sections 41 of the fourth and fifth stories 33d-33e has two protective film coating units TC and two organic developing units SD2.

The treating sections 41 of the first to third stories 33a-33c perform the same treatment on wafers W. The treating sections 41 of the first to third stories 33a-33c perform a third treatment on wafers W, respectively. The third treatment includes developing treatment. The developing treatment included in the third treatment, specifically, is alkaline developing treatment. The alkaline developing treatment supplies the wafers W with an alkaline aqueous solution as developer. The alkaline aqueous solution is tetramethylammonium hydroxide (TMAH) or potassium hydroxide (KOH), for example. Each of the treating sections 41 of the first to third stories 33a-33c has four alkaline developing units SD1.

The first treatment is different from the second treatment. The first treatment is different from the third treatment. The second treatment is different from the third treatment. The first treatment does not include protective film forming treatment or developing treatment. The second treatment does not include antireflection film forming treatment, resist film forming treatment, or developing treatment. The third treatment does not include antireflection film forming treatment, resist film forming treatment, or protective film forming treatment.

The antireflection film forming treatment and resist film forming treatment are an example of the first solution treatment in this invention. The antireflection film forming treatment and resist film forming treatment are an example of the first pre-exposure treatment in this invention. The protective film forming treatment is an example of the second solution treatment in this invention. The protective film forming treatment is an example of the second pre-exposure treatment in this invention.

The sixth to eighth stories 33f-33h are an example of the "stories for performing the first treatment" in this invention. The fourth and fifth stories 33d-33f are an example of the "stories for performing the second treatment" in this invention. The first to third stories 33a-33c are an example of the "stories for performing the third treatment" in this invention.

FIGS. 21A-21C and 22A-22C are views each schematically showing an outline of transport routes of the wafers W. For expediency, the first racks 51 provided for the first to eighth stories 33a-33h will be called the first racks 51a-51h. The second racks 56 provided for the first to eighth stories 33a-33h will be called the second racks 56a-56h. The same distinction will be made for the first racks 51 and second racks 56 also in the second to fourth modified embodiments to follow. Examples of operation of the substrate treating apparatus 1 according to the first modified embodiment will be described hereinafter.

Figure 21A:
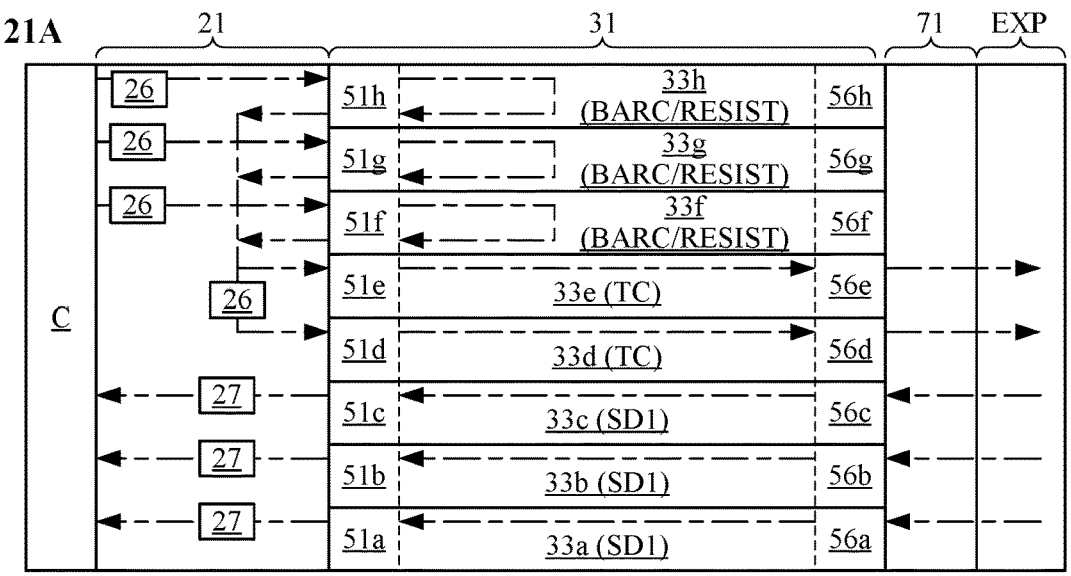
FIGS. 21A, 21B, and 21C are views each schematically showing an outline of substrate transport routes.

FIG. 21A shows a first example of operation. FIG. 21A schematically shows transport routes of the wafers W in chain lines. In the first example of operation, the first transport mechanism 26 performs the feeding operation and inter-story transporting operation. The second transport mechanism 27 performs the retrieving operation. Consequently, the first treatment, second treatment, and third treatment are performed in this order on the wafers W. However, the developing treatment on the fourth and fifth stories 33d-33e is not performed on the wafers W. FIG. 21A therefore omits the sign "SD2" indicating the organic developing units provided for the fourth and fifth stories 33d-33e. That is, FIG. 21A shows the signs representing the treating units which treat the wafers W, and omits the signs of the treating units which do not treat the wafers W. Similarly, the figures showing the other examples of operation in the first to fourth modified embodiments described hereinafter also omit the signs of the treating units which do not treat the wafers W. The first example of operation will be described specifically hereinafter.

The first transport mechanism 26 performs the feeding operation. Specifically, the first transport mechanism 26 transports wafers W from the carrier C placed on the carrier rack 22A to the first racks 51f-51h of the sixth to eighth stories 33f-33h.

Each of the treating sections 41 of the sixth to eighth stories 33f-33h performs the first treatment (more particularly, treatment including the resist film forming treatment) on the wafers W.

For example, each of the treating sections 41 of the sixth to eighth stories 33f-33h may perform the antireflection film forming treatment and resist film forming treatment on the wafers W. Or each of the treating sections 41 of the sixth to eighth stories 33f-33h may perform the resist film forming treatment on the wafers W without performing the antireflection film forming treatment on the wafers W. In the other examples of operation described hereinafter, the first treatment may be performed similarly. Further, in the examples of operation in the second to fourth modified embodiments described hereinafter, the first treatment may be performed similarly.

The first transport mechanism 26 performs the inter-story transporting operation. Specifically, the first transport mechanism 26 transports the wafers W from the first racks 51f-51h of the sixth to eighth stories 33f-33h to the first racks 51d-51e of the fourth and fifth stories 33d-33e.

Each of the treating sections 41 of the fourth and fifth stories 33d-33e performs the second treatment (more particularly, treatment including the protective film forming treatment) on the wafers W. However, the treating sections 41 of the fourth and fifth stories 33d-33e do not perform developing treatment on the wafers W.

The transport device 73 of the interface division 71 transports the wafers W from the second racks 56d-56e of the fourth and fifth stories 33d-33e to the exposing machine EXP. Further, the transport device 73 transports the wafers W from the exposing machine EXP to the second racks 56a-56c of the first to third stories 33a-33c.

Each of the treating sections 41 of the first to third stories 33a-33c performs the third treatment (more particularly, treatment including the alkaline developing treatment) on the wafers W.

The second transport mechanism 27 performs the retrieving operation. Specifically, the second transport mechanism 27 transports the wafers W from the first racks 51a-51c of the first to third stories 33a-33c to the carrier C placed on the carrier rack 22B.

Figure 21B:
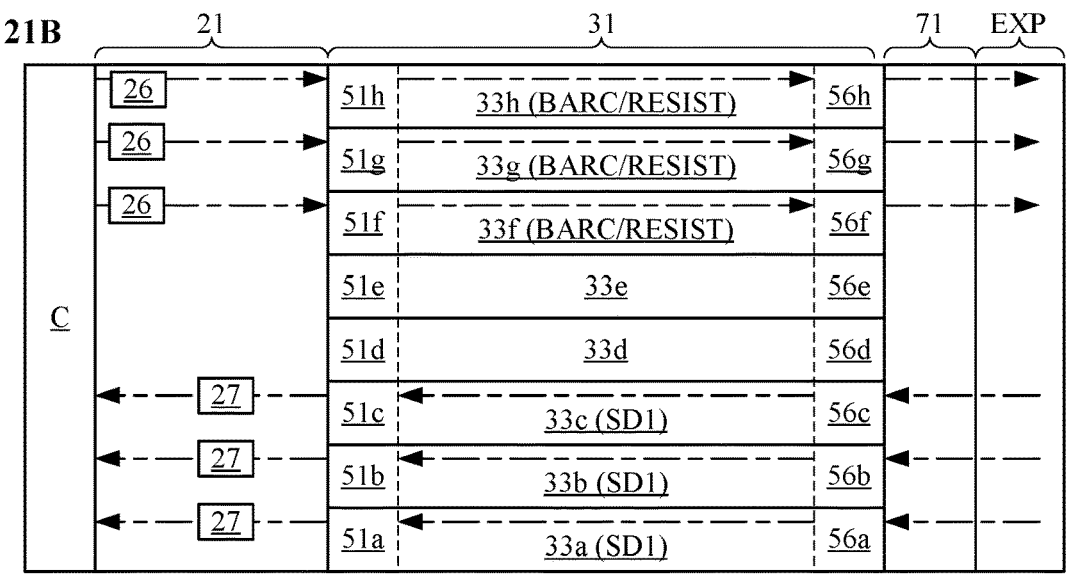

FIG. 21B shows a second example of operation. FIG. 21B schematically shows transport routes of the wafers W in chain lines. In the second example of operation, the first transport mechanism 26 performs the feeding operation. The second transport mechanism 27 performs the retrieving operation. In the second example of operation, however, the transport device 25 does not perform the inter-story transporting operation. Consequently, the first treatment and third treatment are performed in this order on the wafers W. However, the second treatment is not performed on the wafers W. The developing treatment on the fourth and fifth stories 33d-33e is not performed on the wafers W. The second example of operation will be described specifically hereinafter.

The first transport mechanism 26 performs the feeding operation. Specifically, the first transport mechanism 26 transports wafers W from the carrier C placed on the carrier rack 22A to the first racks 51f-51h of the sixth to eighth stories 33f-33h.

Each of the treating sections 41 of the sixth to eighth stories 33f-33h performs the first treatment on the wafers W.

The transport device 73 of the interface division 71 transports the wafers W from the second racks 56f-56h of the sixth to eighth stories 33f-33h to the exposing machine EXP. Further, the transport device 73 transports the wafers W from the exposing machine EXP to the second racks 56a-56c of the first to third stories 33a-33c.

Each of the treating sections 41 of the first to third stories 33a-33c performs the third treatment on the wafers W.

The second transport mechanism 27 performs the retrieving operation. Specifically, the second transport mechanism 27 transports the wafers W from the first racks 51a-51c of the first to third stories 33a-33c to the carrier C placed on the carrier rack 22B.

Figure 21C:
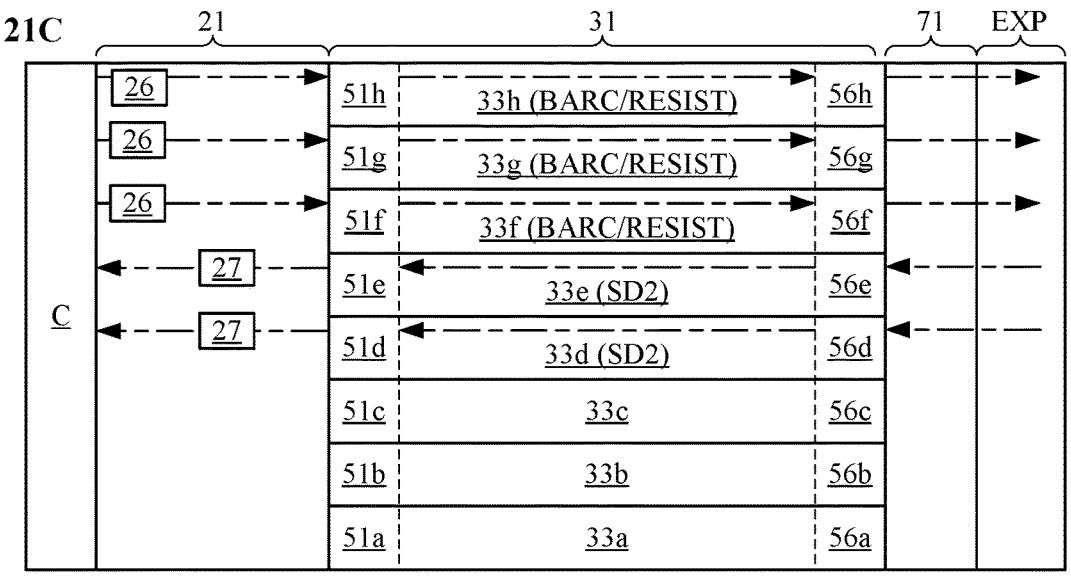

FIG. 21C shows a third example of operation. FIG. 21C schematically shows transport routes of the wafers W in chain lines. In the third example of operation, the first transport mechanism 26 performs the feeding operation. The second transport mechanism 27 performs the retrieving operation. In the third example of operation, however, the transport device 25 does not perform the inter-story transporting operation. Consequently, the first treatment is performed on the wafers W. Subsequently, the developing treatment on the fourth and fifth stories 33d-33e is given to the wafers W. However, the second treatment and third treatment are not performed on the wafers W. The third example of operation will be described specifically hereinafter.

The first transport mechanism 26 performs the feeding operation. Specifically, the first transport mechanism 26 transports wafers W from the carrier C placed on the carrier rack 22A to the first racks 51f-51h of the sixth to eighth stories 33f-33h.

Each of the treating sections 41 of the sixth to eighth stories 33f-33h performs the first treatment on the wafers W.

The transport device 73 of the interface division 71 transports the wafers W from the second racks 56f-56h of the sixth to eighth stories 33f-33h to the exposing machine EXP. Further, the transport device 73 transports the wafers W from the exposing machine EXP to the second racks 56d-56e of the fourth and fifth stories 33d-33e.

Each of the treating sections 41 of the fourth and fifth stories 33d-33e performs the developing treatment (more particularly, the organic developing treatment) on the wafers W. However, the treating sections 41 of the fourth and fifth stories 33d-33e do not perform the second treatment on the wafers W.

The second transport mechanism 27 performs the retrieving operation. Specifically, the second transport mechanism 27 transports the wafers W from the first racks 51d-51e of the fourth and fifth stories 33d-33e to the carrier C placed on the carrier rack 22B.

Figure 22A:
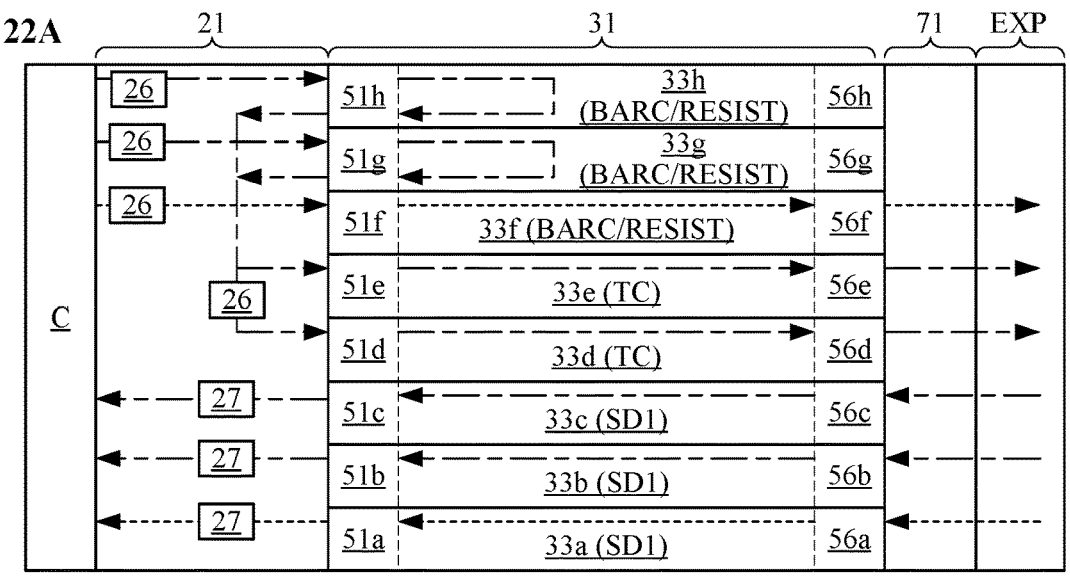
FIGS. 22A, 22B, and 22C are views each schematically showing an outline of substrate transport routes.

FIG. 22A shows a fourth example of operation. FIG. 22A schematically shows transport routes of the first wafers W in chain lines, and schematically shows transport routes of the second wafers W in broken lines. The fourth example of operation corresponds to a combination of the first example of operation and the second example of operation. In the fourth example of operation, the first transport mechanism 26 performs the feeding operation and inter-story transporting operation. The second transport mechanism 27 performs the retrieving operation. Consequently, the first treatment, second treatment, and third treatment are performed in this order on the first wafers W, and the first treatment and third treatment are performed in this order on the second wafers W. However, the developing treatment on the fourth and fifth stories 33d-33e is not performed on the first wafers W. The second treatment is not performed on the second wafers W. The developing treatment on the fourth and fifth stories 33d-33e is not performed on the second wafers W. The fourth example of operation will be described specifically hereinafter.

The first transport mechanism 26 performs the feeding operation. Specifically, the first transport mechanism 26 transports the first wafers W from the carrier C placed on the carrier rack 22A to the first racks 51g-51h of the seventh and eighth stories 33g-33h. The first transport mechanism 26 transports the second wafers W from the carrier C placed on the carrier rack 22A to the first rack 51f of the sixth story 33f.

Each of the treating sections 41 of the seventh and eighth stories 33g-33h performs the first treatment on the first wafers W. The treating section 41 of the sixth story 33f performs the first treatment on the second wafers W.

The first transport mechanism 26 performs the inter-story transporting operation. Specifically, the first transport mechanism 26 transports the first wafers W from the first racks 51g-51h of the seventh and eighth stories 33g-33h to the first racks 51d-51e of the fourth and fifth stories 33d-33e.

Each of the treating sections 41 of the fourth and fifth stories 33d-33e performs the second treatment on the first wafers W.

The transport device 73 of the interface division 71 transports the first wafers W from the second racks 56d-56e of the fourth and fifth stories 33d-33e to the exposing machine EXP. The transport device 73 transports the second wafers W from the second rack 56f of the sixth story 33f to the exposing machine EXP. Further, the transport device 73 transports the first wafers W from the exposing machine EXP to the second racks 56b-56c of the second and third stories 33b-33c. The transport device 73 transports the second wafers W from the exposing machine EXP to the second rack 56a of the first story 33a.

Each of the treating sections 41 of the second and third stories 33b-33c performs the third treatment on the first wafers W. The treating section 41 of the first story 33a performs the third treatment on the second wafers W.

The second transport mechanism 27 performs the retrieving operation. Specifically, the second transport mechanism 27 transports the first wafers W from the first racks 51b-51c of the second and third stories 33b-33c to the carrier C placed on the carrier rack 22B. The second transport mechanism 27 transports the second wafers W from the first rack 51a of the first story 33a to the carrier C placed on the carrier Crack 22B.

Figure 22B:
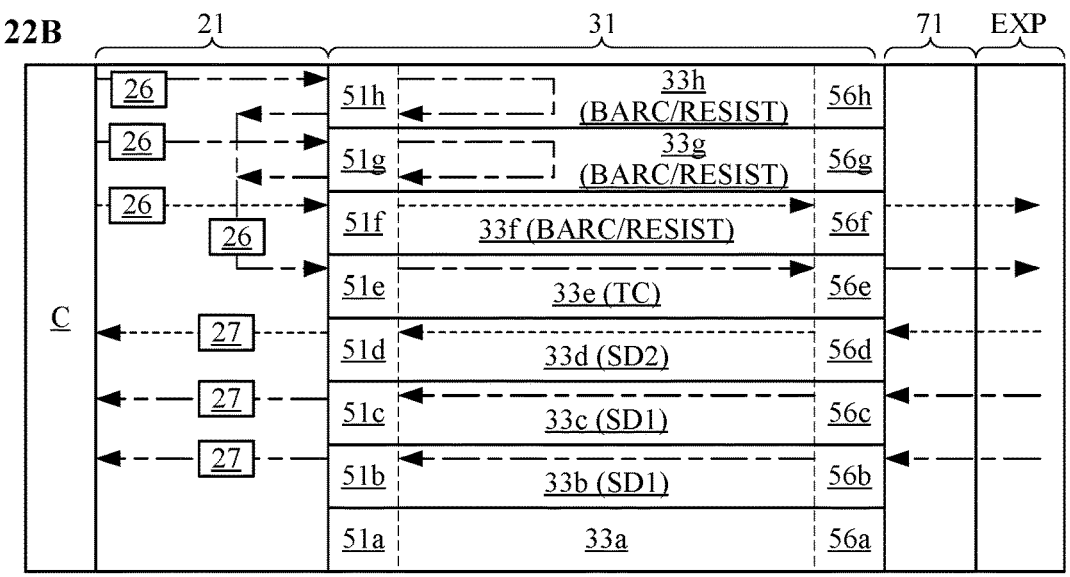

FIG. 22B shows a fifth example of operation. FIG. 22B schematically shows transport routes of the first wafers W in chain lines, and schematically shows transport routes of the second wafers W in broken lines. The fifth example of operation corresponds to a combination of the first example of operation and the third example of operation. In the fifth example of operation, the first transport mechanism 26 performs the feeding operation and inter-story transporting operation. The second transport mechanism 27 performs the retrieving operation. Consequently, the first treatment, second treatment, and third treatment are performed in this order on the first wafers W, and the first treatment and the developing treatment on the fourth and fifth stories 33d-33e are performed in this order on the second wafers W. However, the developing treatment on the fourth and fifth stories 33d-33e is not performed on the first wafers W. The second treatment and third treatment are not performed on the second wafers W. The fifth example of operation will be described specifically hereinafter.

The first transport mechanism 26 performs the feeding operation. Specifically, the first transport mechanism 26 transports the first wafers W from the carrier C placed on the carrier rack 22A to the first racks 51g-51h of the seventh and eighth stories 33g-33h. The first transport mechanism 26 transports the second wafers W from the carrier C placed on the carrier rack 22A to the first rack 51*f* of the sixth story 33*f*.

Each of the treating sections 41 of the seventh and eighth stories 33*g*-33*h* performs the first treatment on the first wafers W. The treating section 41 of the sixth story 33*f* performs the first treatment on the second wafers W.

The first transport mechanism 26 performs the inter-story transporting operation. Specifically, the first transport mechanism 26 transports the first wafers W from the first racks 51*g*-51*h* of the seventh and eighth stories 33*g*-33*h* to the first rack 51*e* of the fifth story 33*e*.

The treating section 41 of the fifth story 33*e* performs the second treatment on the first wafers W The transport device 73 of the interface division 71 transports the first wafers W from the second rack 56*e* of the fifth story 33*e* to the exposing machine EXP. The transport device 73 transports the second wafers W from the second rack 56*f* of the sixth story 33*f* to the exposing machine EXP. Further, the transport device 73 transports the first wafers W from the exposing machine EXP to the second racks 56*b*-56*c* of the second and third stories 33*b*-33*c*. The transport device 73 transports the second wafers W from the exposing machine EXP to the second rack 56*d* of the fourth story 33*d*.

Each of the treating sections 41 of the second and third stories 33*b*-33*c* performs the third treatment (more particularly, the alkaline developing treatment) on the first wafers W. The treating section 41 of the fourth story 33*d* performs the developing treatment (more particularly, the organic developing treatment) on the second wafers W.

The second transport mechanism 27 performs the retrieving operation. Specifically, the second transport mechanism 27 transports the first wafers W from the first racks 51*b*-51*c* of the second and third stories 33*b*-33*c* to the carrier C placed on the carrier rack 22B. The second transport mechanism 27 transports the second wafers W from the first rack 51*d* of the fourth story 33*d* to the carrier C placed on the carrier rack 22B.

Figure 22C:
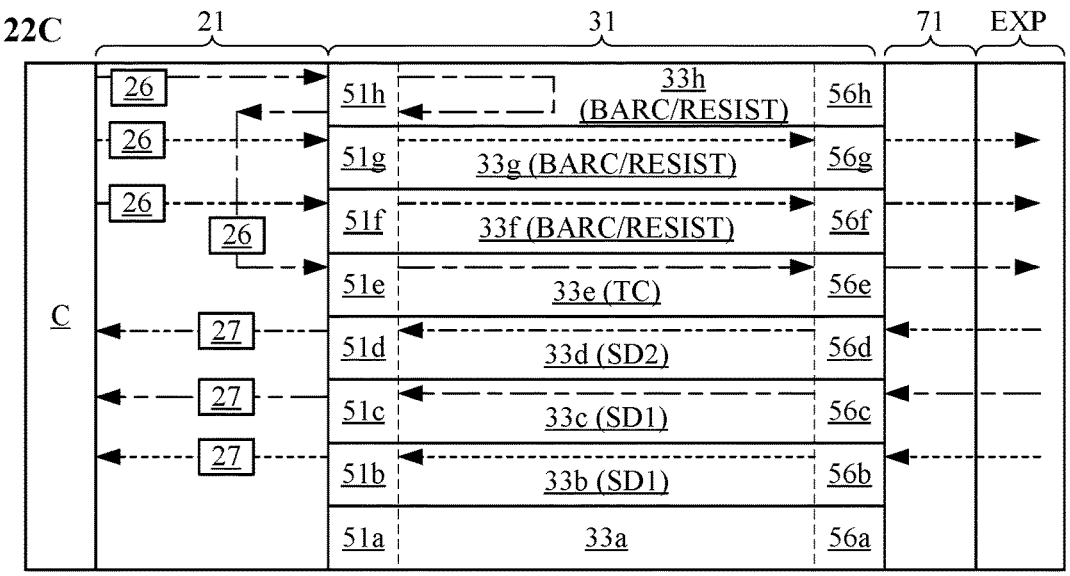

FIG. 22C shows a sixth example of operation. FIG. 22C schematically shows transport routes of the first wafers W in chain lines, schematically shows transport routes of the second wafers W in broken lines, and schematically shows transport routes of third wafers W in two-dot chain lines. The sixth example of operation corresponds to a combination of the first example of operation, second example of operation, and the third example of operation. In the sixth example of operation, the first transport mechanism 26 performs the feeding operation and inter-story transporting operation. The second transport mechanism 27 performs the retrieving operation. Consequently, the first treatment, second treatment, and third treatment are performed in this order on the first wafers W, the first treatment and third treatment are performed in this order on the second wafers W, and the first treatment and the developing treatment on the fourth and fifth stories 33*d*-33*e* are performed in this order on the third wafers W. However, the developing treatment on the fourth and fifth stories 33*d*-33*e* is not performed on the first wafers W. The second treatment and the developing treatment on the fourth and fifth stories 33*d*-33*e* are not performed on the second wafers W. The second treatment and third treatment are not performed on the third wafers W. The sixth example of operation will be described specifically hereinafter.

The first transport mechanism 26 performs the feeding operation. Specifically, the first transport mechanism 26 transports the first wafers W from the carrier C placed on the carrier rack 22A to the first rack 51*h* of the eighth story 33*h*. The first transport mechanism 26 transports the second wafers W from the carrier C placed on the carrier rack 22A to the first rack 51*g* of the seventh story 33*g*. The first transport mechanism 26 transports the third wafers W from the carrier C placed on the carrier rack 22A to the first rack 51*f* of the sixth story 33*f*.

The treating section 41 of the eighth story 33*h* performs the first treatment on the first wafers W. The treating section 41 of the seventh story 33*g* performs the first treatment on the second wafers W. The treating section 41 of the sixth story 33*f* performs the first treatment on the third wafers W.

The first transport mechanism 26 performs the inter-story transporting operation. Specifically, the first transport mechanism 26 transports the first wafers W from the first rack 51*h* of the eighth story 33*h* to the first rack 51*e* of the fifth story 33*e*.

The treating section 41 of the fifth story 33*e* performs the second treatment on the first wafers W.

The transport device 73 of the interface division 71 transports the first wafers W from the second rack 56*e* of the fifth story 33*e* to the exposing machine EXP. The transport device 73 transports the second wafers W from the second rack 56*g* of the seventh story 33*g* to the exposing machine EXP. The transport device 73 transports the third wafers W from the second rack 56*f* of the sixth story 33*f* to the exposing machine EXP. Further, the transport device 73 transports the first wafers W from the exposing machine EXP to the second rack 56*c* of the third story 33*c*. The transport device 73 transports the second wafers W from the exposing machine EXP to the second rack 56*b* of the second story 33*b*. The transport device 73 transports the third wafers W from the exposing machine EXP to the second rack 56*d* of the fourth story 33*d*.

The treating section 41 of the third story 33*c* performs the third treatment (more particularly, the alkaline developing treatment) on the first wafers W. The treating section 41 of the second story 33*b* performs the third treatment on the second wafers W. The treating section 41 of the fourth story 33*d* performs the developing treatment (more particularly, the organic developing treatment) on the third wafers W.

The second transport mechanism 27 performs the retrieving operation. Specifically, the second transport mechanism 27 transports the first wafers W from the first rack 51*c* of the third story 33*c* to the carrier C placed on the carrier rack 22B. The second transport mechanism 27 transports the second wafers W from the first rack 51*b* of the second story 33*b* to the carrier C placed on the carrier rack 22B. The second transport mechanism 27 transports the third wafers W from the first rack 51*d* of the fourth story 33*d* to the carrier C placed on the carrier rack 22B.

Although not shown, the substrate treating apparatus 1 according to the first modified embodiment can perform operations other than the first to sixth examples of operation.

The substrate treating apparatus 1 according to the first modified embodiment can perform a seventh example of operation which corresponds to a combination of the second example of operation and the third example of operation. In the seventh example of operation, the first transport mechanism 26 performs the feeding operation. The second transport mechanism 27 performs the retrieving operation. In the seventh example of operation, however, the transport device 25 does not perform the inter-story transporting operation. Consequently, the first treatment and third treatment are performed on the first wafers W, and the first treatment and the developing treatment on the fourth and fifth stories 33*d*-33*e* are performed on the second wafers W.

With the first modified embodiment also, as described above, the footprint of the substrate treating apparatus 1 can be reduced, and the throughput of the substrate treating apparatus 1 can be improved.

Second Modified Embodiment

Figure 23:
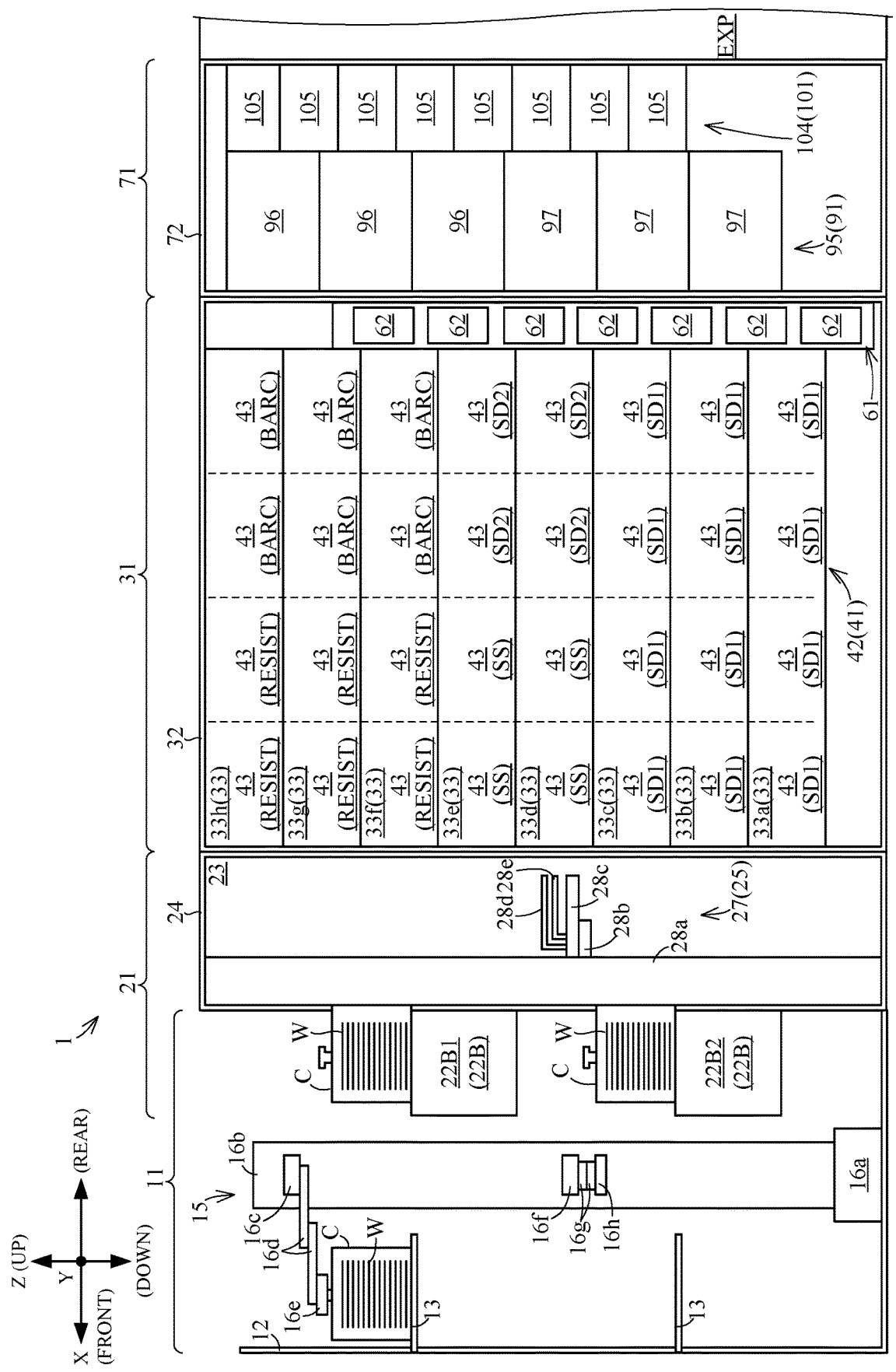
FIG. 23 is a left side view showing a construction of a left part of a substrate treating apparatus according to a second modified embodiment.

FIG. 23 is a left side view showing the construction of a left part of a substrate treating apparatus 1 according to the second modified embodiment. The substrate treating apparatus 1 according to the second modified embodiment has more stories that perform the first treatment than in the second embodiment. The substrate treating apparatus 1 according to the second modified embodiment has more stories that perform the third treatment than in the second embodiment. The second treatment in the second modified embodiment includes cleaning treatment.

Specifically, the treating sections 41 of the sixth to eighth stories 33*f*-33*h* perform the same treatment on the wafers W. The treating sections 41 of the sixth to eighth stories 33*f*-33*h* perform a first treatment on the wafers W, respectively. The first treatment includes resist film forming treatment. The first treatment may further include antireflection film forming treatment, and may not include the antireflection film forming treatment. Each of the treating sections 41 of the sixth to eighth stories 33*f*-33*h* has two antireflection film coating units BARC, and two resist film coating units RESIST.

The treating sections 41 of the fourth and fifth stories 33*d*-33*e* perform the same treatment on wafers W. The treating sections 41 of the fourth and fifth stories 33*d*-33*e* perform a second treatment and developing treatment on the wafers W, respectively. The second treatment includes cleaning treatment. The cleaning treatment cleans the wafers W by supplying the wafers W with a cleaning liquid. The developing treatment on the fourth and fifth stories 33*d*-33*e*, specifically, is organic developing treatment. Each of the treating sections 41 of the fourth and fifth stories 33*d*-33*e* has two cleaning units SS and two organic developing units SD2.

Here, the cleaning treatment may be any one of first cleaning treatment and second cleaning treatment. The first cleaning treatment cleans the front surface of each wafer W. The second cleaning treatment cleans at least one of the back surface and edge region of each wafer W.

The cleaning treatment may clean the wafers W while rotating the wafers W, or may clean the wafers W without rotating the wafers W. The cleaning treatment may clean the wafers W using brushes, or may clean the wafers W without using brushes. The cleaning treatment may clean the wafers W with brushes contacting the wafers W. The cleaning treatment may dry the wafers W after cleaning the wafers W.

The cleaning units SS may be either first cleaning units which perform the first cleaning treatment, or second cleaning units which perform the second cleaning treatment.

The treating sections 41 of the first to third stories 33*a*-33*c* perform the same treatment on wafers W. The treating sections 41 of the first to third stories 33*a*-33*c* perform a third treatment on the wafers W, respectively. The third treatment includes developing treatment. The developing treatment included in the third treatment, specifically, is alkaline developing treatment. Each of the treating sections 41 of the first to third stories 33*a*-33*c* has four alkaline developing units SD1.

The first treatment is different from the second treatment. The first treatment is different from the third treatment. The second treatment is different from the third treatment. The first treatment does not include cleaning treatment or developing treatment. The second treatment does not include antireflection film forming treatment, resist film forming treatment, or developing treatment. The third treatment does not include antireflection film forming treatment, resist film forming treatment, or cleaning treatment.

The antireflection film forming treatment and resist film forming treatment are an example of the first solution treatment in this invention. The antireflection film forming treatment and resist film forming treatment are an example of the first pre-exposure treatment in this invention. The cleaning treatment is an example of the second solution treatment in this invention. The cleaning treatment is an example of the second pre-exposure treatment in this invention.

The sixth to eighth stories 33*f*-33*h* are an example of the "stories for performing the first treatment" in this invention. The fourth and fifth stories 33*d*-33*f* are an example of the "stories for performing the second treatment" in this invention. The first to third stories 33*a*-33*c* are an example of the "stories for performing the third treatment" in this invention.

Figure 24A:
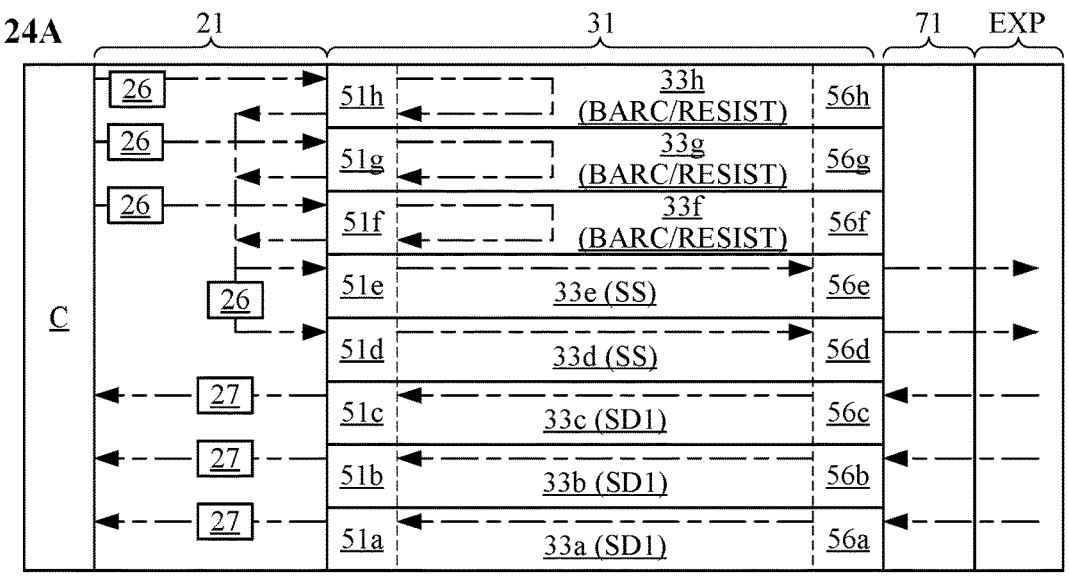
FIGS. 24A, 24B, and 24C are views schematically showing an outline of substrate transport routes.
Figure 24B:
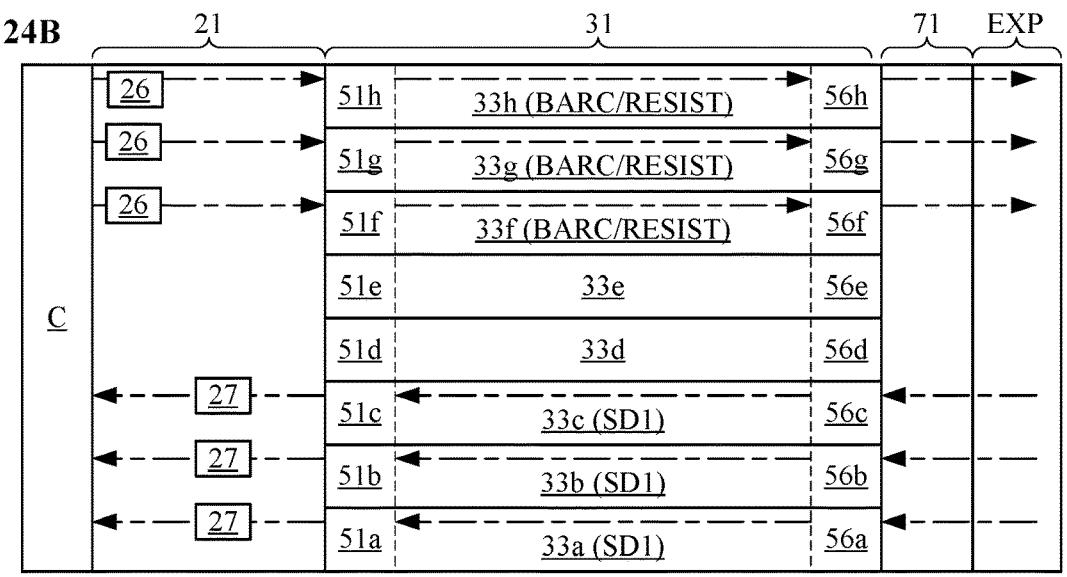
Figure 24C:
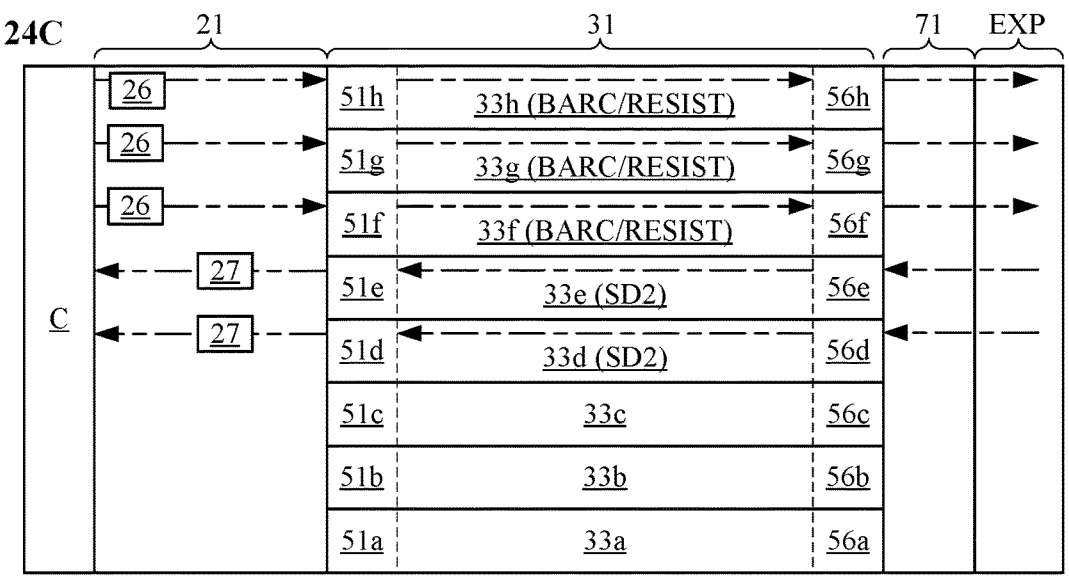

FIGS. 24A-24C are views each schematically showing an outline of transport routes of the wafers W. Examples of operation of the substrate treating apparatus 1 according to the second modified embodiment will be described hereinafter.

FIG. 24A shows a first example of operation. FIG. 24A schematically shows transport routes of the wafers W in chain lines. In the first example of operation, the first transport mechanism 26 performs the feeding operation and inter-story transporting operation. The second transport mechanism 27 performs the retrieving operation. Consequently, the first treatment, second treatment, and third treatment are performed in this order on the wafers W. However, the developing treatment on the fourth and fifth stories 33*d*-33*e* is not performed on the wafers W. The first example of operation will be described specifically hereinafter.

The first transport mechanism 26 performs the feeding operation. Specifically, the first transport mechanism 26 transports wafers W from the carrier C placed on the carrier rack 22A to the first racks 51*f*-51*h* of the sixth to eighth stories 33*f*-33*h*.

Each of the treating sections 41 of the sixth to eighth stories 33*f*-33*h* performs the first treatment (more particularly, treatment including the resist film forming treatment) on the wafers W.

The first transport mechanism 26 performs the inter-story transporting operation. Specifically, the first transport mechanism 26 transports the wafers W from the first racks 51*f*-51*h* of the sixth to eighth stories 33*f*-33*h* to the first racks 51*d*-51*e* of the fourth and fifth stories 33*d*-33*e*.

Each of the treating sections 41 of the fourth and fifth stories 33*d*-33*e* performs the second treatment (more particularly, treatment including the cleaning treatment) on the wafers W.

The transport device 73 of the interface division 71 transports the wafers W from the second racks 56*d*-56*e* of the fourth and fifth stories 33*d*-33*e* to the exposing machine EXP. Further, the transport device 73 transports the wafers W from the exposing machine EXP to the second racks 56*a*-56*c* of the first to third stories 33*a*-33*c*.

Each of the treating sections 41 of the first to third stories 33*a*-33*c* performs the third treatment (more particularly, the alkaline developing treatment) on the wafers W.

The second transport mechanism 27 performs the retrieving operation. Specifically, the second transport mechanism 27 transports the wafers W from the first racks 51a-51c of the first to third stories 33a-33c to the carrier C placed on the carrier rack 22B.

FIG. 24B shows a second example of operation. FIG. 24B schematically shows transport routes of the wafers W in chain lines. In the second example of operation, the first transport mechanism 26 performs the feeding operation. The second transport mechanism 27 performs the retrieving operation. In the second example of operation, however, the transport device 25 does not perform the inter-story transporting operation. Consequently, the first treatment and third treatment are performed in this order on the wafers W. However, the second treatment is not performed on the wafers W. The developing treatment on the fourth and fifth stories 33d-33e is not performed on the wafers W. The second example of operation will be described specifically hereinafter.

The first transport mechanism 26 performs the feeding operation. Specifically, the first transport mechanism 26 transports wafers W from the carrier C placed on the carrier rack 22A to the first racks 51f-51h of the sixth to eighth stories 33f-33h.

Each of the treating sections 41 of the sixth to eighth stories 33f-33h performs the first treatment on the wafers W.

The transport device 73 of the interface division 71 transports the wafers W from the second racks 56f-56h of the sixth to eighth stories 33f-33h to the exposing machine EXP. Further, the transport device 73 transports the wafers W from the exposing machine EXP to the second racks 56a-56c of the first to third stories 33a-33c.

Each of the treating sections 41 of the first to third stories 33a-33c performs the third treatment on the wafers W.

The second transport mechanism 27 performs the retrieving operation. Specifically, the second transport mechanism 27 transports the wafers W from the first racks 51a-51c of the first to third stories 33a-33c to the carrier C placed on the carrier rack 22B.

FIG. 24C shows a third example of operation. FIG. 24C schematically shows transport routes of the wafers W in chain lines. In the third example of operation, the first transport mechanism 26 performs the feeding operation. The second transport mechanism 27 performs the retrieving operation. In the third example of operation, however, the transport device 25 does not perform the inter-story transporting operation. Consequently, the first treatment is performed on the wafers W. Subsequently, the developing treatment on the fourth and fifth stories 33d-33e is performed on the wafers W. However, the second treatment and third treatment are not performed on the wafers W. The third example of operation will be described specifically hereinafter.

The first transport mechanism 26 performs the feeding operation. Specifically, the first transport mechanism 26 transports wafers W from the carrier C placed on the carrier rack 22A to the first racks 51f-51h of the sixth to eighth stories 33f-33h.

Each of the treating sections 41 of the sixth to eighth stories 33f-33h performs the first treatment on the wafers W.

The transport device 73 of the interface division 71 transports the wafers W from the second racks 56f-56h of the sixth to eighth stories 33f-33h to the exposing machine EXP. Further, the transport device 73 transports the wafers W from the exposing machine EXP to the second racks 56d-56e of the fourth and fifth stories 33d-33e.

Each of the treating sections 41 of the fourth and fifth stories 33d-33e performs the developing treatment (more particularly, the organic developing treatment) on the wafers W.

The second transport mechanism 27 performs the retrieving operation. Specifically, the second transport mechanism 27 transports the wafers W from the first racks 51d-51e of the fourth and fifth stories 33d-33e to the carrier C placed on the carrier rack 22B.

Although not shown, the substrate treating apparatus 1 according to the second modified embodiment can perform operations other than the first to third examples of operation.

For example, the substrate treating apparatus 1 according to the second modified embodiment can perform a fourth example of operation which corresponds to a combination of the first example of operation and the second example of operation. In the fourth example of operation, for example, the first treatment, second treatment, and third treatment are performed in this order on the first wafers W, and the first treatment and third embodiment are performed in this order on the second wafers W.

For example, the substrate treating apparatus 1 according to the second modified embodiment can perform a fifth example of operation which corresponds to a combination of the first example of operation and third example of operation. In the fifth example of operation, for example, the first treatment, second treatment, and third treatment are performed in this order on the first wafers W, and the first treatment and the developing treatment on the fourth and fifth stories 33d-33e are performed in this order on the second wafers W.

For example, the substrate treating apparatus 1 according to the second modified embodiment can perform a sixth example of operation which corresponds to a combination of the first example of operation, second example of operation, and third example of operation. In the sixth example of operation, for example, the first treatment, second treatment, and third treatment are performed in this order on the first wafers W, the first treatment and third embodiment are performed in this order on the second wafers W, and the first treatment and the developing treatment on the fourth and fifth stories 33d-33e are performed in this order on the third wafers W.

For example, the substrate treating apparatus 1 according to the second modified embodiment can perform a seventh example of operation which corresponds to a combination of the second example of operation and third example of operation. In the seventh example of operation, for example, the first treatment and third treatment are performed in this order on the first wafers W, and the first treatment and the developing treatment on the fourth and fifth stories 33d-33e are performed in this order on the second wafers W.

In the fourth to sixth examples of operation, for example, the first transport mechanism 26 performs the feeding operation and inter-story transporting operation. In the inter-story transporting operation, the first transport mechanism 26 transports the first wafers W from one or two of the stories 33f-33h where the first treatment is performed to one or two of the stories 33d-33e where the second treatment is performed. The second transport mechanism 27 performs the retrieving operation, for example.

In the seventh example of operation, for example, the first transport mechanism 26 performs the feeding operation. The second transport mechanism 27 performs the retrieving operation, for example. In the seventh example of operation, however, the transport device 25 does not perform the inter-story transporting operation.

With the second modified embodiment also, as described above, the footprint of the substrate treating apparatus 1 can be reduced, and the throughput of the substrate treating apparatus 1 can be improved.

Third Modified Embodiment

Figure 25:
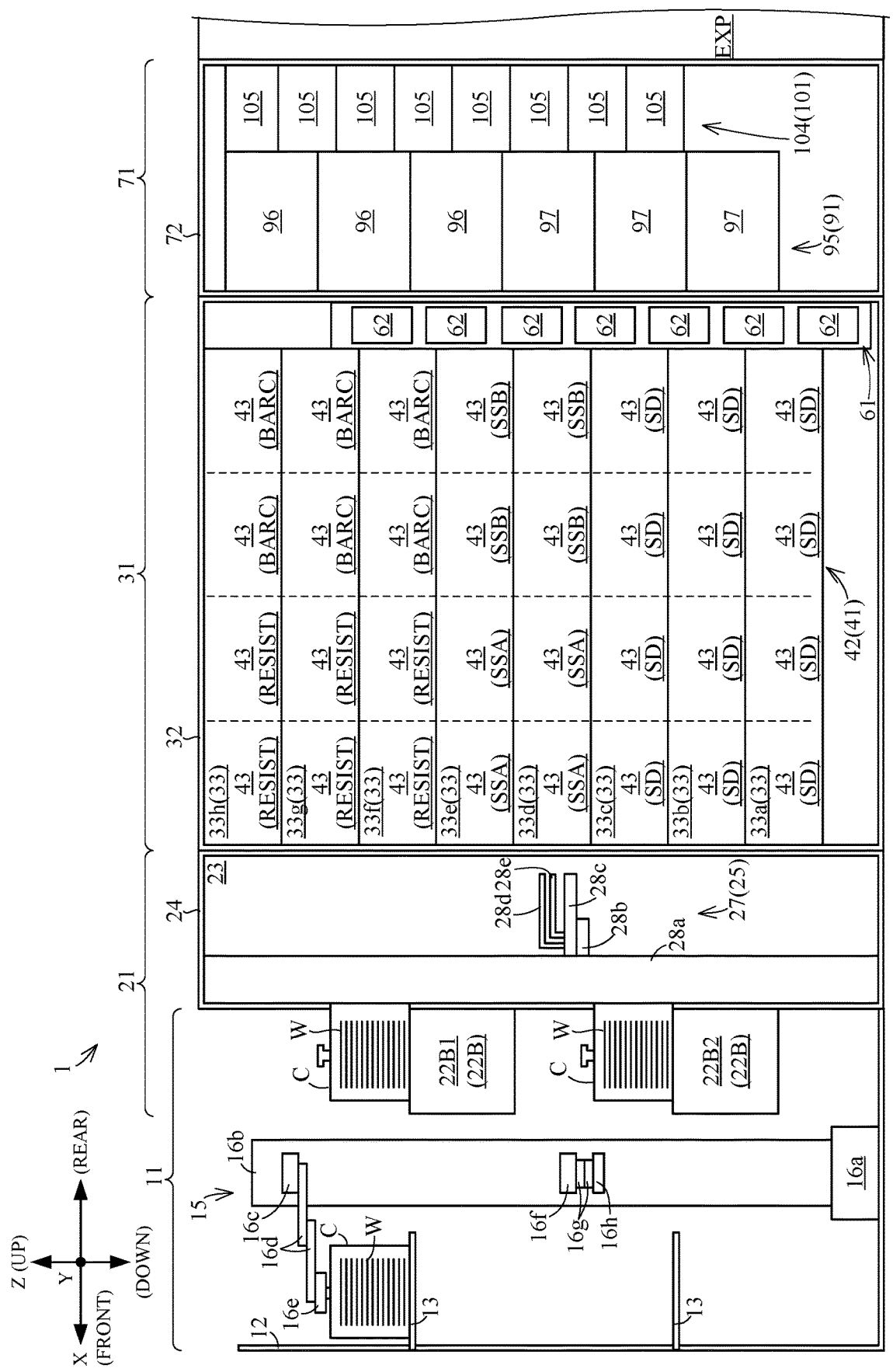
FIG. 25 is a left side view showing a construction of a left part of a substrate treating apparatus according to a third modified embodiment.

FIG. 25 is a left side view showing the construction of a left part of a substrate treating apparatus 1 according to the third modified embodiment. The substrate treating apparatus 1 according to the third modified embodiment has more stories that perform the first treatment than in the second embodiment. The substrate treating apparatus 1 according to the third modified embodiment has more stories that perform the third treatment than in the second embodiment. The second treatment in the second modified embodiment includes cleaning treatment. In the second modified embodiment, the treating sections 41 of the stories 33 that perform the second treatment do not perform the developing treatment.

Specifically, the treating sections 41 of the sixth to eighth stories 33f-33h perform the same treatment on the wafers W. The treating sections 41 of the sixth to eighth stories 33f-33h perform a first treatment on wafers W, respectively. The first treatment includes resist film forming treatment. The first treatment may further include antireflection film forming treatment. The first treatment may not include the antireflection film forming treatment. Each of the treating sections 41 of the sixth to eighth stories 33f-33h has two antireflection film coating units BARC and two resist film coating units RESIST.

The treating sections 41 of the fourth and fifth stories 33d-33e perform the same treatment on wafers W. The treating sections 41 of the fourth and fifth stories 33d-33e perform a second treatment on the wafers W, respectively. The second treatment includes cleaning treatment. The cleaning treatment specifically includes at least one of first cleaning treatment and second cleaning treatment. Both the first cleaning treatment and second cleaning treatment clean the wafers W by supplying the wafers W with a cleaning liquid. The first cleaning treatment cleans the front surface of each wafer W. The second cleaning treatment cleans at least one of the back surface and edge region of each wafer W. At least one of the first cleaning treatment and second cleaning treatment may clean the wafers W while rotating the wafers W, or may clean the wafers W without rotating the wafers W. At least one of the first cleaning treatment and second cleaning treatment may clean the wafers W using brushes, or may clean the wafers W without using brushes. At least one of the first cleaning treatment and second cleaning treatment may clean the wafers W with brushes contacting the wafers W. At least one of the first cleaning treatment and second cleaning treatment may dry the wafers W after cleaning the wafers W. Each of the treating sections 41 of the fourth and fifth stories 33d-33e has two first cleaning units SSA for performing the first cleaning treatment, and two second cleaning units SSB for performing the second cleaning treatment.

The treating sections 41 of the first to third stories 33a-33c perform the same treatment on wafers W. The treating sections 41 of the first to third stories 33a-33c perform a third treatment on wafers W, respectively. The third treatment includes developing treatment. The developing treatment included in the third treatment is alkaline developing treatment, for example. Alternatively, the developing treatment included in the third treatment may be organic developing treatment. Each of the treating sections 41 of the first to third stories 33a-33c has four developing units SD.

The first treatment is different from the second treatment. The first treatment is different from the third treatment. The second treatment is different from the third treatment. The first treatment does not include cleaning treatment or developing treatment. The second treatment does not include antireflection film forming treatment, resist film forming treatment, or developing treatment. The third treatment does not include antireflection film forming treatment, resist film forming treatment, or cleaning treatment.

The antireflection film forming treatment and resist film forming treatment are an example of the first solution treatment in this invention. The antireflection film forming treatment and resist film forming treatment are an example of the first pre-exposure treatment in this invention. The cleaning treatment is an example of the second solution treatment in this invention. The cleaning treatment is an example of the second pre-exposure treatment in this invention.

The sixth to eighth stories 33f-33h are an example of the "stories for performing the first treatment" in this invention. The fourth and fifth stories 33d-33e are an example of the "stories for performing the second treatment" in this invention. The first to third stories 33a-33c are an example of the "stories for performing the third treatment" in this invention.

Figure 26A:
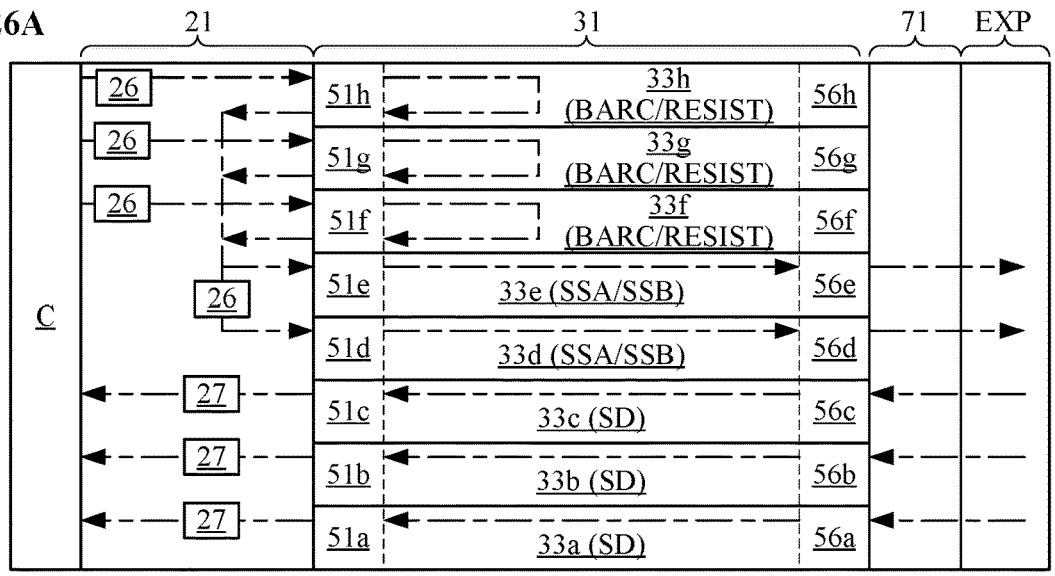
FIGS. 26A, 26B, and 26C are views schematically showing an outline of substrate transport routes.
Figure 26B:
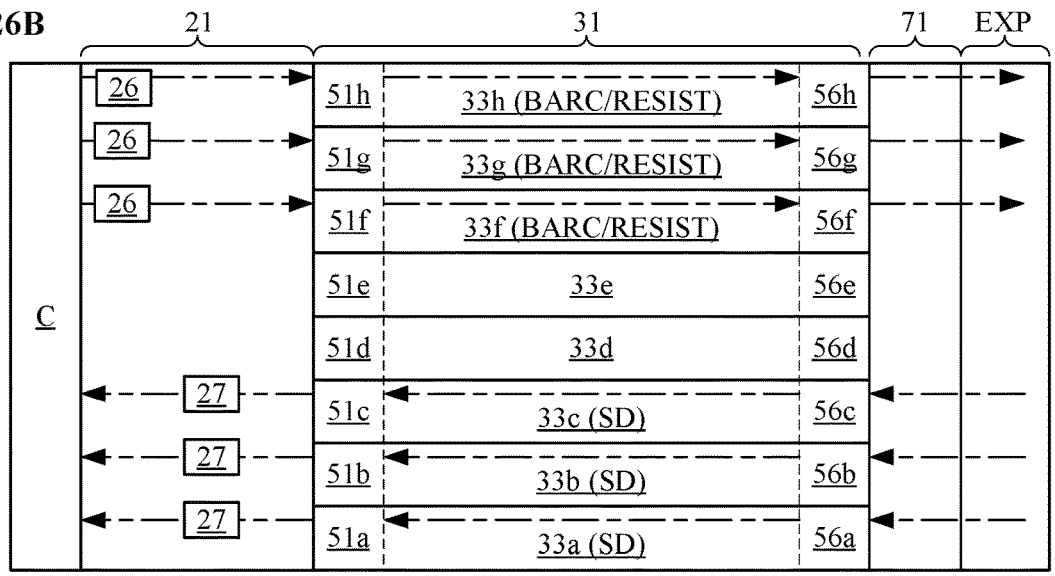
Figure 26C:
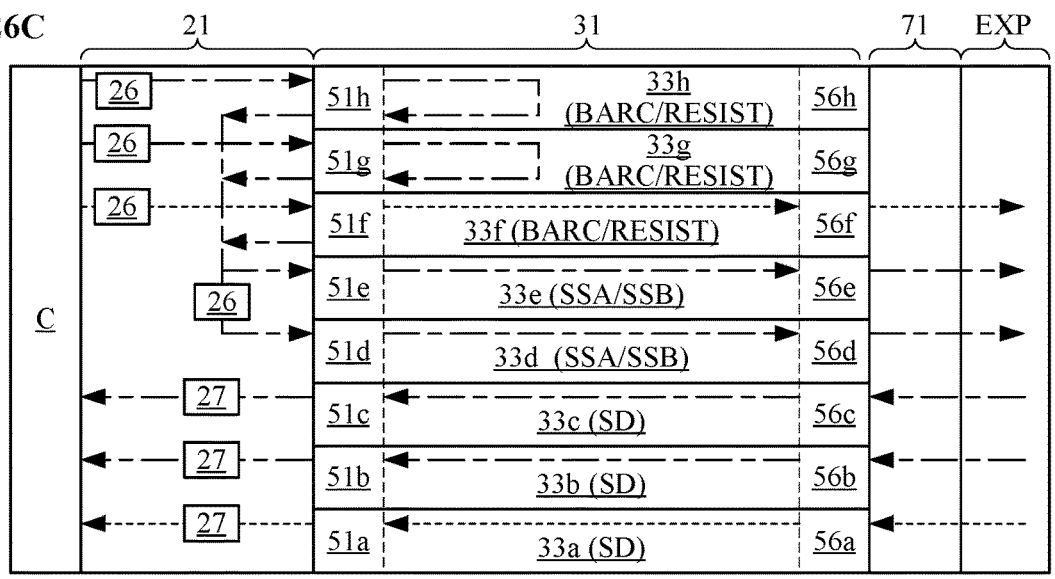

FIGS. 26A-26C are views each schematically showing an outline of transport routes of the wafers W. Examples of operation of the substrate treating apparatus 1 according to the third modified embodiment will be described hereinafter.

FIG. 26A shows a first example of operation. FIG. 26A schematically shows transport routes of the wafers W in chain lines. In the first example of operation, the first transport mechanism 26 performs the feeding operation and inter-story transporting operation. The second transport mechanism 27 performs the retrieving operation. Consequently, the first treatment, second treatment, and third treatment are performed in this order on the wafers W. The first example of operation will be described specifically hereinafter.

The first transport mechanism 26 performs the feeding operation. Specifically, the first transport mechanism 26 transports wafers W from the carrier C placed on the carrier rack 22A to the first racks 51f-51h of the sixth to eighth stories 33f-33h.

Each of the treating sections 41 of the sixth to eighth stories 33f-33h performs the first treatment (more particularly, treatment including the resist film forming treatment) on the wafers W.

The first transport mechanism 26 performs the inter-story transporting operation. Specifically, the first transport mechanism 26 transports the wafers W from the first racks 51f-51h of the sixth to eighth stories 33f-33h to the first racks 51d-51e of the fourth and fifth stories 33d-33e.

Each of the treating sections 41 of the fourth and fifth stories 33d-33e performs the second treatment (more particularly, treatment including the cleaning treatment) on the wafers W.

Here, each of the treating sections 41 of the fourth and fifth stories 33d-33e performs at least one of the first cleaning treatment and second cleaning treatment on the wafers W. For example, each of the treating sections 41 of the fourth and fifth stories 33d-33e may perform only the first cleaning treatment on the wafers W, and may not perform the second cleaning treatment on the wafers W. For example, each of the treating sections 41 of the fourth and fifth stories 33d-33e may perform only the second cleaning treatment on the wafers W, and may not perform the first cleaning treatment on the wafers W. For example, each of the treating sections 41 of the fourth and fifth stories 33d-33e may perform both the first cleaning treatment and second cleaning treatment on the wafers W. In this case, each of the treating sections 41 of the fourth and fifth stories 33d-33e may perform the first cleaning treatment and second cleaning treatment in this order on the wafers W. Alternatively, each of the treating sections 41 of the fourth and fifth stories 33d-33e may perform the second cleaning treatment and first cleaning treatment in this order on the wafers W.

The transport device 73 of the interface division 71 transports the wafers W from the second racks 56d-56e of the fourth and fifth stories 33d-33e to the exposing machine EXP. Further, the transport device 73 transports the wafers W from the exposing machine EXP to the second racks 56a-56c of the first to third stories 33a-33c.

Each of the treating sections 41 of the first to third stories 33a-33c performs the third treatment (more particularly, treatment including the developing treatment) on the wafers W.

The second transport mechanism 27 performs the retrieving operation. Specifically, the second transport mechanism 27 transports the wafers W from the first racks 51a-51c of the first to third stories 33a-33c to the carrier C placed on the carrier rack 22B.

FIG. 26B shows a second example of operation. FIG. 26B schematically shows transport routes of the wafers W in chain lines. In the second example of operation, the first transport mechanism 26 performs the feeding operation. The second transport mechanism 27 performs the retrieving operation. In the second example of operation, however, the transport device 25 does not perform the inter-story transporting operation. Consequently, the first treatment and third treatment are performed in this order on the wafers W. However, the second treatment is not performed on the wafers W. The second example of operation will be described specifically hereinafter.

The first transport mechanism 26 performs the feeding operation. Specifically, the first transport mechanism 26 transports wafers W from the carrier C placed on the carrier rack 22A to the first racks 51f-51h of the sixth to eighth stories 33f-33h.

Each of the treating sections 41 of the sixth to eighth stories 33f-33h performs the first treatment on the wafers W.

The transport device 73 of the interface division 71 transports the wafers W from the second racks 56f-56h of the sixth to eighth stories 33f-33h to the exposing machine EXP. Further, the transport device 73 transports the wafers W from the exposing machine EXP to the second racks 56a-56c of the first to third stories 33a-33c.

Each of the treating sections 41 of the first to third stories 33a-33c performs the third treatment on the wafers W.

The second transport mechanism 27 performs the retrieving operation. Specifically, the second transport mechanism 27 transports the wafers W from the first racks 51a-51c of the first to third stories 33a-33c to the carrier C placed on the carrier rack 22B.

FIG. 26C shows a third example of operation. FIG. 26C schematically shows transport routes of the first wafers W in chain lines, and schematically shows transport routes of the second wafers W in broken lines. The third example of operation corresponds to a combination of the first example of operation and the second example of operation. In the third example of operation, the first transport mechanism 26 performs the feeding operation and inter-story transport operation. The second transport mechanism 27 performs the retrieving operation. Consequently, the first treatment, second treatment, and third treatment are performed in this order on the first wafers W, and the first treatment and third treatment are performed in this order on the second wafers W. However, the second treatment is not performed on the second wafers W. The third example of operation will be described specifically hereinafter.

The first transport mechanism 26 performs the feeding operation. Specifically, the first transport mechanism 26 transports the first wafers W from the carrier C placed on the carrier rack 22A to the first racks 51g-51h of the seventh and eighth stories 33g-33h. The first transport mechanism 26 transports the second wafers W from the carrier C placed on the carrier rack 22A to the first rack 51f of the sixth story 33f.

Each of the treating sections 41 of the seventh and eighth stories 33g-33h performs the first treatment on the first wafers W. The treating section 41 of the sixth story 33f performs the first treatment on the second wafers W.

The first transport mechanism 26 performs the inter-story transporting operation. Specifically, the first transport mechanism 26 transports the first wafers W from the first racks 51g-51h of the seventh and eighth stories 33g-33h to the first racks 51d-51e of the fourth and fifth stories 33d-33e.

Each of the treating sections 41 of the fourth and fifth stories 33d-33e performs the second treatment on the first wafers W.

The transport device 73 of the interface division 71 transports the first wafers W from the second racks 56d-56e of the fourth and fifth stories 33d-33e to the exposing machine EXP. The transport device 73 transports the second wafers W from the second rack 56f of the sixth story 33f to the exposing machine EXP. Further, the transport device 73 transports the first wafers W from the exposing machine EXP to the second racks 56b-56c of the second and third stories 33b-33c. The transport device 73 transports the second wafers W from the exposing machine EXP to the second rack 56a of the first story 33a.

Each of the treating sections 41 of the second and third stories 33b-33c performs the third treatment on the first wafers W. The treating section 41 of the first story 33a performs the third treatment on the second wafers W.

The second transport mechanism 27 performs the retrieving operation. Specifically, the second transport mechanism 27 transports the first wafers W from the first racks 51b-51c of the second and third stories 33b-33c to the carrier C placed on the carrier rack 22B. The second transport mechanism 27 transports the second wafers W from the first rack 51a of the first story 33a to the carrier C placed on the carrier rack 22B.

With the third modified embodiment also, as described above, the footprint of the substrate treating apparatus 1 can be reduced, and the throughput of the substrate treating apparatus 1 can be improved.

The fourth and fifth stories 33d-33e in the third modified embodiment may be further varied as follows. That is, the second treatment performed on the fourth and fifth stories 33d-33e may include protective film forming treatment in addition to the cleaning treatment. In this case, the protective film forming treatment and cleaning treatment are an example of the second solution treatment in this invention. The protective film forming treatment and cleaning treatment are an example of the second pre-exposure treatment in this invention.

For example, the second treatment may include the protective film forming treatment, first cleaning treatment, and second cleaning treatment. Each of the fourth and fifth stories 33*d*-33*e* may have first cleaning units SSA, second cleaning units SSB and protective film forming units TC.

For example, the second treatment may include the protective film forming treatment and first cleaning treatment, and may not include the second cleaning treatment. Each of the fourth and fifth stories 33*d*-33*e* may have the first cleaning units SSA and protective film forming units TC. Each of the fourth and fifth stories 33*d*-33*e* may not include the second cleaning units SSB.

For example, the second treatment may include the protective film forming treatment and second cleaning treatment, and may not include the first cleaning treatment. Each of the fourth and fifth stories 33*d*-33*e* may have the second cleaning units SSB and protective film forming units TC. Each of the fourth and fifth stories 33*d*-33*e* may not include the first cleaning units SSA.

Fourth Modified Embodiment

Figure 27:
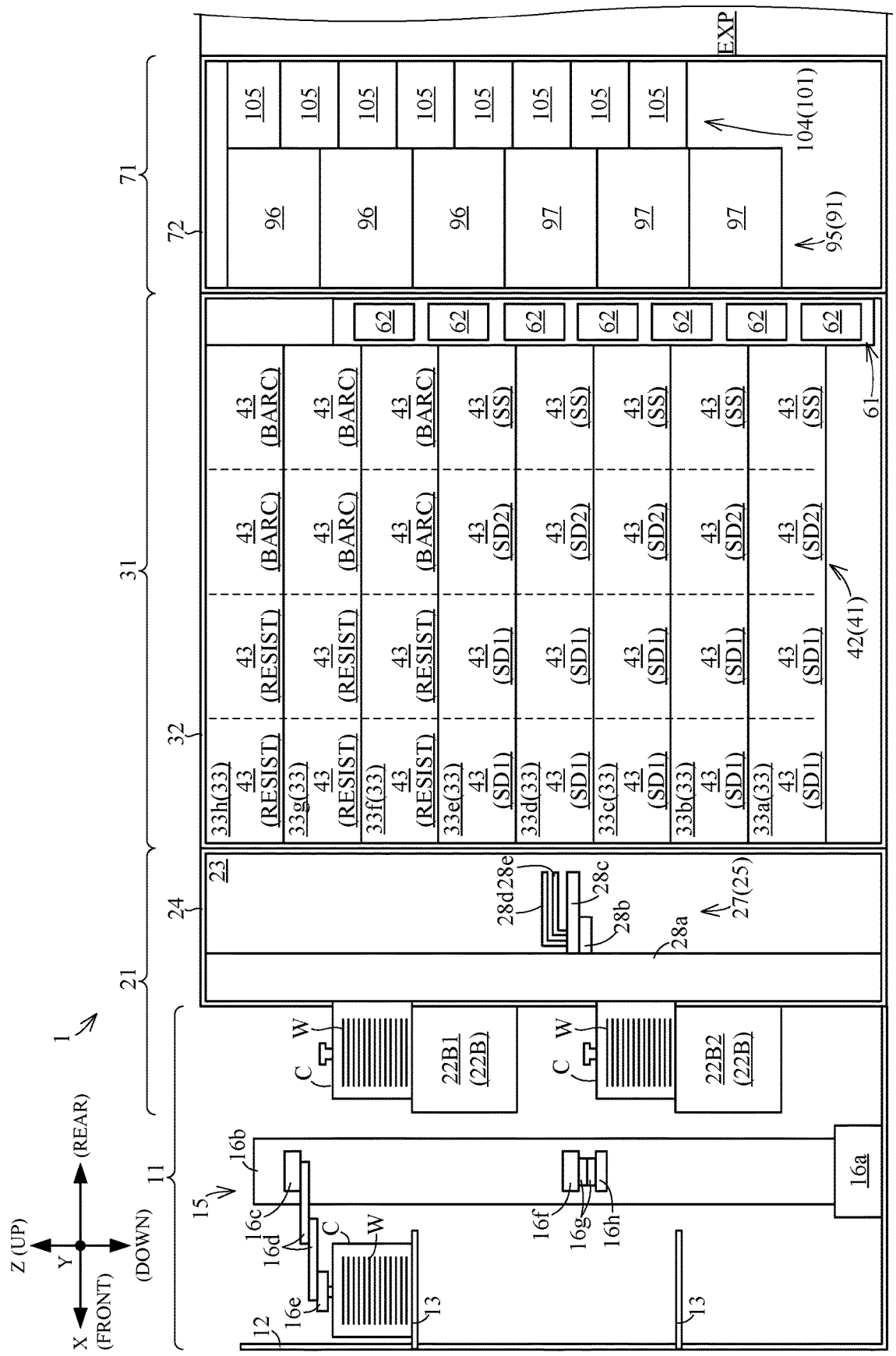
FIG. 27 is a left side view showing a construction of a left part of a substrate treating apparatus according to a fourth modified embodiment.

FIG. 27 is a left side view showing the construction of a left part of a substrate treating apparatus 1 according to the fourth modified embodiment. The substrate treating apparatus 1 according to the fourth modified embodiment has more stories that perform the first treatment than in the second embodiment. The substrate treating apparatus 1 according to the fourth modified embodiment has more stories that perform the second treatment than in the second embodiment. In the fourth modified embodiment, the treating sections 41 of the stories 33 that perform the second treatment can further perform two types of developing treatment. The substrate treating apparatus 1 according to the fourth modified embodiment does not include the stories that perform the third treatment.

Specifically, the treating sections 41 of the sixth to eighth stories 33*f*-33*h* perform the same treatment on the wafers W. The treating sections 41 of the sixth to eighth stories 33*f*-33*h* perform a first treatment on wafers W, respectively. The first treatment includes resist film forming treatment. The first treatment may further include antireflection film forming treatment. The first treatment may not include the antireflection film forming treatment. Each of the treating sections 41 of the sixth to eighth stories 33*f*-33*h* has two antireflection film coating units BARC and two resist film coating units RESIST.

The treating sections 41 of the first to fifth stories 33*a*-33*e* perform the same treatment on wafers W. The treating sections 41 of the first to fifth stories 33*a*-33*e* perform a second treatment and developing treatment on the wafers W, respectively. The second treatment includes cleaning treatment. The developing treatment on the first to fifth stories 33*a*-33*e*, specifically, is performed by selecting one of the alkaline developing treatment and organic developing treatment. Each of the treating sections 41 of the first to fifth stories 33*a*-33*e* has one first cleaning unit SS, two alkaline treating units SD1, and one organic developing unit SD2.

The first treatment is different from the second treatment. The first treatment does not include cleaning treatment or developing treatment. The second treatment does not include antireflection film forming treatment, resist film forming treatment, or developing treatment.

The antireflection film forming treatment and resist film forming treatment are an example of the first solution treatment in this invention. The antireflection film forming treatment and resist film forming treatment are an example of the first pre-exposure treatment in this invention. The cleaning treatment is an example of the second solution treatment in this invention. The cleaning treatment is an example of the second pre-exposure treatment in this invention.

The sixth to eighth stories 33*f*-33*h* are an example of the "stories for performing the first treatment" in this invention. The first to fifth stories 33*a*-33*e* are an example of the "stories for performing the second treatment" in this invention.

Figure 28A:
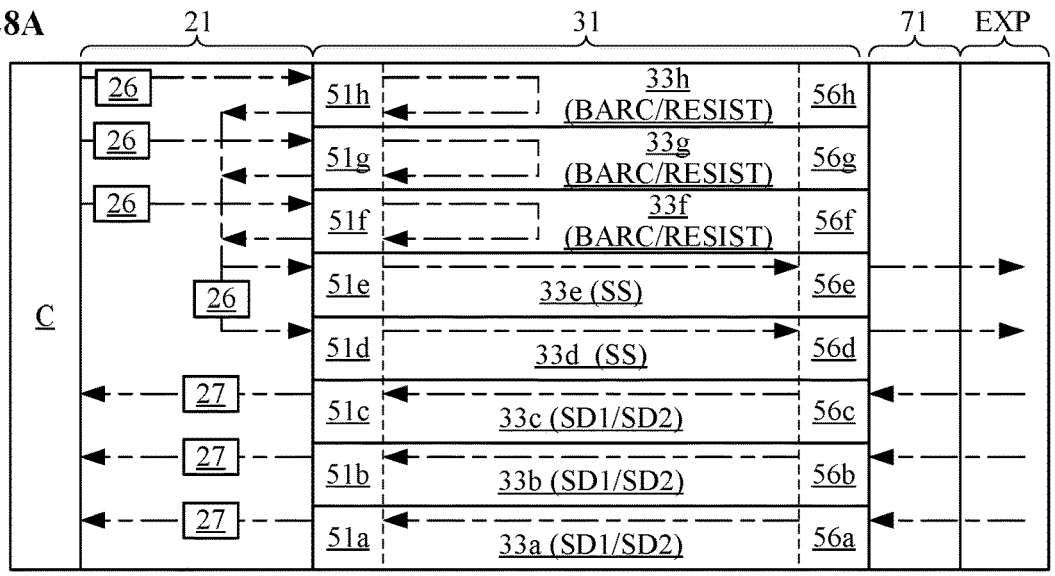
FIGS. 28A, 28B, and 28C are views schematically showing an outline of substrate transport routes.
Figure 28B:
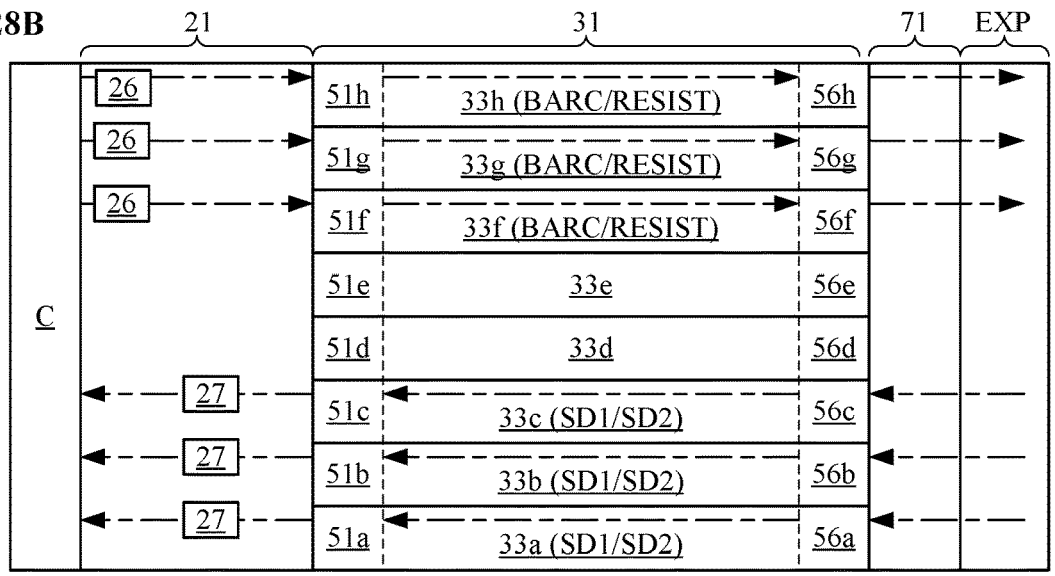
Figure 28C:
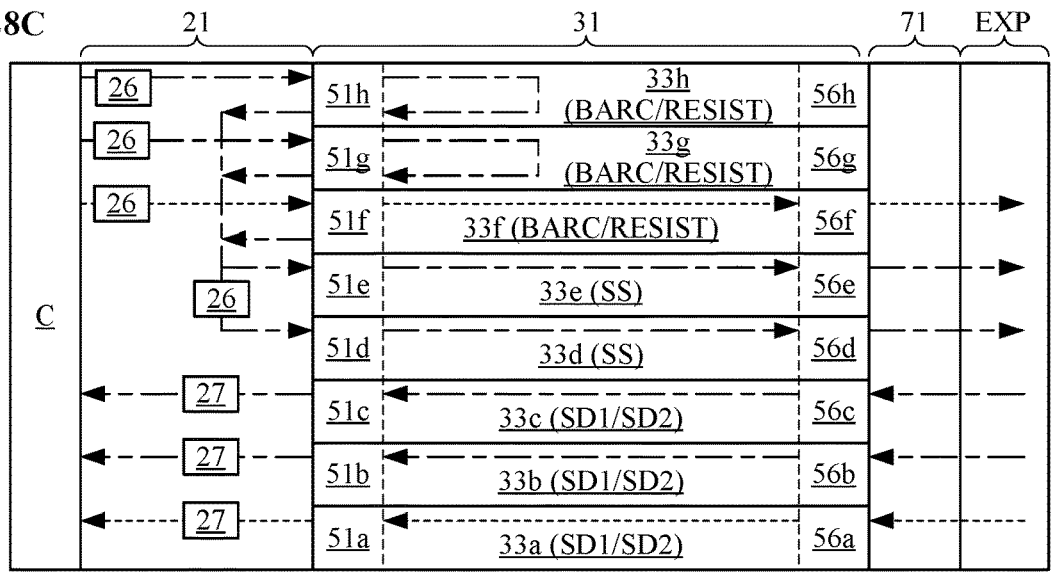

FIGS. 28A-28C are views each schematically showing an outline of transport routes of the wafers W. Examples of operation of the substrate treating apparatus 1 according to the fourth modified embodiment will be described hereinafter.

FIG. 28A shows a first example of operation. FIG. 28A schematically shows transport routes of the wafers W in chain lines. In the first example of operation, the first transport mechanism 26 performs the feeding operation and inter-story transporting operation. The second transport mechanism 27 performs the retrieving operation. Consequently, the first treatment and second treatment are performed in this order on the wafers W. Subsequently, the developing treatment on the first to fifth stories 33*a*-33*e* is performed on the wafers W. The first example of operation will be described specifically hereinafter.

The first transport mechanism 26 performs the feeding operation. Specifically, the first transport mechanism 26 transports wafers W from the carrier C placed on the carrier rack 22A to the first racks 51*f*-51*h* of the sixth to eighth stories 33*f*-33*h*.

Each of the treating sections 41 of the sixth to eighth stories 33*f*-33*h* performs the first treatment (more particularly, treatment including the resist film forming treatment) on the wafers W.

The first transport mechanism 26 performs the inter-story transporting operation. Specifically, the first transport mechanism 26 transports the wafers W from the first racks 51*f*-51*h* of the sixth to eighth stories 33*f*-33*h* to the first racks 51*d*-51*e* of the fourth and fifth stories 33*d*-33*e*.

Each of the treating sections 41 of the fourth and fifth stories 33*d*-33*e* performs the second treatment (more particularly, treatment including the cleaning treatment) on the wafers W.

The transport device 73 of the interface division 71 transports the wafers W from the second racks 56*d*-56*e* of the fourth and fifth stories 33*d*-33*e* to the exposing machine EXP. Further, the transport device 73 transports the wafers W from the exposing machine EXP to the second racks 56*a*-56*c* of the first to third stories 33*a*-33*c*.

Each of the treating sections 41 of the first to third stories 33*a*-33*c* performs the developing treatment on the wafers W.

More particularly, each of the treating sections 41 of the first to third stories 33*a*-33*c* performs one of the alkaline developing treatment and organic developing treatment on the wafers W. For example, on the first to third stories 33*a*-33*c*, the alkaline developing treatment may be performed on the wafers W. For example, on the first to third stories 33*a*-33*c*, the organic developing treatment may be performed on the wafers W. For example, the alkaline developing treatment may be performed on the wafer W on part of the first to third stories 33*a*-33*c*, and the organic developing treatment may be performed on the wafers W on other part of the first to third stories 33*a*-33*c*. The developing treatment on the first to third stories 33*a*-33*c* may be performed similarly also in the other examples of operation described hereinafter.

The second transport mechanism 27 performs the retrieving operation. Specifically, the second transport mechanism 27 transports the wafers W from the first racks 51*a*-51*c* of the first to third stories 33*a*-33*c* to the carrier C placed on the carrier rack 22B.

FIG. 28B shows a second example of operation. FIG. 28B schematically shows transport routes of the wafers W in chain lines. In the second example of operation, the first transport mechanism 26 performs the feeding operation. The second transport mechanism 27 performs the retrieving operation. In the second example of operation, however, the transport device 25 does not perform the inter-story transporting operation. Consequently, the first treatment is performed on the wafers W. Subsequently, the developing treatment on the first to fifth stories 33*a*-33*e* is performed on the wafers W. However, the second treatment is not performed on the wafers W. The second example of operation will be described specifically hereinafter.

The first transport mechanism 26 performs the feeding operation. Specifically, the first transport mechanism 26 transports wafers W from the carrier C placed on the carrier rack 22A to the first racks 51*f*-51*h* of the sixth to eighth stories 33*f*-33*h*.

Each of the treating sections 41 of the sixth to eighth stories 33*f*-33*h* performs the first treatment on the wafers W.

The transport device 73 of the interface division 71 transports the wafers W from the second racks 56*f*-56*h* of the sixth to eighth stories 33*f*-33*h* to the exposing machine EXP. Further, the transport device 73 transports the wafers W from the exposing machine EXP to the second racks 56*a*-56*c* of the first to third stories 33*a*-33*c*.

Each of the treating sections 41 of the first to third stories 33*a*-33*c* performs the developing treatment on the wafers W.

The second transport mechanism 27 performs the retrieving operation. Specifically, the second transport mechanism 27 transports the wafers W from the first racks 51*a*-51*c* of the first to third stories 33*a*-33*c* to the carrier C placed on the carrier rack 22B.

FIG. 28C shows a third example of operation. FIG. 28C schematically shows transport routes of first wafers W in chain lines, and schematically shows transport routes of second wafers W in broken lines. The third example of operation corresponds to a combination of the first example of operation and the second example of operation. In the third example of operation, the first transport mechanism 26 performs the feeding operation and inter-story transport operation. The second transport mechanism 27 performs the retrieving operation. Consequently, the first treatment and second treatment are performed in this order on the first wafers W, and the first treatment is performed on the second wafers W. Subsequently, the developing treatment on the first and third stories 33*a*-33*c* is performed on the first wafers W and second wafers W. However, the second treatment is not performed on the second wafers W. The third example of operation will be described specifically hereinafter.

The first transport mechanism 26 performs the feeding operation. Specifically, the first transport mechanism 26 transports the first wafers W from the carrier C placed on the carrier rack 22A to the first racks 51*g*-51*h* of the seventh and eighth stories 33*g*-33*h*. The first transport mechanism 26 transports the second wafers W from the carrier C placed on the carrier rack 22A to the first rack 51*f* of the sixth story 33*f*.

Each of the treating sections 41 of the seventh and eighth stories 33*g*-33*h* performs the first treatment on the first wafers W. The treating section 41 of the sixth story 33*f* performs the first treatment on the second wafers W.

The first transport mechanism 26 performs the inter-story transporting operation. Specifically, the first transport mechanism 26 transports the first wafers W from the first racks 51*g*-51*h* of the seventh and eighth stories 33*g*-33*h* to the first racks 51*d*-51*e* of the fourth and fifth stories 33*d*-33*e*.

Each of the treating sections 41 of the fourth and fifth stories 33*d*-33*e* performs the second treatment on the first wafers W.

The transport device 73 of the interface division 71 transports the first wafers W from the second racks 56*d*-56*e* of the fourth and fifth stories 33*d*-33*e* to the exposing machine EXP. The transport device 73 transports the second wafers W from the second rack 56*f* of the sixth story 33*f* to the exposing machine EXP. Further, the transport device 73 transports the first wafers W from the exposing machine EXP to the second racks 56*b*-56*c* of the second and third stories 33*b*-33*c*. The transport device 73 transports the second wafers W from the exposing machine EXP to the second rack 56*a* of the first story 33*a*.

Each of the treating sections 41 of the second and third stories 33*b*-33*c* performs the developing treatment on the first wafers W. The treating section 41 of the first story 33*a* performs the developing treatment on the second wafers W.

The second transport mechanism 27 performs the retrieving operation. Specifically, the second transport mechanism 27 transports the first wafers W from the first racks 51*b*-51*c* of the second and third stories 33*b*-33*c* to the carrier C placed on the carrier rack 22B. The second transport mechanism 27 transports the second wafers W from the first rack 51*a* of the first story 33*a* to the carrier C placed on the carrier rack 22B.

With the fourth modified embodiment also, as described above, the footprint of the substrate treating apparatus 1 can be reduced, and the throughput of the substrate treating apparatus 1 can be improved.

The first to fifth stories 33*a*-33*e* in the fourth modified embodiment may be further varied as follows.

For example, the cleaning treatment included in the second treatment may be any one of first cleaning treatment and second cleaning treatment. Here, the first cleaning treatment cleans the front surface of each wafer W. The second cleaning treatment cleans at least one of the back surface and edge region of each wafer W. Specifically, each cleaning unit SS may be any one of a first cleaning unit SSA and a second cleaning unit SSB. Each of the first to fifth stories 33*a*-33*e* may have one first cleaning unit SSA, two alkaline developing units SD1, and one organic developing unit SD2. Alternatively, each of the first to fifth stories 33*a*-33*e* may have one second cleaning unit SSB, two alkaline developing units SD1, and one organic developing unit SD2.

For example, the cleaning treatment included in the second treatment may include both the first cleaning treatment and second cleaning treatment. Specifically, each of the first to fifth stories 33*a*-33*e* may have one first cleaning unit SSA, one second cleaning unit SSB, one alkaline developing unit SD1, and one organic developing unit SD2. In this case, the organic developing unit SD2 may be omitted. That is, each of the first to fifth stories 33*a*-33*e* may have one first cleaning unit SSA, one second cleaning unit SSB, and two alkaline developing units SD1. Alternatively, the alkaline developing unit SD1 may be omitted. That is, each of the first to fifth stories 33*a*-33*e* may have one first cleaning unit SSA, one second cleaning unit SSB, and two organic developing units SD2.

For example, the second treatment may include the protective film forming treatment in addition to the cleaning treatment. Specifically, the second treatment may include the protective film forming treatment and cleaning treatment.

Each of the first to fifth stories 33a-33e may have one cleaning unit SS, one protective film forming unit TC, one alkaline developing unit SD1, and one organic developing unit SD2. In this case, the organic developing unit SD2 may be omitted. That is, each of the first to fifth stories 33a-33e may have one cleaning unit SS, one protective film forming unit TC, and two alkaline developing units SD1. Alternatively, the alkaline developing unit SD1 may be omitted. That is, each of the first to fifth stories 33a-33e may have one cleaning unit SS, one protective film forming unit TC, and two organic developing units SD2.

For example, the developing treatment performed on the first to fifth stories 33a-33e may include the alkaline developing treatment, and not the organic developing treatment. Specifically, each of the first to fifth stories 33a-33e may have one cleaning unit SS, and three alkaline developing units SD1. Alternatively, each of the first to fifth stories 33a-33e may have two cleaning units SS, and two alkaline developing units SD1.

For example, the developing treatment performed on the first to fifth stories 33a-33e may include the organic developing treatment, and not the alkaline developing treatment. Specifically, each of the first to fifth stories 33a-33e may have one cleaning unit SS, and three organic developing units SD2. Alternatively, each of the first to fifth stories 33a-33e may have two cleaning units SS, and two organic developing units SD2.

In the fourth example of operation in the first modified embodiment described hereinbefore, the feeding operation takes the first wafers W and second wafers W from the carrier C placed on the carrier rack 22A. Here, the feeding operation may take the first wafers W and second wafers W from different carriers C. For example, the first wafers W may be taken from a first carrier C, and the second wafers W from a second carrier C different from the first carrier C. Or the feeding operation may take the first wafers W and second wafers W from the same carrier C. In the other examples of operation in the first to fourth modified embodiments which perform treatment on the first wafers W and second wafers W, the feeding operation may be performed similarly.

In the fourth example of operation in the first modified embodiment described hereinbefore, the retrieving operation loads the first wafers W and second wafers W into the carrier C placed on the carrier rack 22B. Here, the retrieving operation may load the first wafers W and second wafers W into different carriers C. For example, the first wafers W may be loaded into a first carrier C, and the second wafers W into a second carrier C different from the first carrier C. Or the retrieving operation may load the first wafers W and second wafers W into the same carrier C. In the other examples of operation in the first to fourth modified embodiments which perform treatment on the first wafers W and second wafers W, the retrieving operation may be performed similarly.

In each example of operation in the first to fourth modified embodiments described hereinbefore, the wafers W, after the second treatment, receive the third treatment, or the developing treatment on the story 33 on which the second treatment has been performed. However, the invention is not limited to this. For example, the wafers W may be retrieved to the carrier C without further treatment after the second treatment. In each example of operation in the first to fourth modified embodiments described hereinbefore, the wafers W, after the second treatment, are transported to the exposing machine EXP. However, the invention is not limited to this. For example, the wafers W may be retrieved to the carrier C, without being transported the exposing machine EXP, after the second treatment performed on the wafers W.

In the first and second embodiments described hereinbefore, the first feed rack 52 is constructed capable of receiving four wafers W. However, the invention is not limited to this. The first feed rack 52 may be constructed capable of receiving five or more wafers W. For example, the first feed rack 52 may have five or more rack units 54. Similarly, the construction of the second feed rack 57 may be varied.

In the first and second embodiments described hereinbefore, the first return rack 53 is constructed capable of receiving four wafers W. However, the invention is not limited to this. The first return rack 53 may be constructed capable of receiving five or more wafers W. For example, the return feed rack 53 may have five or more rack units 54. Similarly, the construction of the second return rack 58 may be varied.

In the first and second embodiments described hereinbefore, the first rack 51 is installed to join the transporting space 35 on each story 33 and the transporting space 23 of the indexer division 21. However, the invention is not limited to this. For example, the whole of first rack 51 may be located in the transporting space 35 on each story 33. For example, the whole of first rack 51 may be located in a place other than the transporting space 35 on each story 33. For example, the whole of first rack 51 may be located in the transporting space 23.

In the first and second embodiments described hereinbefore, the second rack 56 is installed to join the transporting space 35 on each story 33 and the interface division 71. However, the invention is not limited to this. For example, the whole of second rack 56 may be located in the transporting space 35 on each story 33. For example, the whole of second rack 56 may be located in a place other than the transporting space 35 on each story 33. For example, the whole of second rack 56 may be located in the interface division 71.

In the first and second embodiments described hereinbefore, the substrate treating apparatus 1 includes the interface division 71. However, the invention is not limited to this. The interface division 71 may be omitted.

In the second embodiment, the solution treating sections 42 of the fifth and sixth stories 33e-33f have the antireflection film coating units BARC and resist film coating units RESIST as solution treating units 43. Here, atmosphere may be shut off between the antireflection film coating units BARC and resist film coating units RESIST. For example, the antireflection film coating units BARC may be contained in a first chamber, and the resist film coating units RESIST in a second chamber different from the first chamber.

In the second embodiment, the solution treating sections 42 of the third and fourth stories 33c-33d have the protective film coating units TC and negative tone developing units NTD as solution treating units 43. Here, atmosphere may be shut off between the protective film coating units TC and negative tone developing units NTD. For example, the protective film coating units TC may be contained in a first chamber, and the negative tone developing units NTD in a second chamber different from the first chamber.

In the first and second embodiments described hereinbefore, the treating block 31 has the partition walls 34. However, the invention is not limited to this. The partition walls 34 may be omitted. In other words, the transporting spaces 35 of the stories 33 may communicate with one another. According to this modified embodiment, maintenance of the treating block 31 and stories 33 can be carried out easily.

The first and second embodiments and each of the modified embodiments described hereinbefore may be further varied as appropriate by replacing or combining each component with a component of another modified embodiment.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising:
an indexer division;
a plurality of stories arranged to align in an up-down direction; and
a controller for controlling the indexer division and the stories;
each of the stories including:
a first rack for receiving substrates;
a treating section for treating the substrates; and
a main transport mechanism for transporting the substrates to the first rack and the treating section;
the indexer division including:
a carrier rack for receiving a carrier; and
a transport device for transporting the substrates between the carrier placed on the carrier rack and the first rack;
the transport device of the indexer division having a first transport mechanism for performing at least one of a feeding operation for transporting the substrates from the carrier placed on the carrier rack to the first rack, and a retrieving operation for transporting the substrates from the first rack to the carrier placed on the carrier rack;
the first transport mechanism further performing an inter-story transporting operation for transporting the substrates between two of the first racks provided for different ones of the stories; wherein:
the treating section of at least one of the stories is configured to perform a first treatment on the substrates;
the treating section of at least another of the stories is configured to perform a second treatment different from the first treatment on the substrates;
the first transport mechanism transports the substrates between the first rack of the story performing the first treatment and the first rack of the story performing the second treatment the first treatment includes a first solution treatment; and
the second treatment includes a second solution treatment different from the first solution treatment.

2. The substrate treating apparatus according to claim 1, wherein:
the first treatment includes a first pre-exposure treatment performed before exposing treatment; and
the second treatment includes a second pre-exposure treatment different from the first pre-exposure treatment and performed before the exposing treatment.

3. The substrate treating apparatus according to claim 1, wherein the transport device of the indexer division is configured to transport the substrates from the carrier placed on the carrier rack to the first rack of the story performing the first treatment.

4. The substrate treating apparatus according to claim 1, wherein:
the number of the stories performing the first treatment is at least two; and the number of the stories performing the second treatment is at least two.

5. The substrate treating apparatus according to claim 1, wherein the first rack includes:
a first feed rack for receiving the substrates only from the transport device of the indexer division; and
a first return rack for receiving the substrates only from the main transport mechanism.

6. The substrate treating apparatus according to claim 5, wherein:
the transport device of the indexer division is configured to place two substrates on the first feed rack at the same time; and
the first feed rack is configured to be capable of receiving at least four substrates.

7. The substrate treating apparatus according to claim 5, wherein:
the transport device of the indexer division is configured to take two substrates from the first return rack at the same time; and
the first return rack is configured capable of receiving at least four substrates.

8. The substrate treating apparatus according to claim 1, wherein:
the first transport mechanism performs one of the feeding operation and the retrieving operation, and does not perform the other of the feeding operation and the retrieving operation; and
the transport device of the indexer division has a second transport mechanism which does not perform the one of the feeding operation and the retrieving operation, but performs the other of the feeding operation and the retrieving operation.

9. The substrate treating apparatus according to claim 8, wherein the second transport mechanism of the indexer division further performs the inter-story transporting operation.

10. A substrate treating apparatus comprising:
an indexer division;
a plurality of stories arranged to align in an up-down direction; and
a controller for controlling the indexer division and the stories;
each of the stories including:
a first rack for receiving substrates;
a treating section for treating the substrates; and
a main transport mechanism for transporting the substrates to the first rack and the treating section;
the indexer division including:
a carrier rack for receiving a carrier; and
a transport device for transporting the substrates between the carrier placed on the carrier rack and the first rack;
the transport device of the indexer division having a first transport mechanism for performing at least one of a feeding operation for transporting the substrates from the carrier placed on the carrier rack to the first rack, and a retrieving operation for transporting the substrates from the first rack to the carrier placed on the carrier rack;
the first transport mechanism further performing an inter-story transporting operation for transporting the substrates between two of the first racks provided for different ones of the stories; wherein:
the treating section of at least one of the stories is configured to perform a first treatment on the substrates;

the treating section of at least another of the stories is configured to perform a second treatment different from the first treatment on the substrates;

the first transport mechanism transports the substrates between the first rack of the story performing the first treatment and the first rack of the story performing the second treatment;

the first treatment includes a part of an antireflection film forming treatment for forming antireflection film on the substrates, a resist film forming treatment for forming resist film on the substrates, a protective film forming treatment for forming protective film to protect the resist film on the substrates, a developing treatment for developing the substrates, and a cleaning treatment for cleaning the substrates; and the second treatment includes another part of the antireflection film forming treatment, the resist film forming treatment, the protective film forming treatment, the developing treatment and the cleaning treatment.

11. A substrate treating apparatus comprising:
an indexer division;
a plurality of stories arranged to align in an up-down direction; and
a controller for controlling the indexer division and the stories;
each of the stories including:
  a first rack for receiving substrates;
  a treating section for treating the substrates; and
  a main transport mechanism for transporting the substrates to the first rack and the treating section;
the indexer division including:
  a carrier rack for receiving a carrier; and
  a transport device for transporting the substrates between the carrier placed on the carrier rack and the first rack;
  the transport device of the indexer division having a first transport mechanism for performing at least one of a feeding operation for transporting the substrates from the carrier placed on the carrier rack to the first rack, and a retrieving operation for transporting the substrates from the first rack to the carrier placed on the carrier rack;
the first transport mechanism further performing an inter-story transporting operation for transporting the substrates between two of the first racks provided for different ones of the stories; wherein:
the treating section of at least one of the stories is configured to perform a first treatment on the substrates;
the treating section of at least another of the stories is configured to perform a second treatment different from the first treatment on the substrates;
the first transport mechanism transports the substrates between the first rack of the story performing the first treatment and the first rack of the story performing the second treatment;
the first treatment includes treatment for forming antireflection film on the substrates;
the second treatment includes treatment for forming resist film on the substrates; and
the first transport mechanism transports the substrates from the first rack of the story performing the first treatment to the first rack of the story performing the second treatment.

12. A substrate treating apparatus comprising:
an indexer division;
a plurality of stories arranged to align in an up-down direction; and
a controller for controlling the indexer division and the stories;
each of the stories including:
  a first rack for receiving substrates;
  a treating section for treating the substrates; and
  a main transport mechanism for transporting the substrates to the first rack and the treating section;
the indexer division including:
  a carrier rack for receiving a carrier; and
  a transport device for transporting the substrates between the carrier placed on the carrier rack and the first rack;
  the transport device of the indexer division having a first transport mechanism for performing at least one of a feeding operation for transporting the substrates from the carrier placed on the carrier rack to the first rack, and a retrieving operation for transporting the substrates from the first rack to the carrier placed on the carrier rack;
the first transport mechanism further performing an inter-story transporting operation for transporting the substrates between two of the first racks provided for different ones of the stories; wherein:
the treating section of at least one of the stories is configured to perform a first treatment on the substrates;
the treating section of at least another of the stories is configured to perform a second treatment different from the first treatment on the substrates;
the first transport mechanism transports the substrates between the first rack of the story performing the first treatment and the first rack of the story performing the second treatment;
the first treatment includes a treatment for forming antireflection film on the substrates, and a treatment for forming resist film on the substrates;
the second treatment includes a treatment for forming protective film on the substrates to protect the resist film; and
the first transport mechanism transports the substrates from the first rack of the story performing the first treatment to the first rack of the story performing the second treatment.

13. The substrate treating apparatus according to claim 12, wherein:
the treating section of the story performing the second treatment is configured further to perform a treatment for developing the substrates; and
the transport device of the indexer division transports the substrates from the first rack of the story performing the second treatment to the carrier placed on the carrier rack.

14. A substrate treating apparatus comprising:
an indexer division;
a plurality of stories arranged to align in an up-down direction; and
a controller for controlling the indexer division and the stories;
each of the stories including:
  a first rack for receiving substrates;
  a treating section for treating the substrates; and
  a main transport mechanism for transporting the substrates to the first rack and the treating section;
the indexer division including:
  a carrier rack for receiving a carrier; and a transport device for transporting the substrates between the carrier placed on the carrier rack and the first rack;
the transport device of the indexer division having a first transport mechanism for performing at least one of a feeding operation for transporting the substrates from the carrier placed on the carrier rack to the first rack, and a retrieving operation for transporting the substrates from the first rack to the carrier placed on the carrier rack;
the first transport mechanism further performing an inter-story transporting operation for transporting the substrates between two of the first racks provided for different ones of the stories; wherein:
the treating section of at least one of the stories is configured to perform a first treatment on the substrates;
the treating section of at least another of the stories is configured to perform a second treatment different from the first treatment on the substrates;
the first transport mechanism transports the substrates between the first rack of the story performing the first treatment and the first rack of the story performing the second treatment;
the treating section of at least one other story different from the story performing the first treatment and the story performing the second treatment is configured to perform a third treatment on the substrates;
the third treatment includes a treatment for developing the substrates; and
the transport device of the indexer division transports the substrates from the first rack of the story performing the third treatment to the carrier placed in the carrier rack.

15. The substrate treating apparatus according to claim 14, wherein the number of the stories performing the third treatment is at least two.

16. A substrate treating apparatus comprising:
an indexer division;
a plurality of stories arranged to align in an up-down direction; and
a controller for controlling the indexer division and the stories;
each of the stories including:
a first rack for receiving substrates;
a treating section for treating the substrates; and
a main transport mechanism for transporting the substrates to the first rack and the treating section;
the indexer division including:
a carrier rack for receiving a carrier; and
a transport device for transporting the substrates between the carrier placed on the carrier rack and the first rack;
the transport device of the indexer division having a first transport mechanism for performing at least one of a feeding operation for transporting the substrates from the carrier placed on the carrier rack to the first rack, and a retrieving operation for transporting the substrates from the first rack to the carrier placed on the carrier rack;
the first transport mechanism further performing an inter-story transporting operation for transporting the substrates between two of the first racks provided for different ones of the stories; wherein:
each of the stories includes a second rack for receiving the substrates;
the substrate treating apparatus further comprises an interface division;
the interface division includes a transport device for transporting the substrates between the second rack and an exposing machine; and
the transport device of the interface division does not transport the substrates between two of the second racks provided for different ones of the stories.

17. A substrate treating apparatus comprising:
an indexer division;
a plurality of stories arranged to align in an up-down direction; and
a controller for controlling the indexer division and the stories;
each of the stories including:
a first rack for receiving substrates;
a treating section for treating the substrates; and
a main transport mechanism for transporting the substrates to the first rack and the treating section;
the indexer division including:
a carrier rack for receiving a carrier; and
a transport device for transporting the substrates between the carrier placed on the carrier rack and the first rack;
the transport device of the indexer division having a first transport mechanism for performing at least one of a feeding operation for transporting the substrates from the carrier placed on the carrier rack to the first rack, and a retrieving operation for transporting the substrates from the first rack to the carrier placed on the carrier rack;
the first transport mechanism further performing an inter-story transporting operation for transporting the substrates between two of the first racks provided for different ones of the stories; wherein:
a story passed by the substrates last among the stories is regarded as a final story;
the transport device of the indexer division transports the substrates from the first rack of the final story to the carrier placed on the carrier rack;
the substrate treating apparatus further comprises:
a carrier shunt portion for holding a carrier placed in a position shunted from the carrier rack; and
a carrier transport device for transporting the carrier between the carrier rack and the carrier shunt portion; and
the controller is configured to detect a delivery operation in which the main transport mechanism of the final story places the substrates on the first rack of the final story, and to determine timing of operation of the carrier transport device based on a result of detection of the delivery operation of the main transport mechanism of the final story.

18. The substrate treating apparatus according to claim 17, wherein the controller is configured:
to determine whether the substrates scheduled to be loaded into the carrier placed on the carrier shunt portion have been placed on the first rack of the final story, based on the result of detection of the delivery operation of the main transport mechanism of the final story; and
to start operation of the carrier transport device for transporting the carrier from the carrier shunt portion to the carrier rack when the controller determines that the substrates scheduled to be loaded into the carrier placed on the carrier shunt portion have been placed on the first rack of the final story.

* * * * *